US009189033B2

(12) United States Patent
Takahashi et al.

(10) Patent No.: US 9,189,033 B2
(45) Date of Patent: Nov. 17, 2015

(54) TOUCHSCREEN PANEL SENSOR FILM AND MANUFACTURING METHOD THEREOF

(71) Applicant: Dai Nippon Printing Co., Ltd., Tokyo (JP)

(72) Inventors: Masahiro Takahashi, Tokyo (JP); Mitsuru Iida, Tokyo (JP); Yutaka Matsumoto, Tokyo (JP); Junzo Matsuda, Tokyo (JP); Kazuya Ogawa, Tokyo (JP); Tatsuhiko Ishigami, Tokyo (JP)

(73) Assignee: Dai Nippon Printing Co., Ltd., Shinjuki-Ku (JP)

( * ) Notice: Subject to any disclaimer, the term of this patent is extended or adjusted under 35 U.S.C. 154(b) by 103 days.

(21) Appl. No.: 13/938,654

(22) Filed: Jul. 10, 2013

(65) Prior Publication Data
US 2014/0036165 A1    Feb. 6, 2014

Related U.S. Application Data

(63) Continuation of application No. 13/704,366, filed as application No. PCT/JP2011/070525 on Sep. 8, 2011.

(30) Foreign Application Priority Data

Sep. 29, 2010  (JP) ................................. 2010-219774
Jun. 27, 2011  (JP) ................................. 2011-141603

(51) Int. Cl.
*G06F 1/16*   (2006.01)
*G06F 3/044*  (2006.01)
(Continued)

(52) U.S. Cl.
CPC .......... *G06F 1/1692* (2013.01); *G02F 1/13338* (2013.01); *G06F 3/044* (2013.01);
(Continued)

(58) Field of Classification Search
CPC .................... G06F 3/044; G06F 3/045; G06F 2203/04103; G06F 2203/04112; G06F 1/1692; H03K 17/9622; G02F 1/13338
USPC ........... 200/600, 310–317, 46, 292, 511–512, 200/514; 345/173; 29/846; 174/250
See application file for complete search history.

(56) References Cited

U.S. PATENT DOCUMENTS 5,686,207 A    11/1997 Suda et al.
7,030,860 B1   4/2006  Hsu et al.
(Continued)

FOREIGN PATENT DOCUMENTS

JP    59-216236 A1   12/1984
JP    61-005327 A1    1/1986
(Continued)

OTHER PUBLICATIONS

International Search Report dated Dec. 13, 2011.
(Continued)

*Primary Examiner* — Edwin A. Leon
(74) *Attorney, Agent, or Firm* — Burr & Brown, PLLC

(57) ABSTRACT

Presented is a touchscreen panel sensor film with alignment marks or product information assigned thereto, this sensor film being formed so as to improve in post-processing accuracy. The touchscreen panel sensor film according to this invention includes a transparent base film and a transparent electrical conductor pattern provided on at least one surface of the base film, and achieves the improvement of post-processing accuracy by having alignment marks or product information in a non-active area on the sensor film.

48 Claims, 27 Drawing Sheets

(51) Int. Cl.
*G06F 3/045* (2006.01)
*H03K 17/96* (2006.01)
*G02F 1/1333* (2006.01)

(52) U.S. Cl.
CPC ........... *G06F 3/045* (2013.01); *H03K 17/9622* (2013.01); *G06F 2203/04103* (2013.01); *G06F 2203/04112* (2013.01)

(56) References Cited

U.S. PATENT DOCUMENTS

| | | | |
|---|---|---|---|
| 2003/0021935 | A1 | 1/2003 | Moriwaki et al. |
| 2006/0097991 | A1 | 5/2006 | Hotelling et al. |
| 2008/0042996 | A1 | 2/2008 | Endo et al. |
| 2008/0100592 | A1 | 5/2008 | Shigeno et al. |
| 2008/0138589 | A1 | 6/2008 | Wakabayashi et al. |
| 2008/0142352 | A1* | 6/2008 | Wright ............................ 200/600 |
| 2008/0176042 | A1 | 7/2008 | Nashiki et al. |
| 2008/0264699 | A1 | 10/2008 | Chang et al. |
| 2009/0066670 | A1 | 3/2009 | Hotelling et al. |
| 2009/0096757 | A1 | 4/2009 | Hotelling et al. |
| 2009/0096758 | A1 | 4/2009 | Hotelling et al. |
| 2009/0262095 | A1 | 10/2009 | Kinoshita et al. |
| 2010/0149117 | A1 | 6/2010 | Chien et al. |
| 2010/0182740 | A1 | 7/2010 | Arita |
| 2012/0105371 | A1 | 5/2012 | Hotelling et al. |
| 2012/0218028 | A1* | 8/2012 | Chu et al. ...................... 327/517 |
| 2012/0325639 | A1* | 12/2012 | Scuderi et al. ................ 200/600 |
| 2013/0153393 | A1* | 6/2013 | Omote et al. .................. 200/600 |

FOREIGN PATENT DOCUMENTS

| | | |
|---|---|---|
| JP | 02-116333 U | 9/1990 |
| JP | 03-060437 A1 | 3/1991 |
| JP | 04-160624 A1 | 6/1992 |
| JP | 04-264613 A1 | 9/1992 |
| JP | 04-362925 A1 | 12/1992 |
| JP | 05-108264 A1 | 4/1993 |
| JP | 07-101029 A1 | 4/1995 |
| JP | 08-050349 A1 | 2/1996 |
| JP | 08-249929 A1 | 9/1996 |
| JP | 11-007354 A1 | 1/1999 |
| JP | 2001-334608 A1 | 12/2001 |
| JP | 2002-043703 A1 | 2/2002 |
| JP | 2003-511799 A1 | 3/2003 |
| JP | 2004-258417 A1 | 9/2004 |
| JP | 2005-106977 A1 | 4/2005 |
| JP | 2005-235481 AI | 9/2005 |
| JP | 2005-251692 A1 | 9/2005 |
| JP | 2005-339290 A1 | 12/2005 |
| JP | 3134925 U | 8/2007 |
| JP | 2007-271743 A1 | 10/2007 |
| JP | 2007-299534 A1 | 11/2007 |
| JP | 2007-533044 A1 | 11/2007 |
| JP | 2007-328421 A1 | 12/2007 |
| JP | 2008-009920 A1 | 1/2008 |
| JP | 2008-009921 A1 | 1/2008 |
| JP | 2008-027463 A1 | 2/2008 |
| JP | 2008-041294 A1 | 2/2008 |
| JP | 2008-047028 A1 | 2/2008 |
| JP | 4055019 B2 | 3/2008 |
| JP | 2008-076216 A1 | 4/2008 |
| JP | 2008-083497 A1 | 4/2008 |
| JP | 2008-097283 A1 | 4/2008 |
| JP | 2008-134975 A1 | 6/2008 |
| JP | 2008-152468 A1 | 7/2008 |
| JP | 2008-176064 A1 | 7/2008 |
| JP | 2008-233976 A1 | 10/2008 |
| JP | 2008-293114 A1 | 12/2008 |
| JP | 2008-305757 A1 | 12/2008 |
| JP | 2008-310551 A1 | 12/2008 |
| JP | 2009-009432 A1 | 1/2009 |
| JP | 2009-258935 A1 | 11/2009 |
| JP | 2010-170250 A1 | 8/2010 |
| JP | 2010-198103 A1 | 9/2010 |
| KR | 10-2005-0068510 A1 | 7/2005 |
| TW | 201022762 A | 6/2010 |

OTHER PUBLICATIONS

Japanese Office Action (Application No. 2012-536313) dated May 15, 2015 (with English translation).

* cited by examiner (a)  (b)

(a)  (b)

(a)

(b)

(a)

(b)

TOUCHSCREEN PANEL SENSOR FILM AND MANUFACTURING METHOD THEREOF

CROSS REFERENCE TO RELATED APPLICATIONS

This application is a continuation of U.S. application Ser. No. 13/704,366, filed Mar. 6, 2013, which was the National Stage of International Application No. PCT/JP2011/070525, filed Sep. 8, 2011, and claims the benefit under 35 USC §119(a)-(d) of Japanese Patent Application Nos. 2010-219774, filed Sep. 29, 2010, and 2011-141603, filed on Jun. 27, 2011, the entireties of which are incorporated herein by reference. The entire disclosure of Japanese Patent Application Nos. 2009-86477, filed Mar. 31, 2009, and 2009-273798, filed Dec. 1, 2009, are also incorporated herein by reference.

FIELD OF THE INVENTION

The present invention relates to touchscreen panel sensor films and manufacturing methods thereof.

BACKGROUND OF THE INVENTION

Nowadays, touchscreen panel devices are widely used as input means. The touchscreen panel devices include a touchscreen panel sensor, a control circuit for detecting a contact position of an object on the touchscreen panel sensor, electrical interconnects, and a flexible printed circuit (FPC) board. In many cases, these touchscreen panel devices are used with a display device such as a liquid-crystal display or a plasma display, as the input means for the various types of hardware, for example, ticket-vending machines, automatic teller machines (ATMs), cell phones, or game consoles, that each incorporate such a display device. In such hardware, the touchscreen panel sensor is disposed over a display screen of the display device; therefore, the touchscreen panel device can perform highly direct data input into the display device. A region of the touchscreen panel sensor that faces a display region of the display device is transparent, and this region of the touchscreen panel sensor is to constitute an active area in which the sensor can detect the contact position (approach position).

The touchscreen panel devices can be divided into various types according to the principles of detecting the contact position or approach position of the object on the touchscreen panel sensor. Touchscreen panel devices of a capacitive coupling scheme are catching attention nowadays for reasons of optical brightness, design quality, structural simplicity, functional excellence, and the like. In the touchscreen panel devices of the capacitive coupling scheme, an external conductor (typically, finger) whose position is to be detected generates a new parasitic capacity by coming into contact or near-contact with the touch sensor through a dielectric. The touchscreen panel sensor utilizes a change in that capacitance to detect the position of the object on the sensor. The capacitive coupling scheme is subdivided into a surface type and a projected type. Of the two types, the projected type, in particular, is receiving attention for its suitableness for multi-touch recognition (multipoint recognition) applications or requirements, as described in JP 2007-533044T.

Touchscreen panel sensors of the projected capacitive-coupling scheme include a dielectric, a first sensor electrode, and a second sensor electrode, the latter two sensor electrodes being formed in different patterns on both sides of the dielectric. Typically, the first sensor electrode and the second sensor electrode, both including a grid-like array of electrical conductors, detect a position of the electrical conductors based on an electromagnetic change or capacitance change that occurs when an external conductor (typically, a finger) comes into contact or near-contact with the touchscreen panel sensor.

As described in JP 1992-264613A, such a touchscreen panel sensor of the projected capacitive-coupling scheme is generally fabricated by bonding together via an adhesive layer, a first base film with a first sensor electrode formed thereupon, and a second base film with a second sensor electrode formed thereupon. In the thus-fabricated touchscreen panel sensor, the first sensor electrode and the second sensor electrode are connected to an external control circuit via electrical lead-out lines (electrical conductors for lead-out) formed in regions external to active areas of the respective base films. When the touchscreen panel device is used with a display device, the first sensor electrode and the second sensor electrode are formed from transparent electrically conductive materials of low electrical conductivity. On the other hand, the lead-out lines disposed outside the active areas do not need to be transparent and are each formed on the base film by screen-printing a metallic material of high electrical conductivity.

[Patent Document 1]: JP2007-533044T
[Patent Document 2]: JP1992-264613A

SUMMARY OF THE INVENTION

To improve design quality and enlarge the display region of the display device, a region surrounding a display region, called a frame region or bezel region, is nowadays required to be reduced in surface area. Along with this trend, it is also being requested that non-active areas other than the active areas of the touchscreen panel sensor be reduced in surface area. This request can be met if the lead-out lines are formed with sufficiently high fineness in the non-active areas. The reduction in the surface area of the non-active areas and the formation of highly fine lead-out lines, in turn, call for accurate cutting of the touchscreen panel sensor fabricated on a web or a sheet, accurate positioning of the touchscreen panel sensor on the touchscreen panel device, and accurate lamination with an FPC substrate. These accuracy requirements, however, are difficult to satisfy with any of the various manufacturing methods currently in use, such as screen printing mentioned above.

The present invention has been made with such taken into account, and an object of the invention is to provide a highly reliable touchscreen panel sensor film including a small non-active area fabricated on a web or a sheet. The sensor film is formed to enable improvement of processing accuracy for creating precut individual pieces that are to constitute a touchscreen panel sensor, improvement of interconnection accuracy between high-precision electrical lines and an FPC substrate, and improvement of position-matching accuracy with respect to a touchscreen panel device. Another object of the invention is to provide a touchscreen panel sensor film having product information recorded in a non-active area previously reduced in surface area, and a method for manufacturing the sensor film.

A touchscreen panel sensor film according to a first aspect of the present invention includes a transparent base film, and a transparent electrical conductor pattern provided on at least one surface of the base film. Alignment marks or product information is provided in a non-active area of the sensor film.

The alignment marks or product information in the touchscreen panel sensor film according to the present invention may include either a two-layer film or a three-layer film; the two-layer film comprising a transparent electrically conductive layer and a covering electrically conductive layer arranged in that order on the base film, and the three-layer film comprising a transparent electrically conductive layer, an intermediate layer, and a covering electrically conductive layer arranged in that order on the base film.

The alignment marks or product information in the touchscreen panel sensor film according to the present invention may include either a two-layer film or a three-layer film; the two-layer film comprising a transparent electrically conductive layer and a covering electrically conductive layer arranged in that order on the base film, and the three-layer film comprising a transparent electrically conductive layer, an intermediate layer, and a covering electrically conductive layer arranged in that order on the base film, and may be formed on both surfaces of the base film.

The alignment marks or product information in the touchscreen panel sensor film according to the present invention may include either a two-layer film or a three-layer film; the two-layer film comprising a transparent electrically conductive layer and a covering electrically conductive layer arranged in that order on the base film, and the three-layer film comprising a transparent electrically conductive layer, an intermediate layer, and a covering electrically conductive layer arranged in that order on the base film. Additionally, the alignment marks or the product information may include the intermediate layer provided spacedly from the base film, on one portion of the transparent electrical conductor, and a highly electrically conductive layer provided on the intermediate layer. In this case, the highly electrically conductive layer will be formed from a material having an electrical conductivity higher than that of the transparent electrical conductor and that of a material forming the intermediate layer, and the intermediate layer will be formed from a material whose adhesion to the transparent electrical conductor is higher than that of the highly electrically conductive layer. The highly electrically conductive layer may be formed from a silver alloy, and the intermediate layer may be formed from a MoNb alloy.

In the touchscreen panel sensor film according to the present invention, unit patterns each constituting individual products as a unit may be formed by step-and-repeat imposition.

The alignment marks or product information in the touchscreen panel sensor film according to the present invention may be formed for each of the unit patterns.

The alignment marks or product information in the touchscreen panel sensor film according to the present invention may be formed for each of a predetermined number of sets of unit patterns formed by step-and-repeat imposition.

Purposes of use of the alignment marks in the touchscreen panel sensor film according to the present invention may be sheet cutting, individual-piece cutting, individual-piece punching-through, FPC attaching, or position matching to a display panel.

The alignment marks in the touchscreen panel sensor film according to the present invention may be formed for each of the purposes. Alternatively, at least one of the alignment marks may be formed so as to fulfill at least two of the purposes. Further alternatively, the alignment marks may include an alignment mark formed so as to fulfill only one of the purposes, and an alignment mark formed so as to fulfill at least two of the purposes.

The product information in the touchscreen panel sensor film according to the present invention may include at least one kind of information among product name information, lot number information, manufacturing date information, and product grade information. The product Information may be formed in a bar code format.

A second aspect of the present invention is a manufacturing method for the touchscreen panel sensor film including
    a transparent base film,
    a transparent electrical conductor pattern provided on at least one surface of the base film, with a portion of the conductor pattern being linearly formed on the surface of the base film, and
    alignment marks or/and product information formed in a non-active area.

The manufacturing method according to the second aspect of the present invention includes the steps of:
    forming a photosensitive layer having a photosensitive property, on a surface of a laminate including the base film, a transparent electrically conductive layer provided on at least one surface of the base film, and a covering electrically conductive layer provided on the transparent electrically conductive layer, the photosensitive layer being formed upon the covering electrically conductive layer;
    exposing the photosensitive layer to light;
    developing the photosensitive layer, thereby transferring the photosensitive layer to patterns corresponding to the alignment marks or/and the product information, as well as to a sensor portion, terminal portion, and electrical lead-out lines, each of the three portions being later formed;
    patterning the covering electrically conductive layer by etching the covering electrically conductive layer, using the patterned photosensitive layer as a mask;
    patterning the transparent electrically conductive layer by etching the transparent electrically conductive layer using the patterned photosensitive layer and the patterned covering electrically conductive layer as masks;
    removing the patterned photosensitive layer;
    forming another photosensitive layer on the patterned covering electrically conductive layer;
    exposing the other photosensitive layer to light;
    patterning the other photosensitive layer by means of development;
    removing a portion of the patterned covering electrically conductive layer by etching the patterned covering electrically conductive layer, using the patterned other photosensitive layer as a mask, thereby forming the sensor portion; and
    removing the patterned other photosensitive layer, thereby obtaining the touchscreen panel sensor film including the alignment marks or/and product information.

A third aspect of the present invention is a manufacturing method for the touchscreen panel sensor film including
    a transparent base film,
    a transparent electrical conductor pattern provided on at least one surface of the base film, with a portion of the conductor pattern being linearly formed on the surface of the base film, and
    alignment marks or/and product information formed in a non-active area.

The manufacturing method according to the third aspect of the present invention includes the steps of:
    forming a photosensitive layer having a photosensitive property, on a surface of a laminate including the base film, a transparent electrically conductive layer provided on at least one surface of the base film, an intermediate layer provided on the transparent electrically conductive layer, and a covering electrically conductive layer provided on the intermediate layer, the covering electrically conductive layer facing the laminate surface having the photosensitive layer formed thereupon;

exposing the photosensitive layer to light;

developing the photosensitive layer, thereby transferring the photosensitive layer to patterns corresponding to the alignment marks or/and the product information, as well as to a sensor portion, terminal portion, and electrical lead-out lines, each of the three portions being later formed;

patterning the covering electrically conductive layer and the intermediate layer by etching the covering electrically conductive layer and the intermediate layer, using the patterned photosensitive layer as a mask;

patterning the transparent electrically conductive layer by etching the transparent electrically conductive layer using the patterned photosensitive layer and the patterned covering electrically conductive layer and intermediate layer as masks;

removing the patterned photosensitive layer;

forming another photosensitive layer on the patterned covering electrically conductive layer;

exposing the other photosensitive layer to light;

patterning the other photosensitive layer by means of development;

removing a portion of the patterned covering electrically conductive layer and intermediate layer each by etching the patterned covering electrically conductive layer and the intermediate layer, using the patterned other photosensitive layer as masks, thereby forming the sensor portion; and removing the patterned other photosensitive layer, thereby obtaining the touchscreen panel sensor film including the alignment marks or/and product information.

A fourth aspect of the present invention is a manufacturing method for the touchscreen panel sensor film. The manufacturing method according to the fourth aspect of the present invention includes the steps of: forming a photosensitive layer having a photosensitive property, on a surface of a laminate including a transparent base film, a transparent electrically conductive layer provided on one surface of the base film, and a covering electrically conductive layer provided on the transparent electrically conductive layer, the photosensitive layer being formed upon the covering electrically conductive layer; exposing the photosensitive layer to light; developing the photosensitive layer, thereby patterning the photosensitive layer; patterning the covering electrically conductive layer by etching the covering electrically conductive layer, using the patterned photosensitive layer as a mask; patterning the transparent electrically conductive layer by etching the transparent electrically conductive layer, using the patterned photosensitive layer and the patterned covering electrically conductive layer as masks; removing the patterned photosensitive layer; forming another photosensitive layer on the patterned covering electrically conductive layer; exposing the other photosensitive layer to light; patterning the other photosensitive layer by means of development; removing a portion of the patterned covering electrically conductive layer by etching the patterned covering electrically conductive layer, using the patterned other photosensitive layer as a mask; and removing the patterned other photosensitive layer. Alignment marks or product information is created simultaneously with the touchscreen panel sensor patterns in the steps.

In a method for manufacturing a touchscreen panel sensor film according to the present invention, the covering electrically conductive layer may be formed from a material having conductivity higher than that of a material forming the transparent electrically conductive layer.

A method for manufacturing a touchscreen panel sensor film according to the present invention may further includes the step of accelerating crystallization of the transparent electrically conductive layer of an amorphous form by conducting an annealing process. The step of accelerating crystallization of the transparent electrically conductive layer may be conducted later than the step of patterning the transparent electrically conductive layer, while simultaneously being earlier than the step of removing a portion of the patterned covering electrically conductive layer. The covering electrically conductive layer in the touchscreen panel sensor film manufacturing method according to the present invention may contain silver as a major constituent.

In a method for manufacturing a touchscreen panel sensor film according to the present invention, the covering electrically conductive layer may include an intermediate layer provided on the transparent electrically conductive layer, and a highly electrically conductive layer provided on the intermediate layer. In this case, the highly electrically conductive layer is formed from a material having conductivity higher than that of a material forming the transparent electrically conductive layer and the intermediate layer, and the intermediate layer is formed from a material whose adhesive strength with respect to the transparent electrically conductive layer is greater than that of the highly electrically conductive layer.

In a method for manufacturing a touchscreen panel sensor film according to the present invention, the highly electrically conductive layer may be formed from a silver alloy and the intermediate layer may be formed from a MoNb alloy.

According to a fifth aspect of the present invention, a laminate is used to fabricate a touchscreen panel sensor film. The laminate according to the present invention includes a transparent base film, a transparent electrically conductive layer provided on one surface of the base film, and a covering electrically conductive layer provided on the transparent electrically conductive layer.

The covering electrically conductive layer in the laminate according to the present invention may be formed from a material having conductivity higher than that of a material forming the transparent electrically conductive layer.

The covering electrically conductive layer in the laminate according to the present invention may include an intermediate layer provided on the transparent electrically conductive layer, and a highly electrically conductive layer provided on the intermediate layer. In this case, the highly electrically conductive layer is formed from a material having conductivity higher than that of a material forming the transparent electrically conductive layer and the intermediate layer, and the intermediate layer is formed from a material whose adhesive strength with respect to the transparent electrically conductive layer is greater than that of the highly electrically conductive layer.

The covering electrically conductive layer in the laminate according to the present invention may be formed from a silver alloy, and the intermediate layer may be formed from a MoNb alloy.

In an sixth aspect of the present invention, a touchscreen panel sensor film with a transparent base film and transparent electrical conductor patterns provided on both surfaces of the base film, may further include one pair of index portions formed in non-active areas on both surfaces of the sensor film, the index portion pair being constructed so that one of the paired index portions has a predetermined proximity relationship with respect to the other of the paired index portions.

In a touchscreen panel sensor film according to the present invention, the index portion pair may include either a two-layer film or a three-layer film; the two-layer film comprising a transparent electrically conductive layer and a covering electrically conductive layer arranged in that order on the base film, and the three-layer film comprising a transparent electrically conductive layer, an intermediate layer, and a covering electrically conductive layer arranged in that order on the base film.

In a touchscreen panel sensor film according to the present invention, one of the paired index portions includes an inner profile formed to define a light-transmitting portion therein, and the other of the paired index portions may be at least partly disposed internally to the light-transmitting portion defined by the inner profile.

In a touchscreen panel sensor film according to the present invention, the paired index portions each include a plurality of unit index portions arranged at predetermined pitches in one direction, and the pitch of the unit index portions of one of the paired index portions may be different from that of the unit index portions of the other of the paired index portions.

A touchscreen panel sensor film according to seventh aspect of the present invention includes
- a transparent base film,
- a transparent electrical conductor provided on one surface of the base film, and
- electrical lead-out conductors provided on a portion of the transparent electrical conductor spacedly from the base film,
- wherein the portion of the transparent electrical conductor is formed linearly, and the electrical lead-out conductors linearly extend along a surface of the transparent electrical conductor portion, and
- wherein width of the linearly extending electrical lead-out conductors is smaller than that of the transparent electrical conductor portion existing at overlaps of the electrical lead-out conductors.

A touchscreen panel sensor film according to eighth aspect of the present invention includes
- a transparent base film having an active area corresponding to a region formed to enable detection of a touch position, and a non-active area adjacent to the active area,
- a transparent electrical conductor provided on one surface of the base film, the transparent electrical conductor including a sensor portion disposed on the active area of the base film, and a terminal portion coupled to the sensor portion and disposed on the non-active area of the base film, and
- an electrical lead-out conductor provided on a portion of the terminal portion of the transparent electrical conductor spacedly from the base film,
- wherein the portion of the transparent electrical conductor is formed linearly and the electrical lead-out conductors linearly extend along a surface of the transparent electrical conductor portion,
- wherein the electrical lead-out conductor is disposed on the portion of terminal portion of the transparent electrical conductor disposed on the non-active area so as not to have an end adjacent to an end of the sensor portion of the transparent electrical conductor disposed on the active area, and
- wherein the terminal portion of the transparent electrical conductor is formed integrally with, and from the same material as that of, the sensor portion of the transparent electrical conductor.

In a ninth aspect of the present invention, a method for manufacturing a touchscreen panel sensor film includes the steps of:
- forming a photosensitive layer having a photosensitive property, on a surface of a laminate including a transparent base film, a transparent electrically conductive layer provided on one surface of the base film, and a covering electrically conductive layer provided on the transparent electrically conductive layer, the photosensitive layer being formed upon the covering electrically conductive layer,
- exposing the photosensitive layer to light,
- developing the photosensitive layer, thereby patterning the photosensitive layer,
- patterning the covering electrically conductive layer by etching the covering electrically conductive layer, using the patterned photosensitive layer as a mask,
- patterning the transparent electrically conductive layer by etching the transparent electrically conductive layer using the patterned photosensitive layer and the patterned covering electrically conductive layer as masks,
- removing the patterned photosensitive layer,
- forming another photosensitive layer on the patterned covering electrically conductive layer,
- exposing the other photosensitive layer to light,
- patterning the other photosensitive layer by means of development,
- removing a portion of the patterned covering electrically conductive layer by etching the patterned covering electrically conductive layer, using the patterned other photosensitive layer as a mask, and
- removing the patterned other photosensitive layer.

In a tenth aspect of the present invention, a method for manufacturing a touchscreen panel sensor film includes the steps of:
- forming a first photosensitive layer having a photosensitive property, on one surface of a laminate including a transparent base film, a first transparent electrically conductive layer provided on one surface of the base film, a second transparent electrically conductive layer provided on the other surface of the base film, and a light-shielding electrically conductive layer having a light-shielding property and an electrically conductive property, the light-shielding electrically conductive layer being provided on at least one transparent electrically conductive layer of the first transparent electrically conductive layer and the second transparent electrically conductive layer; and forming a second photosensitive layer having a photosensitive property, on the other surface of the laminate,
- exposing the first photosensitive layer and the second photosensitive layer to light at the same time in patterns different from each other, with a first mask placed on the first photosensitive layer and a second mask placed on the second photosensitive layer,
- developing the first photosensitive layer and the second photosensitive layer, thereby patterning the first and second photosensitive layers,
- patterning the light-shielding electrically conductive layer by etching the light-shielding electrically conductive layer, using the patterned photosensitive layer as a mask,
- patterning the first transparent electrically conductive layer and the second transparent electrically conductive layer into pattern shapes different from each other, by etching the first and second transparent electrically conductive layers using the patterned photosensitive layer and the patterned light-shielding electrically conductive layer as masks, removing the patterned first photosensitive layer and second photosensitive layer, forming another photosensitive layer on the patterned light-shielding electrically conductive layer, exposing the other photosensitive layer to light, patterning the other photosensitive layer by means of development, removing a portion of the patterned light-shielding electrically conductive layer by etching the patterned light-shielding electrically conductive layer, using the patterned other photosensitive layer as a mask, and removing the patterned other photosensitive layer.

The touchscreen panel sensor film of the present invention, characterized in that alignment marks or product information is formed, improves position accuracy of the alignment marks or product information, improves processing accuracy in post-processing steps such as sheet cutting, individual-piece cutting, individual-piece punching-through, and FPC attaching, and hence improves machine-reading accuracy of the product information, especially that of bar code information.

The alignment marks or the product information is consisted of either a two-layer film or a three-layer film; the two-layer film comprising a transparent electrically conductive layer and a covering electrically conductive layer arranged in that order on the base film, and the three-layer film comprising a transparent electrically conductive layer, an intermediate layer, and a covering electrically conductive layer arranged in that order on the base film. The alignment marks or the product information is generated in the same step as that of forming the covering electrically conductive layer. Therefore, the positions of the alignment marks or product information do not shift, which improves processing accuracy in the post-processing steps. In addition, even when formed on both surfaces of the base film, the alignment marks or the product information is generated in the same step as that of forming the covering electrically conductive layer, such that the alignment marks or the product information can be formed without a shift in position with respect to the transparent conductive layer or a transparent electrical conductor.

Furthermore, since the alignment marks are each formed so that one alignment mark suits a plurality of purposes of use of the mark, a surface area for disposing the alignment marks is minimized for even narrower frame or bezel regions.

Furthermore, the product information includes at least one kind of information among product name information, lot number information, manufacturing date information, and product grade information, so the product information can be confirmed after individual-piece cutting and mounting in a touchscreen panel device. Machine-readable information such as a bar code is additionally formed, so product management is possible in post-processing steps such as mounting in the touchscreen panel device.

In a further aspect of the present invention, a method for manufacturing a touchscreen panel sensor film including a transparent base film, a transparent electrical conductor pattern provided on at least one surface of the base film, with a portion of the conductor pattern being linearly formed on the surface of the base film, and alignment marks or/and product information formed in a non-active area.

The method includes the steps of:

forming a photosensitive layer having a photosensitive property, on a surface of a laminate including the base film, a transparent electrically conductive layer provided on at least one surface of the base film, and a covering electrically conductive layer provided on the transparent electrically conductive layer, the photosensitive layer being formed upon the covering electrically conductive layer, exposing the photosensitive layer to light, developing the photosensitive layer, thereby patterning a sensor portion, a terminal portion, electrical lead-out lines, and the alignment marks or/and the product information, patterning the covering electrically conductive layer by etching the covering electrically conductive layer, using the patterned photosensitive layer as a mask, patterning the transparent electrically conductive layer by etching the transparent electrically conductive layer using the patterned photosensitive layer and the patterned covering electrically conductive layer as masks, removing the patterned photosensitive layer, forming another photosensitive layer on the patterned covering electrically conductive layer, exposing the other photosensitive layer to light, patterning the other photosensitive layer by means of development, removing a portion of the patterned covering electrically conductive layer by etching the patterned covering electrically conductive layer, using the patterned other photosensitive layer as a mask, thereby forming the sensor portion, and removing the patterned other photosensitive layer.

Due to the above method, it is possible to make the touchscreen panel sensor film which has the alignment marks or/and product information formed with a high degree of position accuracy in the same steps of those of the touchscreen panel sensor, without involving a new step.

In a further aspect of the present invention, a method for manufacturing a touchscreen panel sensor film including a transparent base film, a transparent electrical conductor pattern provided on at least one surface of the base film, with a portion of the conductor pattern being linearly formed on the surface of the base film, and alignment marks or/and product information formed in a non-active area.

The method includes the steps of:

forming a photosensitive layer having a photosensitive property, on a surface of a laminate including the base film, a transparent electrically conductive layer provided on at least one surface of the base film, an intermediate layer provided on the transparent conductive layer, and a covering electrically conductive layer provided on the intermediate layer, the photosensitive layer being formed upon the covering electrically conductive layer, exposing the photosensitive layer to light, developing the photosensitive layer, thereby patterning a sensor portion, a terminal portion, electrical lead-out lines, and the alignment marks or/and the product information, patterning the covering electrically conductive layer and the intermediate layer by etching the covering electrically conductive layer and the intermediate layer, using the patterned photosensitive layer as a mask, patterning the transparent electrically conductive layer by etching the transparent electrically conductive layer using the patterned photosensitive layer and the patterned covering electrically conductive layer and intermediate layer as masks, removing the patterned photosensitive layer, forming another photosensitive layer on the patterned covering electrically conductive layer, exposing the other photosensitive layer to light,
patterning the other photosensitive layer by means of development,
removing portions of the patterned covering electrically conductive layer and intermediate layer by etching the patterned covering electrically conductive layer and intermediate layer, using the patterned other photosensitive layer as a mask, thereby forming the sensor portion, and
removing the patterned other photosensitive layer.

Due to the above method, it is possible to make the touchscreen panel sensor film which has the alignment marks or/and product information formed with a high degree of position accuracy in the same steps of those of the touchscreen panel sensor, without involving a new step.

DETAILED DESCRIPTION OF THE INVENTION

First Embodiment

Figure 1:
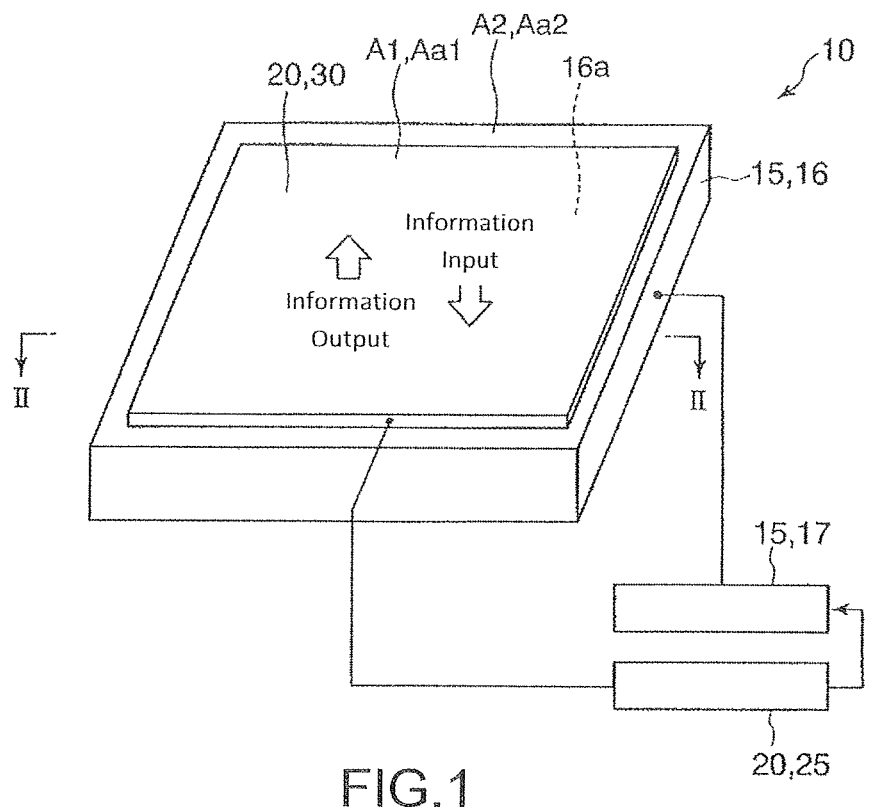
FIG. 1 is an explanatory diagram of a first embodiment of the present invention, schematically showing a touchscreen panel device along with a display device.

Hereunder, a first embodiment of the present invention will be described referring to the accompanying drawings.

In the drawings attached to this specification, scales and dimensional aspect ratios are changed and exaggerated with respect to actual ones for convenience's sake of illustration and for better understanding of the invention.

The terms "sheet", "film", and "plate" that will appear herein are based only upon the differences in designation, and are not distinguished from one another. Therefore, the term "sheet", for example, means a concept including such a member and portion as one may call a film, a plate, or the like.

Figure 2:
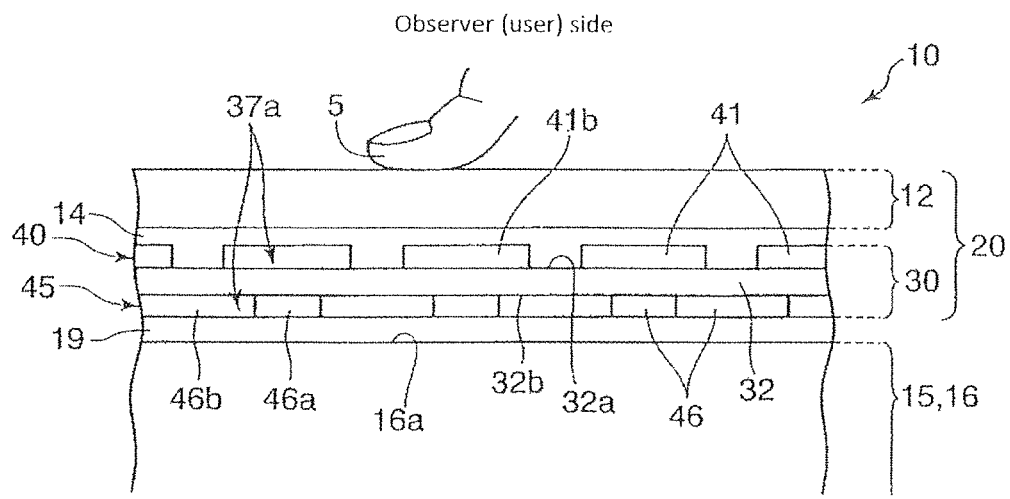
FIG. 2 is a sectional view showing a touchscreen panel sensor of the touchscreen panel device of FIG. 1 along with the display device, the section view of FIG. 2 corresponding nearly to a section extending along line II-II of FIG. 1.
Figure 5A:
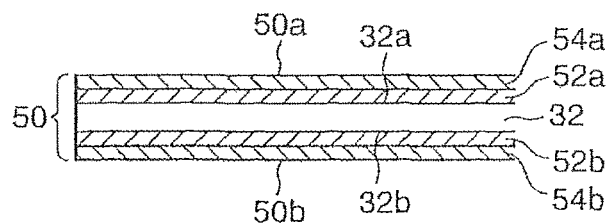
FIG. 5A is an explanatory diagram of a method for manufacturing the touchscreen panel sensor shown in FIGS. 3A and 3B.
Figure 5A:
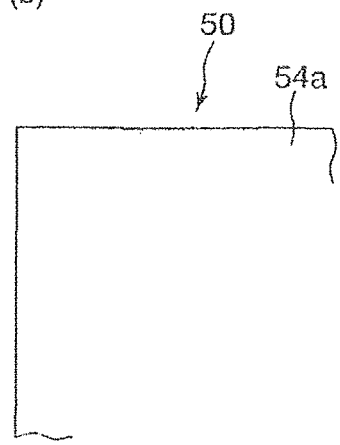
Figure 5B:
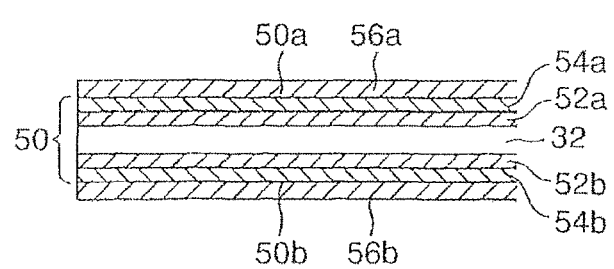
FIG. 5B is an explanatory diagram of the method for manufacturing the touchscreen panel sensor shown in FIGS. 3A and 3B.
Figure 5B:
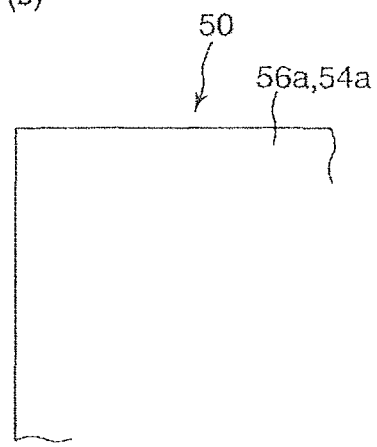
Figure 5C:
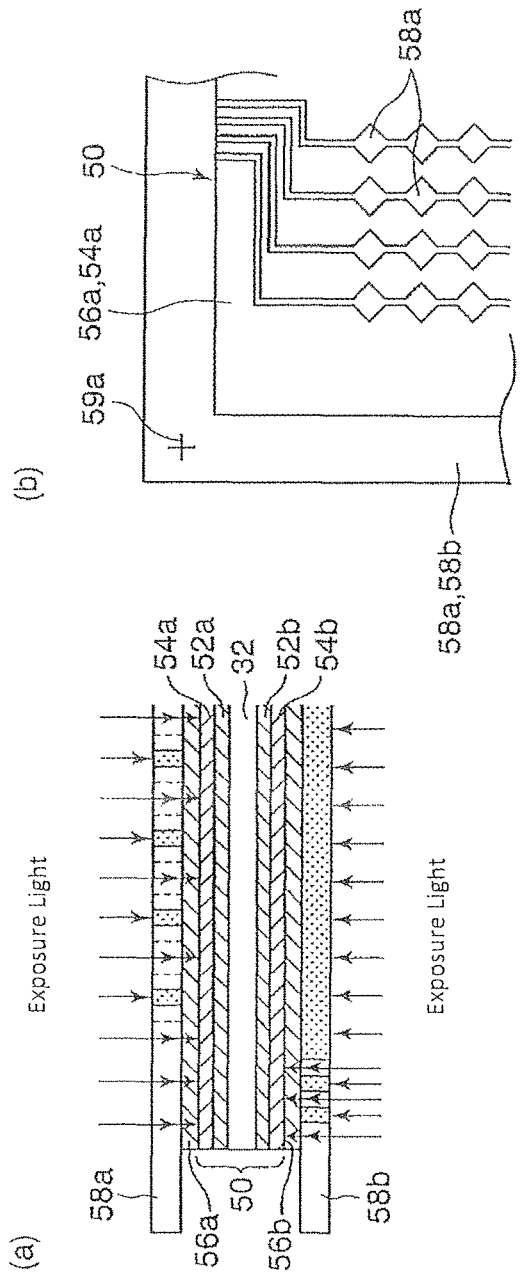
FIG. 5C is an explanatory diagram of the method for manufacturing the touchscreen panel sensor shown in FIGS. 3A and 3B.
Figure 5D:
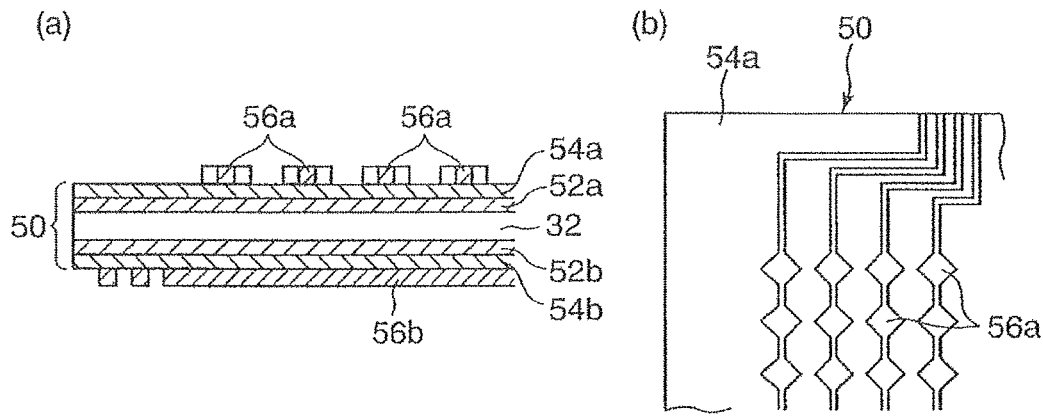
FIG. 5D is an explanatory diagram of the method for manufacturing the touchscreen panel sensor shown in FIGS. 3A and 3B.
Figure 5E:
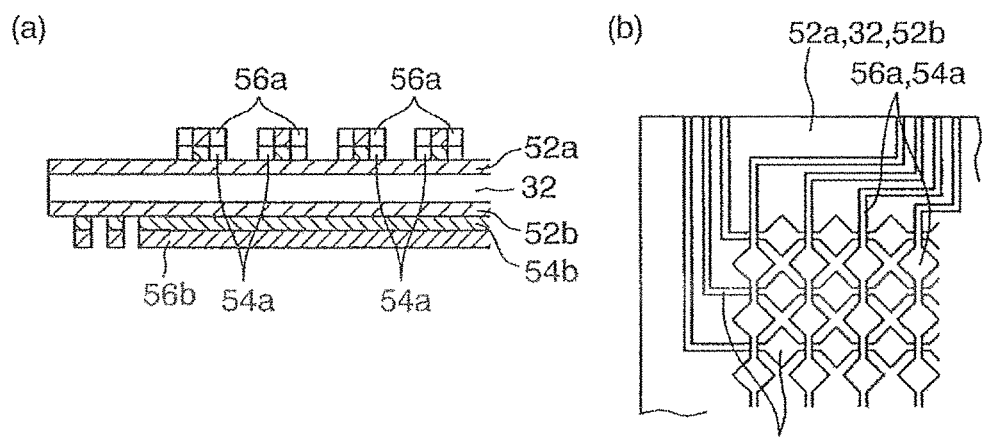
FIG. 5E is an explanatory diagram of the method for manufacturing the touchscreen panel sensor shown in FIGS. 3A and 3B.
Figure 5F:
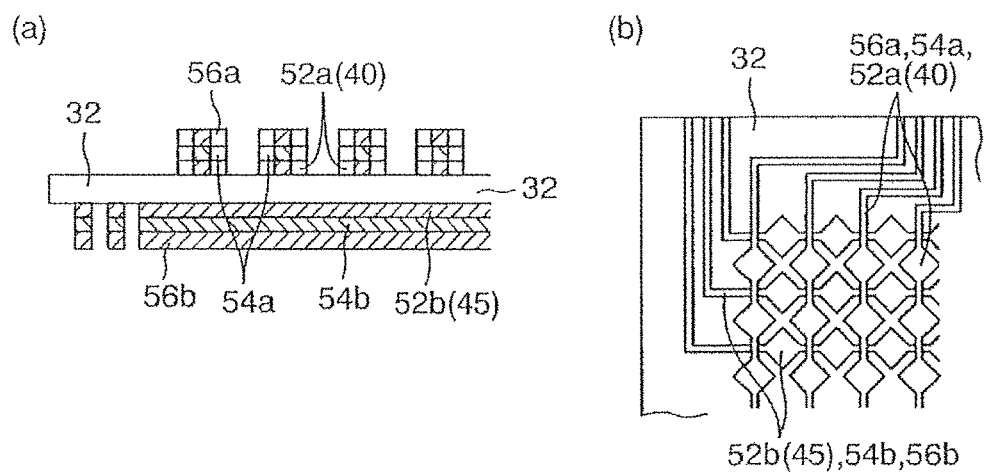
FIG. 5F is an explanatory diagram of the method for manufacturing the touchscreen panel sensor shown in FIGS. 3A and 3B.
Figure 5G:
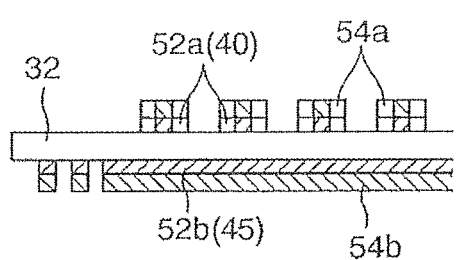
FIG. 5G is an explanatory diagram of the method for manufacturing the touchscreen panel sensor shown in FIGS. 3A and 3B.
Figure 5G:
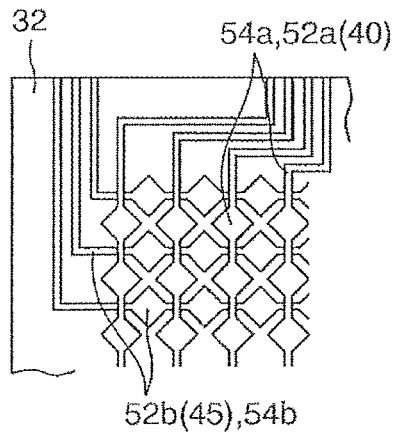
Figure 5H:
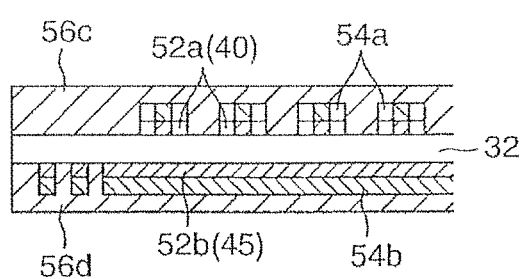
FIG. 5H is an explanatory diagram of the method for manufacturing the touchscreen panel sensor shown in FIGS. 3A and 3B.
Figure 5H:
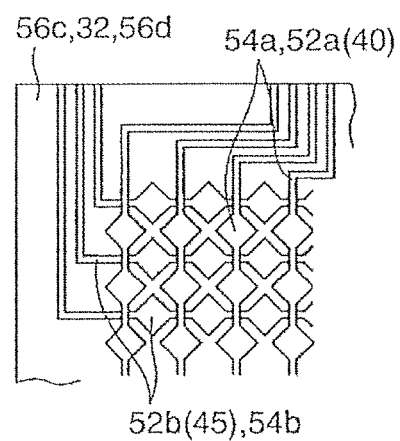
Figure 5I:
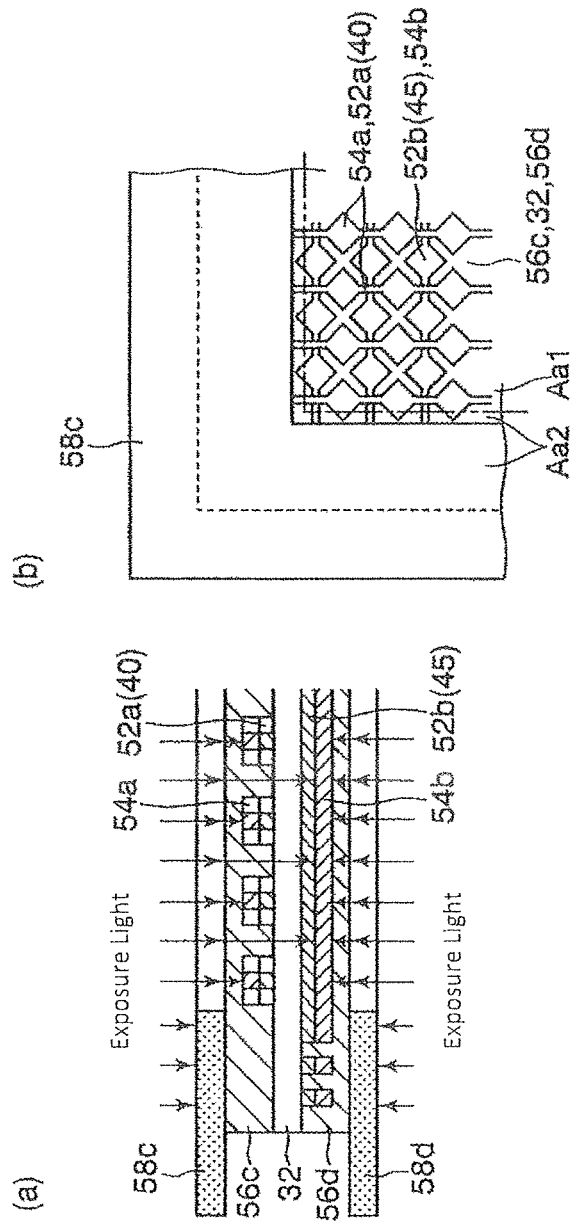
FIG. 5I is an explanatory diagram of the method for manufacturing the touchscreen panel sensor shown in FIGS. 3A and 3B.
Figure 5J:
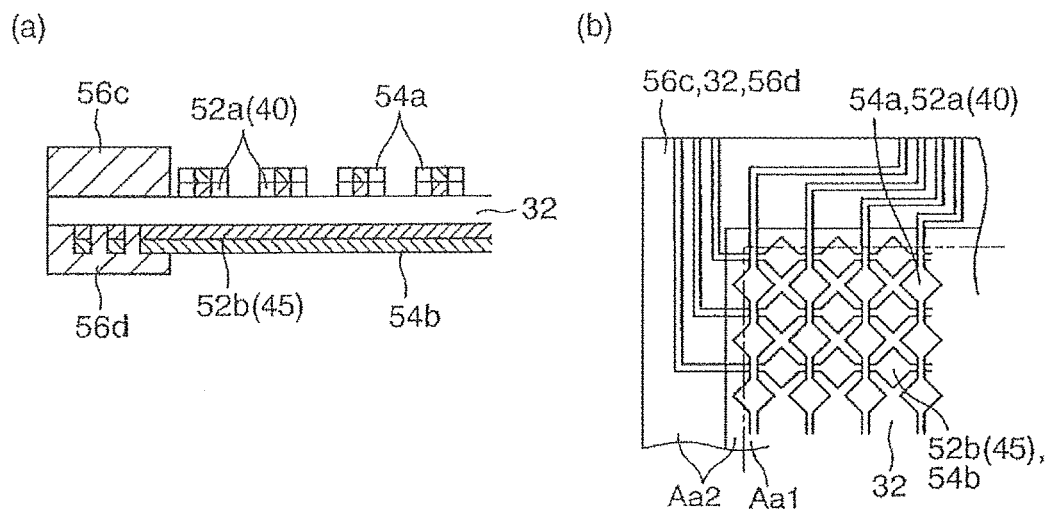
FIG. 5j is an explanatory diagram of the method for manufacturing the touchscreen panel sensor shown in FIGS. 3A and 3B.
Figure 5K:
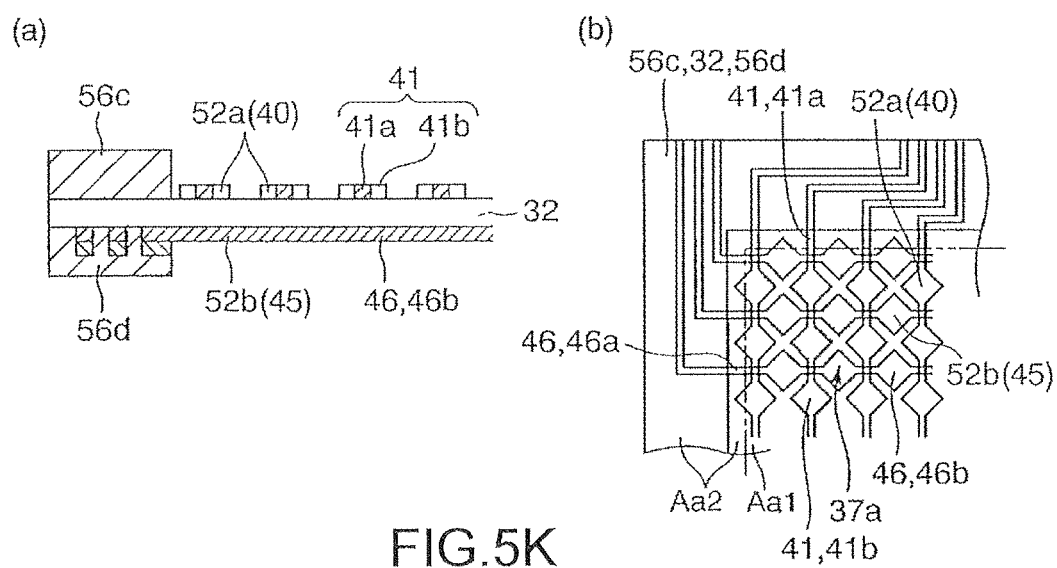
FIG. 5K is an explanatory diagram of the method for manufacturing the touchscreen panel sensor shown in FIGS. 3A and 3B.
Figure 5L:
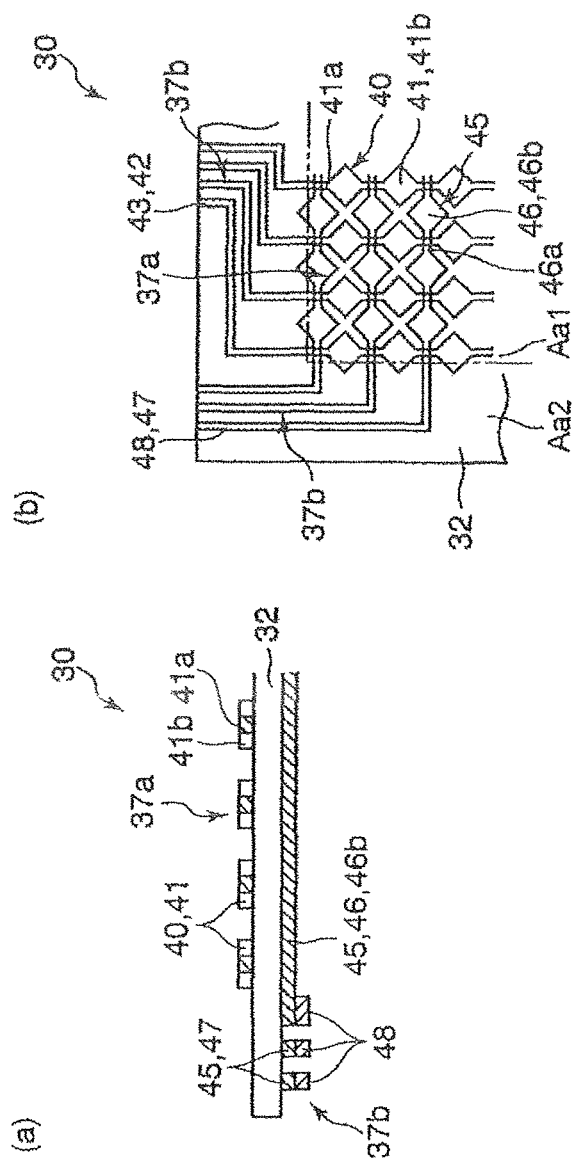
FIG. 5L is an explanatory diagram of the method for manufacturing the touchscreen panel sensor shown in FIGS. 3A and 3B.
Figure 6:
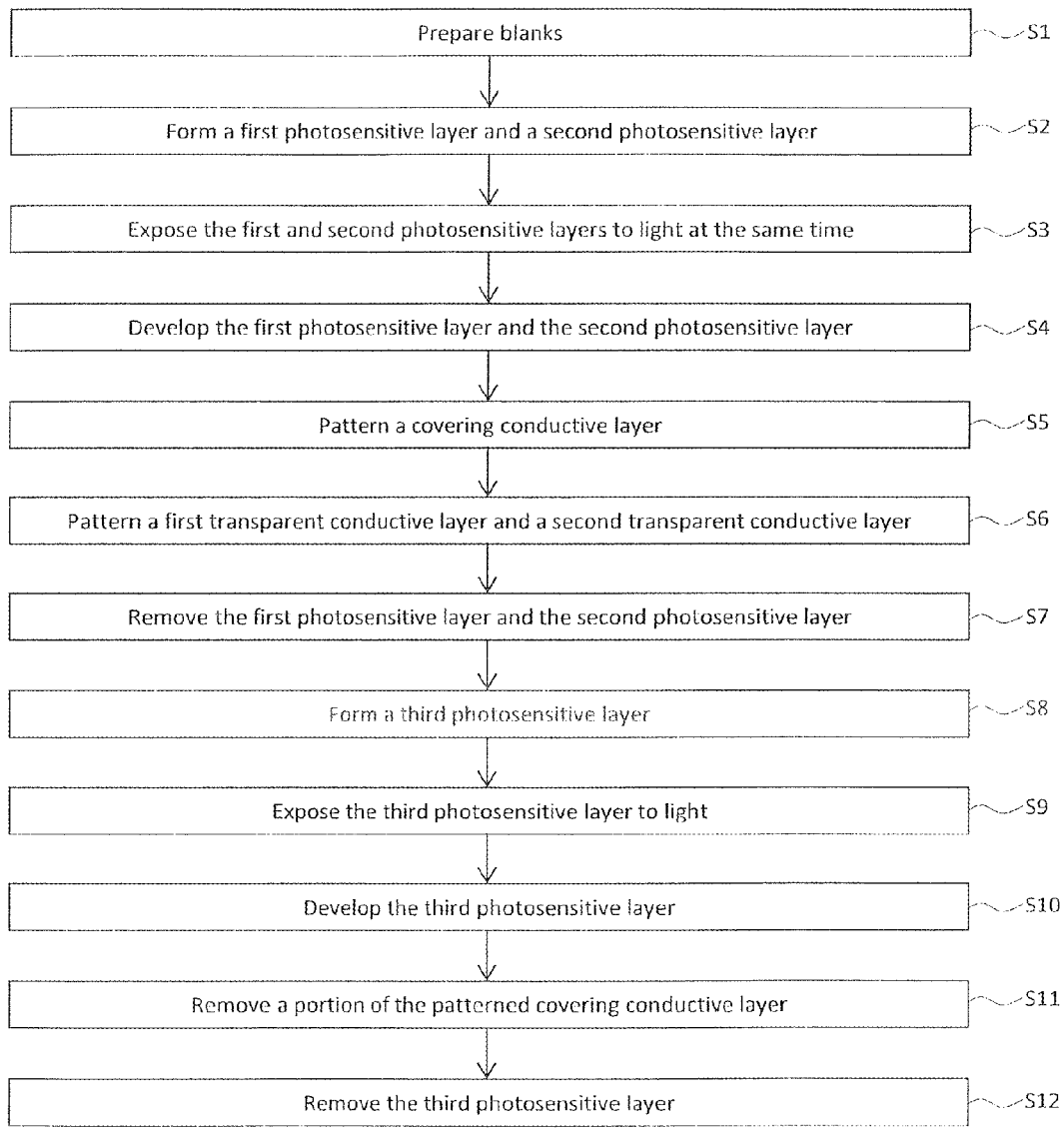
FIG. 6 is a flowchart for illustrating the method for manufacturing the touchscreen panel sensor shown in FIGS. 3A and 3B.

FIGS. 1 to 6 illustrate the first embodiment of the present invention. Of these figures, FIG. 1 is a diagram schematically showing a touchscreen panel device along with a display device, FIG. 2 is a sectional view showing a touchscreen panel sensor of the touchscreen panel device of FIG. 1 along with the display device, FIGS. 3A and 3B are a top view and a sectional view, respectively, showing the touchscreen panel sensor of the touchscreen panel device, and FIGS. 4(a) and 4(b) are diagrams that show more specific examples of a base film included in the touchscreen panel sensor. In addition, FIGS. 5A to 5L are explanatory diagrams of a method for manufacturing the touchscreen panel sensor shown in FIGS. 3A and 3B. Furthermore, FIG. 6 is a flowchart for illustrating the method for manufacturing the touchscreen panel sensor shown in FIGS. 3A and 3B.

The touchscreen panel device 20 shown in FIGS. 1 to 3B is constructed as a projected type of capacitive-coupling scheme to detect a contact position of an external conductor (e.g., a human finger) with respect to the touchscreen panel device. When the touchscreen panel device 20 of the capacitive-coupling scheme has excellent detection sensitivity, a mere approach of the external conductor to the touchscreen panel device enables the device to detect what region of the device the external conductor is approaching. The wording "contact position" used herein along with this event means a concept including an approach position that actually does not mean a contact position but is detectable.

As shown in FIGS. 1 and 2, the touchscreen panel device 20 is used in combination with the display device (e.g., liquid-crystal display device) 15, thereby constituting an input/output device 10. The illustrated display device 15 is constructed as a flat-panel display. The display device 15 includes a display panel 16 having a display surface 16a, and a display controller 17 connected to the display panel 16. The display panel 16 includes a display region A1 for displaying an image, and a non-display region (also called a frame region or bezel region) A2 disposed externally and around the display region A1. The display controller 17 processes image information relating to the image to be displayed, and drives the display panel 16 in accordance with the image information. The display panel 16 receives a control signal from the display controller 17 and displays the predetermined image on the display surface 16a. That is, the display device 15 functions as an output device to output characters, figures/graphics, and other information, as images.

The touchscreen panel device 20 includes a touchscreen panel sensor 30 disposed on the display surface 16a of the display device 15, and a detection controller 25 connected to the touchscreen panel sensor 30. As shown in FIG. 2, the touchscreen panel sensor 30 is attached to the display surface 16a of the display device 15 via an adhesive layer 19. As discussed above, the touchscreen panel device 20 is constructed as the projected type of capacitive-coupling scheme, and functions as an input device for entering information.

As shown in FIG. 2, the touchscreen panel device 20 also includes a protective cover 12 having a light-transmitting property, at an observer's side of the touchscreen panel sensor 30, that is, at a side opposite to the display device 15. The cover 12 functions as a dieletric. The protective cover 12 is attached to the surface of the touchscreen panel sensor 30 via an adhesive layer 14. The protective cover 12 functions as an input surface (touch surface, contact surface) with respect to the touchscreen panel device 20. This means that bringing the conductor, for example the human finger 5, into contact with the protective cover 12 enables information to be input from the outside to the touchscreen panel device 20. The protective cover 12 forms the surface of the input/output device 10 that is usually the closest of all its elements with respect to the observer. In the input/output device 10, the cover 12 also functions as a cover for protecting the touchscreen panel device 20 and the display device 15 from the outside.

The adhesive layers 14, 19 mentioned above can be layers formed from various materials each having an adhesive nature. In addition, the wording "attach" and "adhesive (layer)" in this specification are used to denote a concept including "cohere/stick" and "coherent/pressure-sensitive (layer)".

The detection controller 25 of the touchscreen panel device 20, connected to the touchscreen panel sensor 30, processes the information that has been entered via the protective cover 12. More specifically, the detection controller 25 includes a detection circuit composed so that when the conductor (typically, the human finger) 5 is in contact with the protective cover 12, the circuit can identify a position on the protective cover 12 where the conductor 5 is in contact with the cover. The detection controller 25 is also connected to the display controller 17 of the display device 15 so as to transmit processed input information to the display controller 17. In this case, the display controller 17 can create image information based on the input information, and display this image on the display panel 16.

The terms "capacitive-coupling scheme" and "projected (type of) capacitive-coupling scheme" in the present invention are used to mean substantially the same as used in the field of touchscreen panels. In the field of touchscreen panels, the "capacitive-coupling scheme" is also called the "electrostatic capacitive scheme", the "electrostatic-capacitive coupling scheme" or the like. In the present invention, the "capacitive-coupling scheme" is dealt with as a synonym for the terms "electrostatic capacitive scheme", "electrostatic-capacitive coupling scheme", and the like. A typical touchscreen panel device of the electrostatic-capacitive coupling scheme includes an electrical conductor layer, and forms electrostatic capacity between an external conductor (typically, a human finger) and the electrical conductor layer of the touchscreen panel device when the external conductor comes into contact with the touchscreen panel. A change in electrical state due to the formation of the electrostatic capacity is then used as a basis for identifying position coordinates of a position on the touchscreen panel where the external conductor is in contact therewith. In addition, in the field of touchscreen panels, the "projected type" of capacitive-coupling scheme is also called the "projected form" of capacitive-coupling scheme or the like. In the present invention, the "projected type" of capacitive-coupling scheme is dealt with as a synonym for the terms "projected form" of capacitive-coupling scheme and the like. The "projected type" of capacitive-coupling scheme can be contrasted with a "surface type" of capacitive-coupling scheme typically having film-shaped electrodes as well as a grid-like array of sensor electrodes.

Figure 3A:
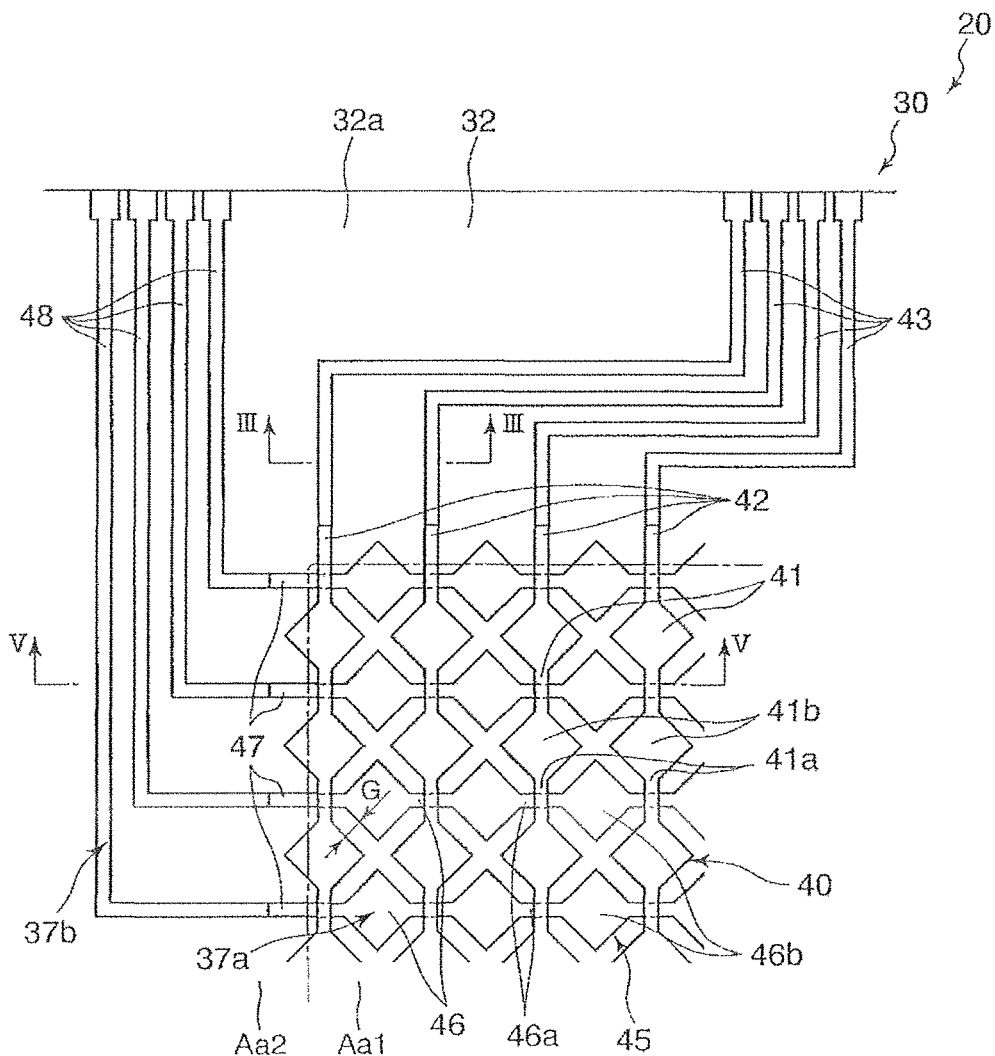
FIG. 3A is a top view showing the touchscreen panel sensor of the touchscreen panel device.

As well shown in FIGS. 2 and 3A, the touchscreen panel sensor 30 includes a base film 32, a first transparent electrical conductor 40 provided in a predetermined pattern on one surface 32a of the base film 32 that is closer to the observer, and a second transparent electrical conductor 45 provided in a predetermined pattern on the other surface 32b of the base film 32 that is closer to the display device 15. Additionally, as shown in FIG. 3A, the touchscreen panel sensor 30 further includes a first electrical lead-out conductor 43 provided on one section of the first transparent electrical conductor 40, and a second electric lead-out conductor 48 provided on one section of the second transparent electrical conductor 45.

The base film 32 that functions as a dielectric in the touchscreen panel sensor 30 can be composed of a polyethylene terephthalate (PET) film, for example. As shown in FIG. 3A, the base film 32 includes an active area Aa1 corresponding to a region whose touch position is detectable, and a non-active area Aa2 adjacent to the active area Aa1. As shown in FIG. 1, the active area Aa1 of the touchscreen panel sensor 30 occupies a region facing the display region A1 of the display device 15. The non-active area Aa2 is formed so that it surrounds the active area Aa1 of a rectangular shape from all directions or sides. In other words, the non-active area Aa2 is of a frame form or a bezel form. The non-active area Aa2 is formed in a region facing the non-display region A2 of the display device 15.

A sensor electrode 37a capable of working with the external conductor 5 to form a capacitive coupling between both is provided on the active area Aa1 of the base film 32. An electrical lead-out line 37b connected to the sensor electrode 37a is provided on the non-active area Aa2 of the base film 32. The lead-out line 37b is electrically connected at one end thereof to the sensor electrode 37a, and at the other end thereof to the detection circuit of the detection controller 25 that is configured to detect the contact position of the external conductor with respect to the display surface 12. In the present embodiment, as shown in FIG. 3A, the first transparent electrical conductor 40 and the second transparent electrical conductor 45 each have only a portion placed on the active area Aa1 of the base film 32. These portions of the first transparent electrical conductor 40 and the second transparent electrical conductor 45 form the sensor electrode 37a. The base film 32, the first transparent electrical conductor 40, and the second transparent electrical conductor 45 have a light-transmitting property, and via these elements, the observer can observe the image displayed on the display device 15.

In the present embodiment, a film acting as a single entity forms the base film 32. The "single entity" here means that the film is inseparable into at least two parts. The film as the single entity, therefore, does not include a bonded structure of a plurality of films that is formed by bonding the films together via an adhesive layer. In the meantime, a base film includes a film body and a functional film deposited on one surface or both surfaces of the film body by, for example, sputtering so as to be inseparable (but, removable). The base film corresponds to the film of the single entity herein referred to. Examples of a base film including a functional film and a film body are shown in FIGS. 4(a) and 4(b).

In the example of FIG. 4(a), the base film 32 includes a film body 33 formed from a resin (e.g., PET), and an index-matching film 34 formed on one surface or both surfaces of the film body 33. The index-matching film 34 includes a plurality of high-refractive-index films 34a and low-refractive-index films 34b arranged at alternate positions. Even if the film body 33 of the base film 32 and the transparent electrical conductors 40, 45 significantly differ in refractive index, the index-matching film 34 prevents reflectance from significantly changing between the region having the transparent electrical conductors 40, 45 on the base film 32, and a region not having these conductors.

In the example of FIG. 4(b), the base film 32 includes a film body 33 formed from a resin (e.g., PET), and a low-refractive-index film 35 formed on one surface or both surfaces of the film body 33. Even if the film body 33 of the base film 32 and the transparent electrical conductors 40, 45 significantly differ in refractive index, the low-refractive-index film 35 prevents spectral characteristics of transmittance from significantly changing between the region having the transparent electrical conductors 40, 45 on the base film 32, and a region not having these conductors. Thus, uniform transmittance in various wavelength regions can be achieved.

Next, the first transparent electrical conductor 40 and the second transparent electrical conductor 45 will be described in further detail.

The first transparent electrical conductor 40 and the second transparent electrical conductor 45 are both formed from an electrically conductive material, for example, indium tin oxide (ITO), and electrically connected to the detection circuit of the detection controller 25 for detecting the contact position of the external conductor 5 with respect to the display surface 12. The first transparent electrical conductor 40 has a large number of first sensor portions (first sensor conductors, sensor electrodes) 41 arranged on the active area Aa1 of the base film 32, and a large number of first terminal portions (first terminal conductors) 42 arranged on the non-active area Aa2 of the base film 32 so that the first terminal portions 42 are each coupled to specific one of the first sensor portions 41. Likewise, the second transparent electrical conductor 45 has a large number of second sensor portions (second sensor conductors, sensor electrodes) 46 arranged on the active area Aa1 of the base film 32, and a large number of second terminal portions (second terminal conductors) 47 arranged on the non-active area Aa2 of the base film 32 so that the second terminal portions 47 are each coupled to specific one of the second sensor portions 46.

Each first sensor portion 41 of the first transparent electrical conductor 40 is disposed in a predetermined pattern on one surface 32a of the base film 32 that is closer to the observer. Each second sensor portion 46 of the second transparent electrical conductor 45 is disposed in a predetermined pattern which is different from the pattern of the first sensor portion 41 of the first transparent electrical conductor 40, on the other surface 32b of the base film 32 that is closer to the display device 15. More specifically, as shown in FIG. 3A, the first sensor portion 41 of the first transparent electrical conductor 40 is constructed as linear conductors arranged next to one another in one direction along the film surface of the base film 32. Additionally, the second sensor portion 46 of the first transparent electrical conductor 40 is constructed as linear conductors arranged next to one another in the other direction crossing the above arrangement direction, along the film surface of the base film 32. In the present embodiment, the one direction that is the arrangement direction of the first sensor portion 41, and the other direction that is the arrangement direction of the second sensor portion 46 are orthogonal to each other on the film surface of the base film 32.

As shown in FIG. 3A, each of the linear conductors forming the first sensor portion 41 extends linearly in a direction crossing the arrangement direction of these conductors (i.e., the one direction). Similarly, each of the linear conductors forming the second sensor portion 46 extends linearly in a direction crossing the arrangement direction of these conductors (i.e., the other direction). In the illustrated example, in particular, the first sensor portion 41 extends linearly in the orthogonal direction (the other direction) relative to the arrangement direction (the one direction) of the constituent conductors. The second sensor portion 46 extends linearly in the orthogonal direction (the one direction) relative to the arrangement direction (the other direction) of the constituent conductors.

In the present embodiment, the first sensor portion 41 includes a linear portion 41a extending in linear form, and a bulged portion 41b bulged from the linear portion 41a. In the illustrated example, the linear portion 41a extends linearly in the direction crossing the arrangement direction of the first sensor portion 41. The bulged portion 41b is bulged from the linear portion 41a along the film surface of the base film 32. Width of the first sensor portion 41 is therefore great at the section having the bulged portion 41b. As shown in FIG. 3A, the first sensor portion 41 in the present embodiment has an outer profile nearly of a square shape in plan view, at the bulged portion 41b.

The second sensor portion 46 included in the second transparent electrical conductor 45 is constructed similarly to the first sensor portion 41 included in the first transparent electrical conductor 40. That is, the second sensor portion 46 included in the second transparent electrical conductor 45 includes a linear portion 46a extending in linear form, and a bulged portion 46b bulged from the linear portion 46a. In the illustrated example, the linear portion 46a extends linearly in the direction crossing the arrangement direction of the second sensor portion 46. The bulged portion 46b is bulged from the linear portion 46a along the film surface of the base film 32. Width of the second sensor portion 46 is therefore great at the section having the bulged portion 46b. As shown in FIG. 3A, the second sensor portion 46 in the present embodiment has an outer profile nearly of a square shape in plan view, at the bulged portion 46b.

As shown in FIG. 3A, when the first sensor portion 41 included in the first transparent electrical conductor 40 is observed from a normal-line direction of the film surface of the base film 32 (i.e., in plan view), the first sensor portion 41 crosses the large number of second sensor portions 46 included in the second transparent electrical conductor 45. As shown in FIG. 3A, the bulged portion 41b of the first transparent electrical conductor 40 is disposed between crossing points relative to any two adjacent second sensor portions 46, on the first sensor portion 41. Similarly, when observed from the normal-line direction of the film surface of the base film 32, the second sensor portion 46 included in the second transparent electrical conductor 45 crosses the large number of first sensor portions 41 included in the first transparent electrical conductor 40. The bulged portion 46b of the second transparent electrical conductor 45 is disposed between crossing points relative to any two adjacent first sensor portions 41, on the second sensor portion 46. Additionally, in the present embodiment, the bulged portion 41b of the first sensor portion 41 included in the first transparent electrical conductor 40, and the bulged portion 46b of the second sensor portion 46 included in the second transparent electrical conductor 45 are arranged so as not to overlap each other when observed from the normal-line direction of the film surface of the base film 32. In other words, the first sensor portion 41 included in the first transparent electrical conductor 40, and the second sensor portion 46 included in the second transparent electrical conductor 45 cross each other only at the linear portions 41a, 46a of each sensor portion 41, 46 when observed from the normal-line direction of the film surface of the base film 32.

As described above, the first transparent electrical conductor 40 has first terminal portions 42 coupled to such first sensor portions 41. Depending on a method of detecting the contact position, one or two first terminal portions 42 are provided for each of the first sensor portions 41. Each first terminal portion 42 linearly extends from an end of a corresponding first sensor portion 41. Likewise, the second transparent electrical conductor 45 has second terminal portions 47 coupled to the second sensor portions 46. Depending on the method of detecting the contact position, one or two second terminal portions 47 are provided for each of the second sensor portions 46. Each second terminal portion 47 linearly extends from an end of a corresponding second sensor portion 46. As shown in FIG. 3A, in the present embodiment, the first terminal portion 42 is integrally formed from the same material as that of the first sensor portion 41, and the second terminal portion 47 is integrally formed from the same material as that of the second sensor portion 46.

Next, the first lead-out conductor 43 and the second lead-out conductor 48 are detailed below. As mentioned above, the first lead-out conductor 43 is disposed on one section of the first transparent electrical conductor 40, and the second lead-out conductor 48 is disposed on one section of the second transparent electrical conductor 45. More specifically, the first lead-out conductor 43 is disposed on one part of the first terminal portion 42 of the first transparent electrical conductor 40, and the second lead-out conductor 48 is disposed on one part of the second terminal portion 47 of the second transparent electrical conductor 45. In other words, the first lead-out conductor 43 is disposed in the non-active area Aa2 on one surface 32a of the base film 32, and the second lead-out conductor 48 is disposed in the non-active area Aa2 on the other surface 32b of the base film 32.

As shown in FIG. 3A, the first terminal portion 42 of the first transparent electrical conductor 40 and the second terminal portion 47 of the second transparent electrical conductor 45 are formed linearly. The first lead-out conductor 43 extends linearly in the same pattern as that of a portion of the linearly formed first terminal portion 42 that is other than a neighboring portion of a connection to the first sensor portion 41. Likewise, as shown, the second lead-out conductor 48 extends linearly in the same pattern as that of a portion of the linearly formed second terminal portion 47 that is other than a neighboring portion of a connection to the second sensor portion 46.

Figure 3B:
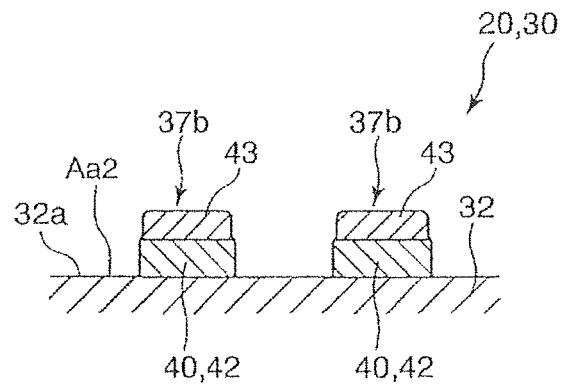
FIG. 3B is a sectional view taken along line III-III of FIG. 3A.
Figure 4:
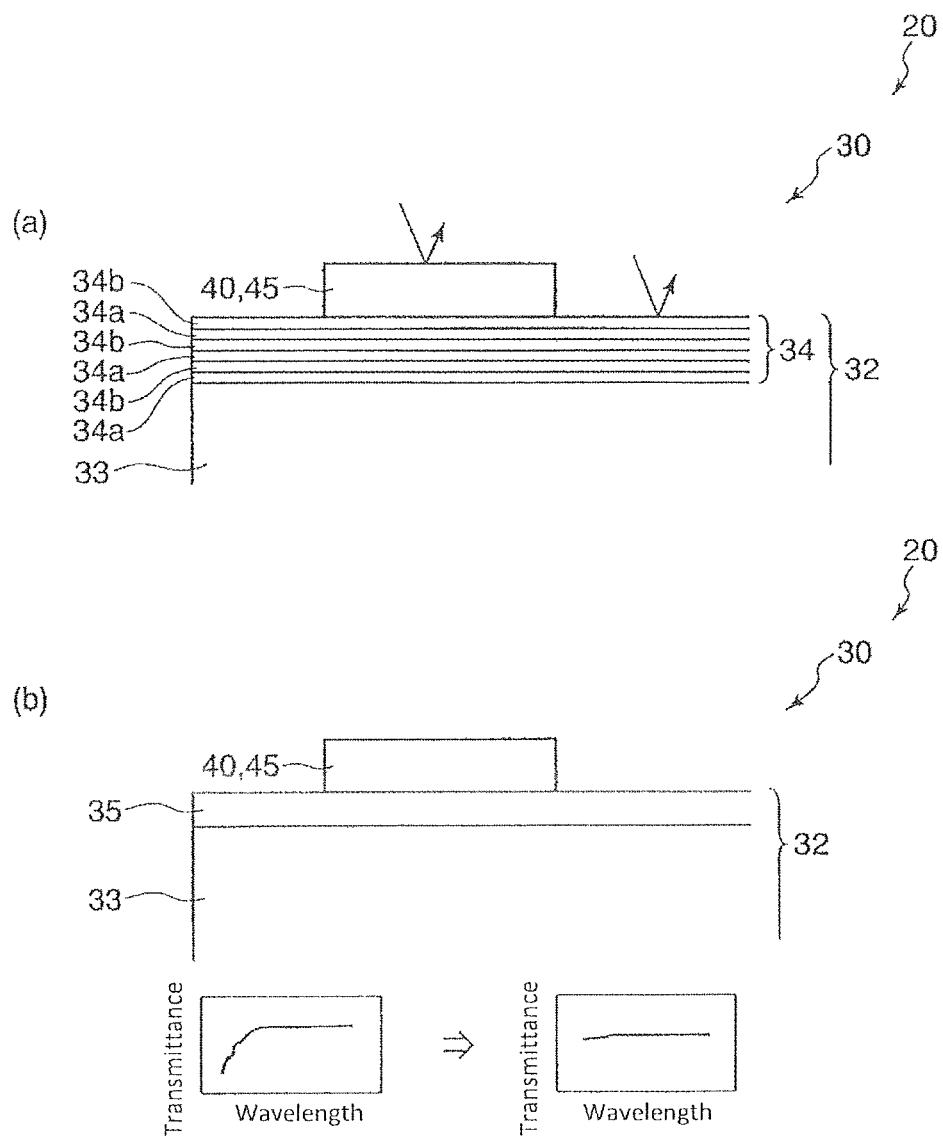
FIGS. 4(a) and 4(b) are sectional views that show more specific examples of a base film included in the touchscreen panel sensor.

In addition, as shown in FIG. 3B, the first lead-out conductor 43 is disposed on the first transparent electrical conductor 40 spacedly from the base film 32. That is, the first lead-out conductor 43 is not in contact with the base film 32. As a result, the section of the first transparent electrical conductor 40 that is overlaid with the first lead-out conductor 43 is exposed in a lateral direction between the base film 32 and the first lead-out conductor 43. In the present embodiment, in particular, width of the first lead-out conductor 43 is the same as or slightly smaller than that of a part of the first terminal portion 42 of the first transparent electrical conductor 40 that is overlaid with the first lead-out conductor 43.

Although not shown, the second lead-out conductor 48 is constructed similarly to the first lead-out conductor 43. That is, the second lead-out conductor 48 is disposed on the second transparent electrical conductor 45 spacedly from the base film 32, and is not in contact with the base film 32. As a result, the section of the second transparent electrical conductor 45 that is overlaid with the second lead-out conductor 48 is exposed in a lateral direction between the base film 32 and the second lead-out conductor 48. In the present embodiment, in particular, width of the second lead-out conductor 48 is the same as or slightly smaller than that of a part of the second terminal portion 47 of the second transparent electrical conductor 45 that is overlaid with the second lead-out conductor 48.

The first lead-out conductor 43 works with the first terminal portion 42 of the first transparent electrical conductor 40 to constitute the lead-out line 37b for connecting the sensor electrode 37a to the detection controller 25. The sensor electrode 37a includes the first sensor portion 41 of the first transparent electrical conductor 40. The second lead-out conductor 48 works with the second terminal portion 47 of the second transparent electrical conductor 45 to constitute the lead-out line 37b for connecting the sensor electrode 37a to the detection controller 25. The sensor electrode 37a includes the second sensor portion 46 of the second transparent electrical conductor 45. Since the first lead-out conductor 43 and the second lead-out conductor 48 are arranged on the non-active area Aa2, these conductors do not need to be formed from a material having a light-transmitting property, and is capable of being formed from a material having an excellent, electrically conductive property. In the present embodiment, the first lead-out conductor 43 and the second lead-out conductor 48 are formed from a material having higher electrical conductivity than the material forming the first transparent electrical conductor 40 and the second transparent electrical conductor 45. More specifically, the first lead-out conductor 43 and the second lead-out conductor 48 can be formed using a metallic material, such as aluminum, molybdenum, silver, chromium, or copper, that has a light-shielding property and has much higher electrical conductivity than that of a transparent electrical conductor formed from ITO or other materials.

In the touchscreen panel sensor 30 having the above-described configuration, the lead-out line 37b formed by the lead-out conductor 43, 48 and the terminal portion 42, 47 of the transparent electrical conductor 40, 45, is connected to the detection controller 25 via an external connection line not shown. Additionally, in accordance with the touchscreen panel sensor 30 having the above-described configuration, even if the touchscreen panel sensor 30 undergoes a bending pressure, for example, and becomes deformed, the lead-out conductor 43, 48 and the terminal portion 42, 47 of the transparent electrical conductor 40, 45 are maintained in an interconnected state as described below. Therefore, stable electrical continuity between the sensor electrode 37a and the detection controller 25 is ensured.

While the lead-out conductor 43, 48 made of a metal or any other material having high electrical conductivity has some degree of adhesion with respect to the transparent electrical conductor 40, 45, the lead-out conductor 43, 48 is low in adhesive strength with respect to the base film 32 formed from a resin, glass, or the like. Accordingly, as in FIG. 11, for example, when a conductor of high electrical conductivity is in contact with a base material formed from a resin, glass, or the like, this contact position forms a starting point of peeling-off and if the base material becomes deformed as shown with a double-dashed line, the conductor of high electrical conductivity easily peels off from the base material. In particular, in a case of the transparent electrical conductor being totally covered with the conductor of high electrical conductivity, rigidity of the transparent electrical conductor and the conductor of high electrical conductivity as a whole is increased. This makes the two conductors less prone to deformation since both follow the deformation of the base material. Partly because of this, the conductor of high electrical conductivity becomes prone to peel off from the base material.

On the other hand, in accordance with the present embodiment, since the lead-out conductor 43, 48 is spaced from the base film 32, the starting point of the peeling-off of the lead-out conductor 43, 48 from the base film 32 is not formed. In addition, the lead-out conductor 43, 48 is only rested upon the transparent electrical conductor 40, 45 and does not cover the transparent electrical conductor 40, 45 from a lateral direction. This makes the transparent electrical conductor 40, 45 easily follow the deformation of the base film 32 and become deformed, which also makes the transparent electrical conductor 40, 45 less prone to peel off from the base film 32. For these reasons, in accordance with the touchscreen panel sensor 30 of the present embodiment, even if the touchscreen panel sensor 30 undergoes a bending pressure, for example, and becomes deformed, the lead-out conductor 43, 48 and the terminal portion 42, 47 of the transparent electrical conductor 40, 45 are maintained in the interconnected state. Therefore, stable electrical continuity between the sensor electrode 37a and the detection controller 25 is ensured.

Furthermore, as shown in FIG. 3B, the lead-out conductor 43, 48 in the touchscreen panel sensor 30 having the above configuration is only disposed on the terminal portion 42, 47 of the transparent electrical conductor 40, 45 and does not extend to a lateral region of the terminal portion 42, 47 of the transparent electrical conductor 40, 45. Therefore, the entire lead-out line 37b formed by the lead-out conductor 43, 48 and the terminal portion 42, 47 of the transparent electrical conductor 40, 45, can be reduced in line width. This, in turn, enables the lead-out lines 37b of the same conductivity to be arranged at shorter pitches, and thus an arrangement space for the lead-out lines 37b, that is, a surface area of the non-active area Aa2, to be reduced.

Next, the method for manufacturing the touchscreen panel sensor 30 of the above configuration, in line with the flowchart shown in FIG. 6 is described below referring to FIGS. 5A to 5L. In each of FIGS. 5A to 5L, sectional view (a) shows the work-in-progress touchscreen panel sensor (laminate) in a section corresponding to a section depicted along line V-V in FIG. 3A. In addition, in each of FIGS. 5A to 5L, top view (b) shows the work-in-progress touchscreen panel sensor (laminate) as viewed from one side (an upper side of each sectional view (a) on the paper).

As shown in FIGS. 6 and 5A, the laminate (also called "blanks") as the base material for manufacturing the touchscreen panel sensor 30 is first provided (step S1). The touchscreen panel sensor 30 is obtained by conducting film deposition, patterning, and/or other processing, upon the laminate 50.

As shown in sectional view (a) of FIG. 5A, the laminate 50 provided in the present embodiment includes a transparent base film 32, a first transparent electrically conductive layer 52a laminated on one surface 32a of the base film 32, a second transparent electrically conductive layer 52b laminated on the other surface 32b of the base film 32 and having a light-transmitting property, a first covering electrically conductive layer 54a laminated on the first transparent electrically conductive layer 52a, and a second covering electrically conductive layer 54b laminated on the second transparent electrically conductive layer 52b. That is, alignment marks and product information in the present embodiment, as with the lead-out conductors 43, 48, are formed on a two-layer film obtained by laminating the transparent conductive layers 52a, 52b and the covering conductive layers 54a, 54b on the respective surfaces 32a, 32b of the base film 32. Additionally, the alignment marks and product information in the present embodiment, as with the lead-out conductors 43, 48, can be formed on both surfaces 32a and 32b of the base film 32. The product information includes at least one of a product name, a lot number, a manufacturing date, and product grade, thus enabling confirmation of the product information after individual-piece cutting and mounting in the touchscreen panel device. Furthermore, machine-readable information such as bar codes is formed, which in turn enables product management/control during post-processing such as mounting in the touchscreen panel device.

As described above, the base film 32 can be a resin film such as a PET film. Alternatively, as shown in FIGS. 4(a) and 4(b), the base film 32 may include the film body 33 formed from a resin such as PET, and the functional film 34, 35 formed on one surface or both surfaces of the film body 33.

The first transparent conductive layer 52a and the second transparent conductive layer 52b, as will be described later herein, are patterned to form respectively the first transparent electrical conductor 40 and second transparent electrical conductor 45 having a light-transmitting property. Therefore, the first transparent conductive layer 52a and the second transparent conductive layer 52b are formed from a material having a light-transmitting property and a conductive property. As an example, the first transparent conductive layer 52a and the second transparent conductive layer 52b can be formed as an ITO film deposited on the surfaces 32a, 32b of the base film 32 by sputtering.

The first covering conductive layer 54a and the second covering conductive layer 54b, as will be described later, are patterned to form respectively the first lead-out conductors 43, 48 having high conductivity. Therefore, the first covering conductive layer 54a and the second covering conductive layer 54b are suitably formed from a material having higher conductivity than that of the material forming the transparent conductive layers 52a, 52b.

In addition, the first covering conductive layer 54a and the second covering conductive layer 54b are layers having a light-shielding property against light used for light-exposure of photosensitive layers 56a and 56b described later herein. That is, the first and second covering conductive layers do not permit the exposure light to pass therethrough. In the present embodiment, however, the first and second covering conductive layers are formed as layers having a light-shielding property against not only the exposure light for the photosensitive layers 56a, 56b, but also light of other wavelength regions. More specifically, the first and second covering conductive layers are formed as the layers having the property of shielding visible light, ultraviolet radiation, infrared radiation, and other radiation contained in natural light. Using these layers as the covering conductive layers 54a, 54b is expected to block the exposure light more reliably.

Varieties of materials are known to be useable to form the first covering conductive layer 54a and the second covering conductive layer 54b. In consideration of costs, workability/processability, and other factors, aluminum, molybdenum, silver, chromium, copper, or other metals can be used. A light-blocking or light-shielding layer 54 made of a metal can be formed on one surface of the first conductive layer 52a, that is, on the surface opposite to the base film 32, by sputtering.

It is noted that the laminate 50 of a sheet-shaped type, or the laminate 50 of an elongate web-shaped type, for example, taken up onto a roll may be provided. In consideration of production efficiency, however, the laminate 50 is preferably fabricated in a different place and then taken up onto a roll before being provided. Additionally, the laminate 50 of the roll form is preferably unwound to be supplied in the form of a web, and then the steps described below are preferably conducted upon the web-form laminate 50 to be supplied. An alternative preferable manufacturing method is to, after unwinding the base film 32 from the roll, deliver the base film 32 from the roll, or after unwinding from the roll an intermediate laminate including the base film 32 and the first and second transparent conductive layers 52a, 52b, deliver the intermediate laminate from the roll, then fabricate the laminate 50 from the base film 32 or the intermediate laminate, and provide the fabricated laminate 50 with the steps described below.

Next, as shown in FIGS. 6 and 5B, in addition to the photosensitive layer 56a being formed as a first photosensitive layer on one surface 50a of the laminate 50, the photosensitive layer 56b is formed as a second photosensitive layer on the other surface 50b of the laminate 50 (step S2). The first photosensitive layer 56a and the second photosensitive layer 56b have a photosensitive property with respect to light of a specific wavelength region, for example, ultraviolet radiation. More specifically, the photosensitive layers 56a, 56b can each be formed by coating the surface of the laminate 50 with a photosensitive material using a coater.

After that, as shown in FIGS. 6 and 5C, the first photosensitive layer 56a and the second photosensitive layer 56b are exposed to the light at the same time (step S3).

More specifically, first, as shown in sectional view (a) of FIG. 5C, a first mask 58a is placed over the first photosensitive layer 56a and a second mask 58b is placed under the second photosensitive layer 56b. The first mask 58a has a predetermined pattern corresponding to a pattern of the first transparent electrical conductor 40 to be formed, and the second mask 58b has a predetermined pattern corresponding to a pattern of the second transparent electrical conductor 45 to be formed. The pattern of the first mask 58a and that of the second mask 58b are different from each other.

Positioning of the first mask 58a and the second mask 58b is performed based on an alignment mark 59a provided on the first mask 58a and the second mask 58b each. In this method, the first mask 58a and the second mask 58b are positioned very accurately on an order of, for example, microns/micrometers, and very easily (hence, rapidly), with respect to each other.

Next as shown in sectional view (a) of FIG. 5C, the first photosensitive layer 56a and the second photosensitive layer 56b are irradiated with the exposure light (e.g., ultraviolet radiation) that matches photosensitive characteristics of the photosensitive layers 56a, 56b, via the masks 58a, 58b, respectively. As a result, the first photosensitive layer 56a and the second photosensitive layer 56b are exposed to the light at the same time in patterns different from each other.

In the illustrated example, the first photosensitive layer 56a and the second photosensitive layer 56b are of a photo-positive type. Therefore, the first photosensitive layer 56a is irradiated with the exposure light, in the pattern corresponding to a pattern of a portion removed by etching to form the first transparent electrical conductor 40, and the second photosensitive layer 56b is irradiated with the exposure light, in the pattern corresponding to a pattern of a portion removed by etching to form the second transparent electrical conductor 45. As shown in sectional view (a) of FIG. 5C, the exposure light that has been emitted towards the first photosensitive layer 56a penetrates the first photosensitive layer 56a and reaches the laminate (blanks) 50, and the exposure light that has been emitted towards the second photosensitive layer 56b penetrates the second photosensitive layer 56b and reaches the laminate 50.

Here, the laminate 50 has the first covering conductive layer 54a and second covering conductive layer 54b that block the exposure light. For this reason, the light that has been emitted from the exposure light source and penetrated the first photosensitive layer 56a is blocked by the first covering conductive layer 54a and thus does not reach the second photosensitive layer 56b. Likewise, the light that has been emitted from the exposure light source and penetrated the second photosensitive layer 56b is blocked by the second covering conductive layer 54b and thus does not reach the first photosensitive layer 56a. In other words, since the exposure light emitted in the predetermined pattern to expose the first photosensitive layer 56a to the light is blocked by the first covering conductive layer 54a, the exposure light of the predetermined pattern is not emitted towards the second photosensitive layer 56b. Likewise, since the exposure light emitted in the predetermined pattern to expose the second photosensitive layer 56b to the light is blocked by the second covering conductive layer 54b, the exposure light of the predetermined pattern is not emitted towards the first photosensitive layer 56a. This enables the first photosensitive layer 56a and the second photosensitive layer 56b to be exposed to the light at the same time accurately in desired respective patterns in exposure step S3.

Next, as shown in FIGS. 6 and 5D, the exposed first photosensitive layer 56a and second photosensitive layer 56b undergo development in step S4. More specifically, a developing solution matching the first photosensitive layer 56a and the second photosensitive layer 56b is provided and then this developer is used to develop the first photosensitive layer 56a and the second photosensitive layer 56b. Thus as shown in FIG. 5D, the portions, that have been Irradiated with the light from the exposure light source without being blocked by the first mask 58a and the second mask 58b, are removed from the first photosensitive layer 56a and the second photosensitive layer 56b. As a result, the first photosensitive layer 56a and the second photosensitive layer 56b have the predetermined respective patterns.

After this, as shown in FIGS. 6 and 5E, the first covering conductive layer 54a is etched, using the patterned first photosensitive layer 56a as a mask, and the second conductive layer 54b is etched, using the patterned second photosensitive layer 56b as a mask (step S5). The thus-etched first covering conductive layer 54a and second covering conductive layer 54b have substantially the same respective patterns as those of the first photosensitive layer 56a and the second photosensitive layer 56b. If the covering conductive layers 54a, 54b are made of aluminum or molybdenum, for example, a phosphoric-nitric-acetic acid aqueous solution formed by mixing phosphoric acid, nitric acid, acetic acid, and water at a rate of 5:5:5:1 can be used as an etching solution. If the covering conductive layers 54a, 54b are made of silver, a phosphoric-nitric-acetic acid aqueous solution formed by mixing phosphoric acid, nitric acid, acetic acid, and water at a rate of 4:1:4:4 can be used as an etching solution. If the covering conductive layers 54a, 54b are made of chromium, an etching solution can be used that is formed by mixing a cerium ammonium nitrate, perchloric acid, and water at a rate of 17:4:70.

After this, as shown in FIGS. 6 and 5F, the first transparent conductive layer 52a is etched, using the patterned first photosensitive layer 56a and first covering conductive layer 54a as a mask, and the second transparent conductive layer 52b is etched, using the patterned second photosensitive layer 56b and second covering conductive layer 54b as a mask (step S6). For example, if ferric chloride is used as an etching solution, the first transparent conductive layer 52a formed from ITO has substantially the same pattern as formed on the first photosensitive layer 56a and the first covering conductive layer 54a, and the second transparent conductive layer 52b formed from ITO has substantially the same pattern as formed on the second photosensitive layer 56b and the second covering conductive layer 54b. In other words, the first transparent conductive layer 52a and the second transparent conductive layer 52b are etched at the same time on both surfaces of each.

After this, as shown in FIGS. 6 and 5G, the first photosensitive layer 56a left on the patterned first covering conductive layer 54a, and the second photosensitive layer 56b left on the patterned second covering conductive layer 54b are removed in step S7. Using an alkaline solution such as 2% potassium hydroxide removes the remaining first photosensitive layer 56a, thus exposing the patterned first covering conductive layer 54a. The above also removes the remaining second photosensitive layer 56b, thus exposing the patterned second covering conductive layer 54b.

Next as shown in FIGS. 6 and 5H, a third photosensitive layer 56c is formed as yet another photosensitive layer over the patterned first covering conductive layer 54a, and a fourth photosensitive layer 56d is formed as another photosensitive layer at the patterned second covering conductive layer 54b (step S8). In the illustrated example, the third photosensitive layer 56c is formed in such a form as to cover the work-in-progress touchscreen panel sensor 30 (laminate 50) from one direction, and the fourth photosensitive layer 56d is formed in such a form as to cover the work-in-progress touchscreen panel sensor 30 (laminate 50) from another direction. The third photosensitive layer 56c and the fourth photosensitive layer 56d, as with the first photosensitive layer 56a and the second photosensitive layer 56b, have a photosensitive property with respect to light of a specific wavelength region, for example, ultraviolet radiation. Additionally, the third photosensitive layer 56c and the fourth photosensitive layer 56d, as with the first photosensitive layer 56a and the second photosensitive layer 56b, can each be formed by coating the surface of the laminate 50 with a photosensitive material using a coater.

After that, as shown in FIGS. 6 and 5I, the third photosensitive layer 56c and the fourth photosensitive layer 56d are exposed to the light at the same time (step S9).

In step S9, first, as shown in sectional view (a) of FIG. 5I, a third mask 58c is placed over the third photosensitive layer 56c and a fourth mask 58d is placed under the fourth photosensitive layer 56d. The third mask 58c has a predetermined pattern corresponding to a portion of the first covering conductive layer 54a that is to be removed to form the first lead-out conductor 43, and the third mask 58c has a predetermined pattern corresponding to a portion of the second covering conductive layer 54b that is to be removed to form the second lead-out conductor 48. In the illustrated example, the third mask 58c has the pattern formed so as to match the active area Aa1, more specifically, a light-transmitting region slightly larger than the active area Aa1. In addition, in the illustrated example, the fourth mask 58d has the same pattern as that of the third mask 58c.

An alignment mark for positioning may be formed before the first covering conductive layer 54a is patterned. In that case, positioning of the third mask 58c can be performed based on this alignment mark formed from the first covering conductive layer 54a. Using this method enables the third mask 58c to be positioned very accurately with respect to the patterns of the first covering conductive layer 54a and the first transparent conductive layer 52a. Substantially the same method can be adopted for positioning the fourth mask 58d. Thus, the fourth mask 58d can be positioned very accurately with respect to the patterns of the second covering conductive layer 54b and the second transparent conductive layer 52b.

Next as shown in sectional view (a) of FIG. 5I, after the third mask 58c and the fourth mask 58d have been disposed, the photosensitive layers 56c, 56d are irradiated with the exposure light (e.g., ultraviolet light) that matches photosensitive characteristics of the third photosensitive layer 56c and the fourth photosensitive layer 56d, via the masks 58c, 58d. This results in the third photosensitive layer 58c and the fourth photosensitive layer 58d being exposed to the light at the same time in the same pattern. In the illustrated example, the first photosensitive layer 56a and the second photosensitive layer 56b are of the photo-positive type. The third mask 58c and the fourth mask 58d have a light-transmitting region including the region facing the active area Aa1. Therefore, the third photosensitive layer 56c and the fourth photosensitive layer 56d are irradiated with the exposure light, in the region facing the active area Aa1, and in a region around that region. The pattern of the light emitted from the exposure light towards the third photosensitive layer 56c is the same as that of the light emitted towards the fourth photosensitive layer 56d. The third photosensitive layer 56c and the fourth photosensitive layer 56d can therefore be exposed to the light at the same time in a preplanned pattern accurately.

Next, as shown in FIGS. 6 and 5J, the exposed third photosensitive layer 56c and fourth photosensitive layer 56d undergo development in step S10. More specifically, a developing solution matching the third photosensitive layer 56c and the fourth photosensitive layer 56d is prepared and then this developer is used to develop the third photosensitive layer 56c and the fourth photosensitive layer 56d. Thus as shown in FIG. 5J, the portions that have been irradiated with the exposure light without being blocked by the third mask 58c and the fourth mask 58d are removed from the third photosensitive layer 56c and the fourth photosensitive layer 56d. That is, of the third photosensitive layer 56c and the fourth photosensitive layer 56d, the region facing the active area Aa1, and the region around that region are removed, and the third photosensitive layer 56c and the fourth photosensitive layer 56d remain only in a region facing the non-active area Aa2.

After this, as shown in FIGS. 6 and 5K, etching is performed for the first covering conductive layer 54a that has been patterned, using the patterned third photosensitive layer 56c as a mask, and for the second covering conductive layer 54b that has been patterned, using the patterned fourth photosensitive layer 56d as a mask (step S11). The etching solution used in this step has an erosive property with respect to the covering conductive layers 54a, 54b, and yet exhibits no erosive property with respect to the transparent conductive layers 52a, 52b, or the etching solution may have a weak erosive property with respect to the transparent conductive layers 52a, 52b. Such an etching solution protects the pattern of the transparent conductive layers 52a, 52b exposed as a result of removing the covering conductive layers 54a, 54b. Briefly, the etching solution used in step S11 is selected so that desired layers (the covering conductive layers 54a, 54b) can be selectively etched. In a more specific example, such an etching solution as the above-mentioned phosphoric-nitric-acetic acid aqueous solution or containing cerium nitrate, is suitably used in step S11 since, although the etching solution has an etching property against the covering conductive layers 54a, 54b formed from a predetermined metal, the etching solution has no etching property against the transparent conductive layers 52a, 52b formed from ITO or the like.

At least the portion of the patterned first covering conductive layer 54a that is disposed at a position facing the active area Aa1 is removed by etching in step S11, and at least the portion of the patterned second covering conductive layer 54b that is disposed at a position facing the active area Aa1 is likewise removed by etching in step S11. Thus as shown in top view (b) of FIG. 5K, only the base film 32 and the transparent conductive layers 52a, 52b remain on the active area Aa1. Accordingly, the active area Aa1 comes to have a light-transmitting property over the entire area.

In this way, the portion of the first covering conductive layer 54a that is not covered by the third photosensitive layer 56c is removed and hence the first transparent conductive layer 52a becomes exposed. The exposed first transparent conductive layer 52a is positioned in a region facing the active area Aa1, and around that region. The first transparent conductive layer 52a positioned in the region facing the active area Aa1 has a predetermined pattern and forms the first sensor portion 41 of the first transparent electrical conductor 40. The first transparent conductive layer 52a exposed at the non-active area Aa2 has a predetermined pattern and forms part of the first sensor portion 42 of the first transparent electrical conductor 40.

Likewise, the portion of the second covering conductive layer 54b that is not covered by the fourth photosensitive layer 56d is removed and hence the second transparent conductive layer 52b becomes exposed. The exposed second transparent conductive layer 52b is positioned in a region facing the active area Aa1, and around that region. The second transparent conductive layer 52b positioned in a region facing the active area Aa1 has a predetermined pattern and forms the second sensor portion 46 of the second transparent electrical conductor 45. The second transparent conductive layer 52b exposed at the non-active area Aa2 has a predetermined pattern and forms part of the second sensor portion 47 of the second transparent electrical conductor 45.

Next as shown in FIGS. 6 and 5L, the third photosensitive layer 56c left on the patterned first covering conductive layer 54a, and the fourth photosensitive layer 56d left on the patterned second covering conductive layer 54b are removed in step S12. The remaining third photosensitive layer 56c is removed by using the foregoing alkaline solution, thus exposing the patterned first covering conductive layer 54a. The above also removes the remaining fourth photosensitive layer 56d, thus exposing the patterned second covering conductive layer 54b.

The exposed first covering conductive layer 54a has a predetermined pattern and forms the first lead-out conductor 43. The first terminal portion 42 of the first transparent electrical conductor 40 including the first transparent conductive layer 52a is formed between the formed first lead-out conductor 43 and the base film 32. As described above and as shown in FIG. 3B, the thus-formed first lead-out conductor 43 is positioned on the first terminal portion 42 spacedly from the base film 32. Thus, the first terminal portion 42 is exposed in a lateral direction between the first lead-out conductor 43 and the base film 32.

Likewise, the exposed second covering conductive layer 54b has a predetermined pattern and forms the second lead-out conductor 48. The second terminal portion 47 of the second transparent electrical conductor 45 including the second transparent conductive layer 52b is formed between the formed second lead-out conductor 48 and the base film 32. The thus-formed second lead-out conductor 48 is positioned on the second terminal portion 47 spacedly from the base film 32. Thus, the second terminal portion 47 is exposed in a lateral direction between the second lead-out conductor 48 and the base film 32. That is, alignment marks and product information in the present embodiment, as with the lead-out conductors 43, 48, are formed on a two-layer film obtained by laminating the transparent conductive layers 52a, 52b and the covering conductive layers 54a, 54b on the respective surfaces 32a, 32b of the base film 32. Additionally, the alignment marks and product information in the present embodiment, as with the lead-out conductors 43, 48, can be formed on both surfaces 32a and 32b of the base film 32. The product information includes at least one of a product name, a lot number, a manufacturing date, and product grade, thus enabling confirmation of the product information after individual-piece cutting and mounting in the touchscreen panel device. Furthermore, machine-readable information such as bar codes is formed, which in turn enables product management/control during post-processing such as mounting in the touchscreen panel device.

Figure 14:
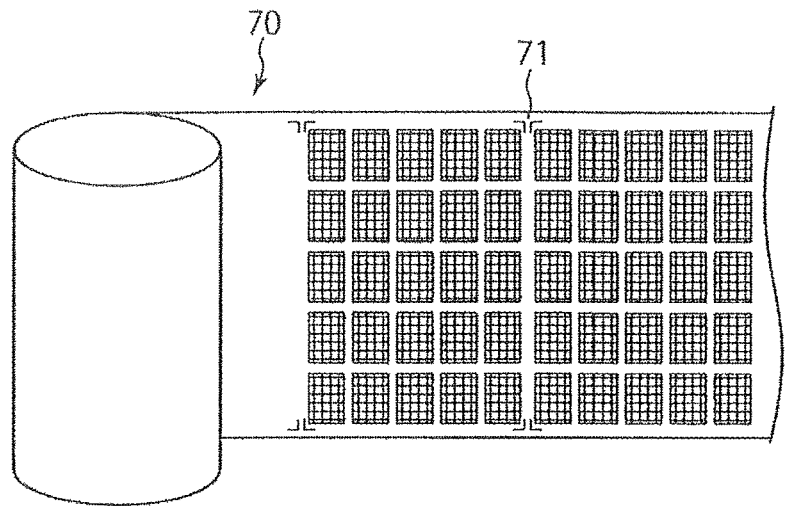
FIG. 14 is an overall view of a sensor film for the touchscreen panel sensor of the present invention.
Figure 15:
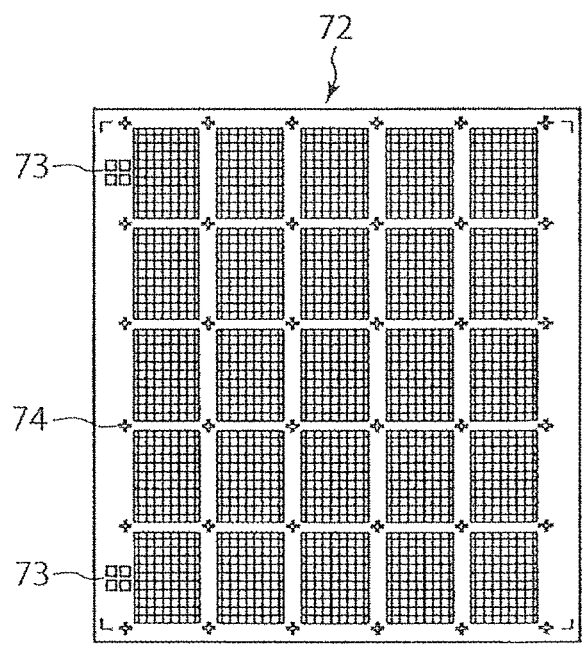
FIG. 15 is a view of the touchscreen panel sensor film obtained after sheet cutting of the sensor film in the present invention.
Figure 16:
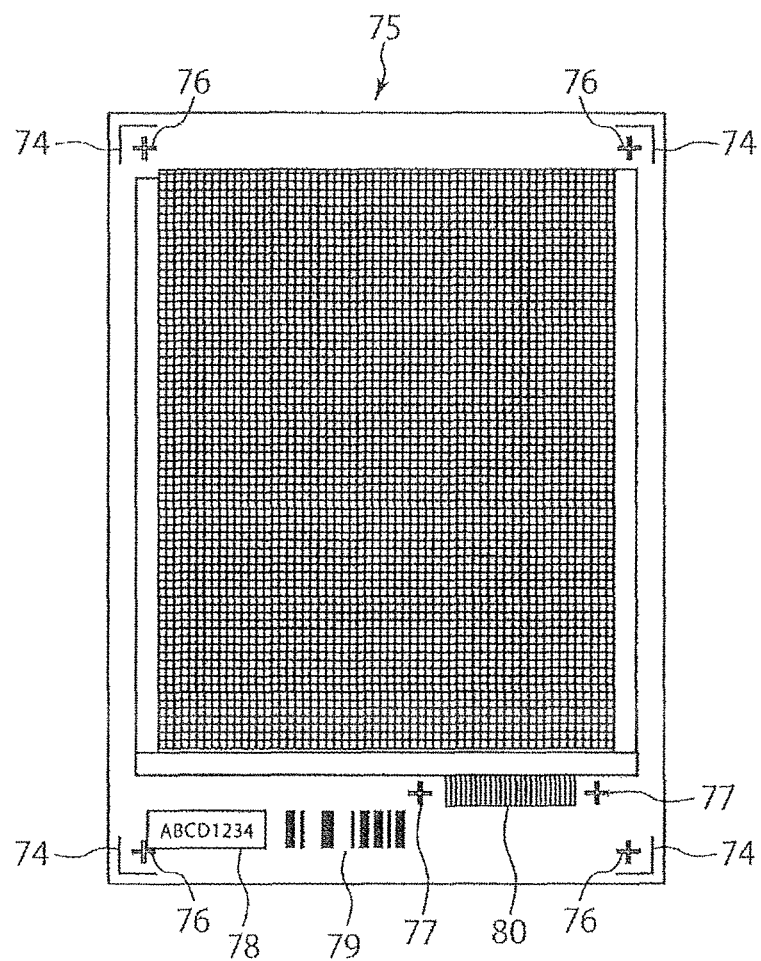
FIG. 16 is a view of a unit pattern of the touchscreen panel sensor fabricated on the sensor film for the touchscreen panel sensor of the present invention.

An embodiment of a touchscreen panel sensor film having the alignment marks and product information according to the present invention is shown in FIGS. 14, 15, 16. As shown in FIGS. 14, 15, 16, the alignment marks 71, 73, 74, 76, 77 and the product information including product information 78 and a bar code 79 are formed in the non-active area Aa2 (see FIGS. 1 and 3A) other than the active area Aa1 on which a contact position (or approach position) of the touchscreen panel sensor film can be detected. FIG. 14 is a schematic view of the touchscreen panel sensor film 70 formed on a web. Alignment marks 71 for sheet cutting a predetermined number of sets of unit patterns formed by step-and-repeat imposition are formed on the sensor film. The unit patterns here are each for forming an independent, touchscreen panel sensor piece 75 shown in FIG. 16. The predetermined number of sets of unit patterns formed by step-and-repeat imposition are each for cutting any one of the sets of unit patterns out from the web on which the touchscreen panel sensor shown in FIG. 15 is formed. FIG. 15 shows the predetermined number of sets of unit patterns formed by step-and-repeat imposition, each set being formed in a format of five lines, five columns. FIG. 15 is a schematic view of a touchscreen panel sensor film sheet 72 obtained after sheet cutting of the sensor film for the touchscreen panel sensor according to the present invention. Alignment marks 73, 74 for individual-piece cutting or creating precut individual pieces are formed on the sheet. FIG. 16 shows a touchscreen panel sensor unit pattern (touchscreen panel sensor piece) 75 fabricated on the sensor film for the touchscreen panel sensor according to the present invention. Alignment marks 76 for position matching to the touchscreen panel device, alignment marks 77 for FPC attaching, and product information that includes product information 78 and a bar code 79, are formed in the unit pattern. Shapes and positions of the alignment marks 71, 73, 74, 76, 77 are not limited to the shapes and positions shown in the figures, and actual shapes and positions of these alignment marks can each be any shape and position, provided that they enable position matching. The product information including the bar code can be of any form of information, such as a two-dimensional bar code or other machine-readable information. The alignment marks 71, 73, 74, 76, 77 and the product information 78, 79 are formed in the same step as used for the lead-out conductors 43, 48. The alignment marks 71 for sheet cutting, the alignment marks for creating precut sensor pieces 75, the alignment marks 73, 74 for punching-through, the alignment marks 77 for FPC attaching, or the alignment marks 76 for position matching to the sensor device can be fabricated while the positions of these kinds of alignment marks relative to the sensor portions and the electrical lines are being kept undisturbed. Referring to the product information, its relationship in position is particularly important when the information is read by a machine, and the product information can be created while the position of the product information in the sensor piece is being set very accurately.

The touchscreen panel sensor 30 of the foregoing construction with the alignment marks 71, 73, 74, 76, 77 or the product information 78, 79, can be obtained in the above manner. The alignment marks 71, 73, 74, 76, 77 are formed for predetermined respective purposes, which include sheet cutting, individual-piece cutting, individual-piece punching-through, FPC attaching, and position matching to the display panel. The sheet-cutting alignment marks here refer to alignment marks for matching positions when a unit pattern set 72 (see FIG. 15) that is one of the predetermined number of sets of unit patterns formed by step-and-repeat imposition is to be cut for extraction from the touchscreen panel sensor film 70 (see FIG. 14) formed on the web. The alignment marks for creating precut sensor pieces 75 and for individual-piece punching-through refer to those used to match positions when the touchscreen panel sensor piece 75 is to be cut or punched through for extraction from the unit pattern set 72 (see FIG. 15), of the predetermined number of sets of unit patterns formed by step-and-repeat imposition. The alignment marks for FPC attaching refer to those used to match positions when an end of the lead-out lines, that is closer to that of an FPC substrate, is to be connected to the substrate. The alignment marks for position matching to the display panel refer to those used to match positions when the touchscreen panel sensor piece 75 is to be disposed on or attached to the display surface of the display device. Each kind of alignment mark may be formed so as to fulfill one purpose of use. For example, each kind of alignment mark can be formed so as to fulfill one purpose as a special kind for sheet cutting, as a special kind for individual-piece cutting, or as a special kind for FPC attaching. For further reduction in the surface area of the non-active area of the sensor film, one kind of alignment mark may be formed so as to fulfill a plurality of purposes (i.e., for at least two purposes). For example, the alignment marks 74 for individual-piece cutting, and the alignment marks 76 for position matching to the display panel may be used in common. Alternately, one of the alignment marks 77 for FPC attaching, and one of the alignment marks 76 for position matching to the display panel may be shared for one purpose. An alignment mark for one of the above-described several purposes, and an alignment mark for a plurality of purposes (at least two purposes) can also be formed.

The alignment marks 71, 73, 74, 76, 77 or product information 78, 79 in the present invention can be created in the same steps as those of forming the covering conductive layers, without providing a new step. Accordingly, the creation of the alignment marks 71, 73, 74, 76, 77 or product information 78, 79 in the present invention makes the alignment marks 71, 73, 74, 76, 77 or the product information 78, 79 exactly follow the pattern for exposing the photosensitive layers to light, thus the positions of the alignment marks or product information relative to the touchscreen panel sensor region are kept uniform, and the required position accuracy can be obtained.

Such improvement of the alignment marks 71, 73, 74, 76, 77 and product information 78, 79 in position accuracy leads to improvement of processing accuracy in the post-processing steps such as sheet cutting, individual-piece cutting, individual-piece punching-through, and FPC attaching, and hence to improvement of machine-reading accuracy of the product information 78, 79, especially the bar code information 79.

Since the alignment marks 71, 73, 74, 76, 77 or product information 78, 79 in the present invention is created in the same steps as those of forming the covering conductive layers, the position accuracy of the alignment marks or product information is substantially of the same level as an accuracy level of the mask patterns for exposing the photosensitive layers to light. If the alignment marks 71, 73, 74, 76, 77 are created using the screen-printing process discussed earlier herein, this makes it difficult to obtain sufficient positioning accuracy of the alignment marks. The reason for this is that expansion and contraction of a printing plate used for screen printing are likely to reduce the accuracy of the alignment marks (at least several micrometers) and accuracy of line width (several micrometers to several tens of micrometers), and to limit maximum achievable line thickness to nearly 30 micrometers. In addition, maximum accuracy obtainable by film edge position matching that uses no alignment marks is several micrometers.

If a web-like material taken up onto a roll is provided as a source material for either the base film 32, or the laminate 50, or an intermediate laminate (or the like) including the base film 32 and the first and second transparent conductive layers 52a, 52b, the web-like source material may be unwound and delivered from the roll and each step described above may be conducted upon the delivered source material. In this case, a large number of touchscreen panel sensors 30 will be formed in a state of interconnection via the base film 32. The thus-fabricated web-like touchscreen panel sensors 30 may then be each taken up onto a roll, with a protective slip sheet or interleaf placed between every two overlaps of the panel sensor to provide convenience/use in handling (transport, shipping, and the like). The touchscreen panel sensor 30 will, as required, be delivered from the roll, while at the same time, being cuttable into sheet form.

When the web-like touchscreen panel sensor 30 is to be taken up onto a roll, slip sheets or interleaves may be placed on both sides of the web-like touchscreen panel sensor 30. Alternatively, a slip sheet or an interleaf may be placed only on one side of the web-like touchscreen panel sensor 30.

In the manufacturing method described above, the first photosensitive layer 56a and the second photosensitive layer 56b are both exposed to light at the same time. In this double-side simultaneous exposure process, as shown in sectional view (a) of FIG. 5C, the first mask 58a and the second mask 58b can be positioned very accurately on the order of, for example, micrometers, and very easily (hence, rapidly), with respect to each other by providing the alignment mark 59a on each of the first mask 58a and the second mask 58b. This results in both of the first transparent electrical conductor 40 and second transparent electrical conductor 45 in the touchscreen panel sensor 30 becoming positioned very accurately and efficiently on the base film 32.

Meanwhile, independent, in case the first photosensitive layer 56a and the second photosensitive layer 56b are exposed to light sequentially, it does not allow accurate, easy fabrication of the first transparent electrical conductor 40 and the second transparent electrical conductor 45. To fabricate both of the first transparent electrical conductor 40 and the second transparent electrical conductor 45 accurately, it is necessary to form one of the first and second transparent electrical conductors 40, 45, together with alignment marks, on the base film 32, and then position the mask used to form the other of the first and transparent electrical conductors 40, 45, with respect to the alignment mark formed on the base film 32. This means that at least the exposure step and the developing step need to be executed independently for the first photosensitive layer 56a and the second photosensitive layer 56b. The first transparent electrical conductor 40 and the second transparent electrical conductor 45, therefore, cannot be formed efficiently, rapidly, or easily.

The first transparent electrical conductor 40 and the second transparent electrical conductor 45 can be exposed to light while, for example, positioning the first mask 58a and the second mask 58b using an end of the base film 32 as a reference, instead of using alignment marks. In this method, the exposure step and the developing step can be simultaneously executed for the first photosensitive layer 56a and the second photosensitive layer 56b. Positioning accuracy of the first transparent electrical conductor 40 and the second transparent electrical conductor 45, however, will depend upon profile accuracy of the base film 32. In general, the positioning accuracy of the first and second transparent electrical conductors 40, 45, obtainable by using this method, is on the order of several tens of micrometers at most.

For these reasons, the manufacturing method of the present embodiment that has been described above enables the first transparent electrical conductor 40 and the second transparent electrical conductor 45 to be positioned both easily and accurately with respect to each other. More specifically, in accordance with the present embodiment, in top view of the touchscreen panel sensor 30, that is, when the touchscreen panel sensor 30 is observed from its normal-line direction, a gap G (also called a pattern gap, refer to FIG. 3A) of mutually parallel outer profiles between the nearly square-shaped, bulged portion 41b of the first sensor portion 41 and the nearly square-shaped, bulged portion 46b of the second sensor portion 46, is stably controlled below 100 μm. In a conventional method for attaching two sheets of film together, on the other hand, the pattern gap G is as great as 200 μm or more. As a result, in the present embodiment, a relative rate of the region in which one of the first sensor portion 41 and the second sensor portion 46 is disposed when the touchscreen panel sensor 30 is observed from the normal-line direction, is increased to at least 95% of all regions of the active area Aa1 on which the contact position (or approach position) of the touchscreen panel sensor film can be detected.

In addition, the lead-out lines 37b include highly conductive lead-out conductors 43, 48 in addition to the terminal portions 42, 47 of the transparent electrical conductors 40, 45 of lower conductivity. This enables the line width of the lead-out lines 37b to be reduced and thus the arrangement space for the lead-out lines 37b, that is, the surface area of the non-active area Aa2, to be reduced.

Figure 11:
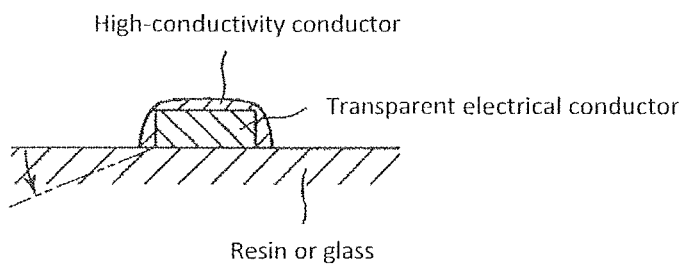
FIG. 11, which corresponds to FIG. 3B, is a sectional view showing a conventional touchscreen panel sensor.

In particular, in the above-described method, the lead-out conductors 43, 48 are only arranged on the terminal portions 42, 47 of the transparent electrical conductors 40, 45 and do not extend laterally beyond the terminal portions 42, 47 of the transparent electrical conductors 40, 45, as shown in FIG. 3B, and this can be implemented without special positioning. On the other hand, if the lead-out conductors 43, 48 of a highly conductive material are formed on the terminal portions 42, 47 of the transparent electrical conductors 40, 45 by, for example, screen printing that has traditionally been used very frequently, the transparent electrical conductors 40, 45 extend from lateral sides of the terminal portions 42, 47 to an upper surface of the base film 32, as shown in FIG. 11. Compared with these lead-out lines in the conventional technology, if the lead-out lines 37b in the present embodiment are formed using the same quantity of highly conductive material, the lead-out lines 37b are significantly narrowed down in line width while maintaining conductivity thereof at the same level.

In addition, the lead-out conductors 43, 48, as well as the terminal portions 42, 47 of the transparent electrical conductors 40, 45, in the present embodiment are formed by photolithography and can thus be formed to a desired shape at desired positions very accurately in comparison with those formed using the conventional method such as screen printing. Furthermore, in accordance with the present embodiment, unlike the conventional lead-out line shown in FIG. 11, the lead-out conductors 43, 48 of high conductivity are not arranged laterally over the terminal portions 42, 47 of the transparent electrical conductors 40, 45 and do not extend to the upper surface of the base film 32, so electromigration is less likely to happen. These characteristics enable significant reduction in the arrangement pitch of the lead-out lines 37b. Hence, the arrangement space for the lead-out lines 37b, that is, the surface area of the non-active area Aa2 can be reduced.

The manufacturing method of the present embodiment that has been described above makes it possible to prevent the terminal portions 42, 47 of the transparent electrical conductors 40, 45 from being covered from the respective lateral sides by the lead-out conductors 43, 48. In addition, the manufacturing method of the present embodiment makes it possible, as shown in FIG. 3B, to narrow the width of the lead-out conductors 43, 48 in comparison with that of the terminal portions 42, 47 of the transparent electrical conductors 40, 45, covered by the lead-out conductors 43, 48. That is, the lead-out conductors 43, 48 can be arranged only on the transparent electrical conductors 40, 45 when the lead-out conductors 43, 48 are observed from the normal-line direction of the film surface of the base film 32. In other words, the lead-out conductors 43, 48 can be arranged only in the region where the terminal portions 42, 47 of the transparent electrical conductors 40, 45 are arranged. In this construction, electrical continuity between the sensor electrode 37a and detection controller 25 is ensured more stably. Additionally, since electromigration is less likely to happen, the arrangement pitch of the lead-out lines 37b can be further reduced for even smaller surface area of the non-active area Aa2.

Next, it will be described why and how the width of the lead-out conductors 43, 48 of the lead-out lines 37b is estimated to narrow down relative to the width of the terminal portions 42, 47 of the transparent electrical conductors 40, 45, covered by the lead-out conductors 43, 48, when the lead-out lines 37b are formed using the inventive manufacturing method, referring primarily to FIG. 7. This mechanism, however, does not limit the present invention.

In the conventional method of fabricating the touchscreen panel sensor by attaching two sheets of film together, when terminal portions of transparent electrical conductors are formed on the films by photolithography, photosensitive layers will be arranged directly on transparent conductive layers that form the transparent electrical conductors. In accordance with the present embodiment, on the other hand, the covering conductive layers 54a, 54b are arranged on the transparent conductive layers 52a, 52b that form the transparent electrical conductors 40, 45. In general, photosensitive layers (resist layers) have a strong erosive property with respect to an etching solution (e.g., ferric chloride) used to etch transparent conductive layers. The covering conductive layers 54a, 54b formed from a metal or the like can be etched with a special etching solution for the transparent conductive layers 52a, 52b formed from ITO or the like.

Figure 7:
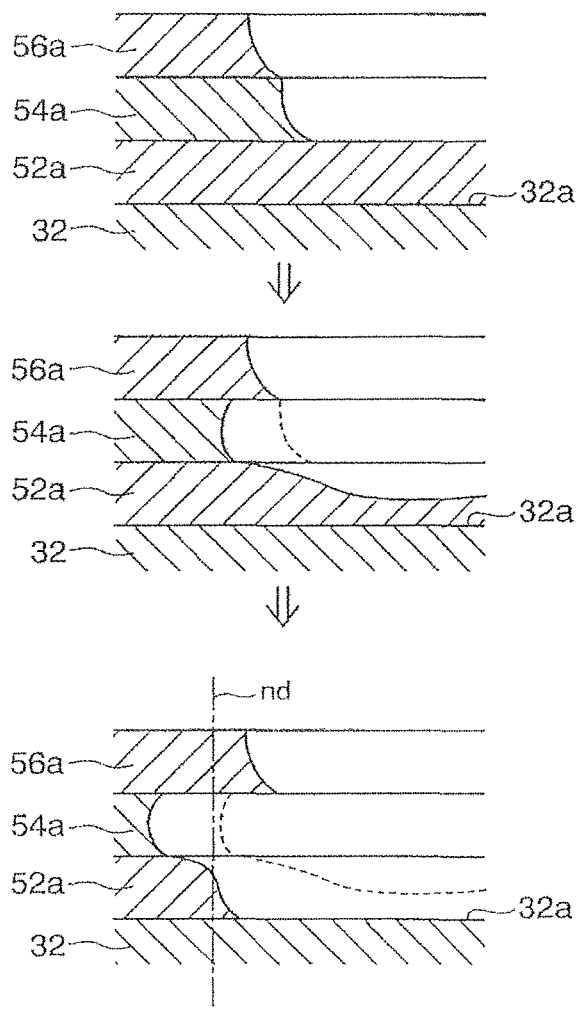
FIG. 7 is a diagram that illustrates progress of etching in a step shown in FIG. 5F.

As shown in FIG. 7, therefore, in step S6 of etching the transparent conductive layers 52a, 52b, when the transparent conductive layers 52a, 52b are etched in a longitudinal direction (the normal-line direction of the base film 32), the covering conductive layers 54a, 54b may be etched in a transverse direction (along the sheet surface of the base film 32) from lateral faces not covered by the photosensitive layers 56a, 56b. At the same time, since the photosensitive layers have a strong erosive property with respect to the etching solution used in step S6, the photosensitive layers are not etched widely in a transverse direction. For these reasons, in the touchscreen panel sensor 30 fabricated using the manufacturing method of the present embodiment, the width of the lead-out conductors 43, 48 can be narrowed down relative to the width of the terminal portions 42, 47 of the transparent electrical conductors 40, 45, covered by the lead-out conductors 43, 48.

Furthermore, the lead-out conductors 43, 48 are fabricated from the light-shielding layers (covering conductive layers) 54a, 54b used to prevent the exposure light patterns of the first photosensitive layer 56a and second photosensitive layer 56b from influencing each other when the first photosensitive layer 52a and the second photosensitive layer 52b are simultaneously exposed to light in different patterns. Alignment marks or product information is also created at the same time in the same step as that of the light-shielding layers (covering conductive layers) 54a, 54b. Material costs required for the fabrication of the touchscreen panel sensor 30 can be reduced by using such a method. Moreover, fabrication efficiency of the touchscreen panel sensor 30 can be effectively improved, which in turn further reduces the touchscreen panel sensor 30 in fabrication costs. Consequently, the excellent touchscreen panel sensor 30 (touchscreen panel device 20) can be fabricated with high production efficiency and at low manufacturing costs.

The touchscreen panel sensor 30 that has been obtained in the above way is bonded onto the display device 15 via the adhesive layer 19, and the protective cover 12 is bonded onto the touchscreen panel sensor 30 via the adhesive layer 14. The input/output device 10 shown in FIGS. 1 and 2 is thus obtained. Next, operation of the input/output device 10 existing when it is used will be described.

First, the input/output device 10 allows the observer to observe an image via the protective cover 12 and the touchscreen panel sensor 30 by displaying the image on the display panel 16 of the display device 15.

In addition, in the input/output device 10, the touchscreen panel sensor 30 and the protective cover 12 constitute a part of the touchscreen panel device 20. Thus, the contact (approach) of the external conductor 5 (typically, the human finger 5) on the protective cover 12, and the contact (approach) position of the external conductor 5 on the protective cover 12 can be detected.

More specifically, first upon the external conductor (e.g., the human finger) 5 touching the protective cover 12, the external conductor 5 and the conductors 41, 46, of the electrode regions 40, 45 positioned near the contact position of the external conductor 5 with respect to the protective cover 12 function as electrodes to form an electric field. At this time, in addition to the protective cover 12 positioned between the sensor portions 41, 46 of the transparent electrical conductors 40, 45 that constitute the sensor electrodes 37a, the base film 32 and the like function as a dielectric. This means that the contact of the external conductor 5 with the protective cover 12 forms a capacitor using the sensor portions 41, 46 and the external conductor 5 as electrodes.

The detection circuit of the detection controller 25 in the touchscreen panel device 20 is connected to the sensor portions 41, 46 and composed to detect capacitance existing between the sensor portions 41, 46 and the external conductor 5. By detecting a change in the capacitance between the sensor portions 41, 46 and the external conductor 5, the detection controller 25 identifies which of the first sensor portions 41 the external conductor 5 faces and which of the second sensor portions 46 the external conductor 5 faces.

That is, by identifying the first sensor portion (linear conductor) facing the external conductor 5, of the first sensor portions 41 in the first transparent electrical conductor 40 that are linearly arrayed in the foregoing direction on the active area Aa1, the detection circuit of the detection controller 25 identifies a position of the external conductor 5 on a coordinate axis extending in the foregoing direction. Similarly, by identifying the second sensor portion (linear conductor) facing the external conductor 5, of the second sensor portions 46 in the second transparent electrical conductor 45 that are linearly arrayed in the other direction on the active area Aa1, the detection circuit of the detection controller 25 identifies a position of the external conductor 5 on a coordinate axis extending in the other direction. Since the contact position of the external conductor 5 relative to that of the touchscreen panel device 20 (protective cover 12) is thus detected in the two different directions, position coordinates of the external conductor 5 in contact with the surface of the touchscreen panel device 20 are accurately identified on the surface of touchscreen panel device 20. Various documents disclose a variety of methods (principles) of detecting a contact position in touchscreen panels of the projected-type capacitive-coupling scheme, and further detailed description of these methods (principles) is omitted herein.

In the touchscreen panel sensor 30 fabricated using the manufacturing method according to the present embodiment, each sensor electrode 37a and lead-out line 37b are formed on both sides of the base film 32 existing as a single entity. That is, a bonded structure or the like including a plurality of films bonded via an adhesive agent or the like is not used as a base film. The result is that the touchscreen panel sensor 30 on the whole improves in light-transmitting coefficient. The number of interfaces capable of reflecting illumination or other environmental light (external light), image light, and other light, is also reduced, which in turn suppresses the reflection of the environmental light and improves contrast of the image displayed on the display device 15. In addition, these characteristics prevent the display image of the display device 15 from significantly deteriorating when the touchscreen panel sensor 30 is disposed on the display surface 16 of the display device 15. Furthermore, the above reduces overall thickness of the touchscreen panel sensor 30 and the input/output device 10.

The highly accurate positioning of the alignment marks 71, 73, 74, 76, 77 or product information 78, 79 according to the present embodiment improves processing accuracy in the post-processing steps such as sheet cutting, individual-piece cutting, individual-piece punching-through, and FPC attaching, and hence improves machine-reading accuracy of the product information 78, 79, particularly of the bar code information 79.

Additionally, as shown in FIG. 2, the first sensor portions 41 of the first transparent electrical conductor 40 and second sensor portions 46 of the second transparent electrical conductor 45 constitute the sensor electrodes 37a, and the first and second portions 41, 46 are arranged at different positions along the normal-line direction of the touchscreen panel sensor 30 (protective cover 12). More specifically, the second sensor portions 46 of the second transparent electrical conductor 45 are arranged at positions spaced for the thickness of the base film 32 from the protective cover 12, relative to the first sensor portions 41 of the first transparent electrical conductor 40. However, as described above, the base film 32 in the present embodiment is constructed as a film of a single entity. Additionally, the base film 32, as opposed to the base film disclosed in Patent Document 2 (JP 1992-264613A), is not required to have a special function such as shielding far-ultraviolet light. Briefly, the base film 32 is constructible from a thin film of a single entity. When the external conductor 5 comes into contact with the protective cover 12, therefore, a capacitor can be stably formed between the external conductor 5 and the second sensor portions 46 of the second transparent electrical conductor 45. Thus, the contact position (touch position) of the external conductor 5 with respect to the protective cover 12 can be detected accurately with extremely high sensitivity via not only the first sensor portions 41 of the first transparent electrical conductor 40, but also the second sensor portions 46 of the second transparent electrical conductor 45.

In addition, in accordance with the present embodiment, as shown in FIGS. 3A and 3B, the first sensor portions 41 of the first transparent electrical conductor 40 each have a linear portion 41a and a bulged portion 41b, and the second sensor portions 46 of the second transparent electrical conductor 45 each have a linear portion 46a and a bulged portion 46b. In the sensor portions 41, 46, width of each of the bulged portions 41b, 46b is very great, compared with that of each of the linear portions 41a, 46a. As described above, the bulged portion 41b of the first sensor portion 41, included in the first transparent electrical conductor 40, and the bulged portion 46b of the second sensor portion 46, included in the second transparent electrical conductor 45, are arranged so as not to overlap when observed from the normal-line direction of the film surface of the base film 32. This prevents the first sensor portion 41 of the first transparent electrical conductor 40 from intervening between the external conductor 5 and the second sensor portion 46 of the second transparent electrical conductor 45, in a surface area too wide to be likely to influence detection accuracy of the contact position. This arrangement, in turn, prevents the capacitor from failing to be effectively formed between the external conductor 5 and the second sensor portion 46 of the second transparent electrical conductor 45.

Furthermore, as described above, the display controller 17 of the display device 15 and the detection controller 25 of the touchscreen panel device 20 are connected to each other. The detection controller 25 transmits, to the display controller 17, information that will be input when the external conductor 5 touches a predetermined position on the protective cover 12. Based on the input information read by the detection controller 25, the display controller 17 can display an appropriate image according to the input information, on the display panel 16 of the display device 15. In other words, a display function as output means, and a touch position detection function as input means allow direct exchanging of information in an interactive format between the input/output device 10 and a user (operator) thereof. For example, the above allow the user to assign instructions to the display device 10 and the display device 10 to execute the instructions.

As described above, when the first transparent electrical conductor 40 and the second transparent electrical conductor 45 are patterned on the base film 32 through double-side simultaneous exposure process step S3 for the photosensitive layers 56a, 56b, the first and second sensor portions 41, 46 that constitute the sensor electrodes 37a are positioned accurately with respect to each other. Consequently, each first sensor portion 41 of the first transparent electrical conductor 40 and each second sensor portion 46 of the second transparent electrical conductor 45 are both positioned accurately with respect to the display device 15. In this case, the contact position of the external conductor 5 with respect to the protective cover 12 is detected accurately with the display device 15 as a reference. The result is that the input appropriate for the image information displayed on the display device 15 is detected at high resolution and very accurately, whereby the interactive information exchange between the input/output device 10 and the user (operator) thereof makes very smooth progress.

In accordance with the present embodiment as described above, the covering conductive layers 54a, 54b disposed on and patterned with the transparent conductive layers 52a, 52b are used as part of the lead-out lines 37b. More specifically, the lead-out conductors 43, 48 is formed from the covering conductive layers 54a, 54b each patterned to have the same pattern as that of the transparent conductive layers 52a, 52b and then each having a portion of the covering conductive layer removed. The lead-out conductors 43, 48 form the lead-out lines 37b by working together with the transparent electrical conductors 40, 45 formed from the patterned transparent conductive layers 52a, 52b.

The lead-out lines 37b that have been fabricated using this method ensure high electrical conductivity via the lead-out conductors 43, 48. In addition, unlike the conventional lead-out line (see FIG. 11) fabricated by screen printing or the like, the lead-out conductors 43, 48 are arranged on the transparent conductive layers 52a, 52b and do not extend to lateral portions thereof. This significantly reduces the line width of the lead-out lines 37b. Furthermore, in the above embodiment, as opposed to the conventional fabrication method such as screen printing, the lead-out conductors 43, 48 are formed using photolithography, so that the lead-out lines 37b of the desired pattern are fabricated stably and with high accuracy. Thus, electromigration is less likely to happen. For these reasons, in the present embodiment, the lead-out lines 37b can be formed side by side at short pitches, and these characteristics enable significant reduction in the surface area required for the arrangement of the lead-out lines 37b, that is, the surface area of the non-active area Aa2.

The lead-out conductors 43, 48 are out of contact with the base film 32 capable of exhibiting low adhesive strength only, and are only bonded onto the transparent electrical conductors 40, 45 capable of exhibiting high adhesive strength. Accordingly, even if the touchscreen panel sensor 30 becomes deformed during use, the point at which the lead-out conductors 43, 48 might start peeling off from the touchscreen panel sensor 30 is made less prone to formation. In addition, the terminal portions 42, 47 of the transparent electrical conductors 40, 45 are not covered on respective lateral faces due to the lead-out conductors 43, 48 and are exposed in a lateral direction between the base film 32 and the lead-out conductors 43, 48. Rather, restraint of the lead-out conductors 43, 48 upon deformation of the terminal portions 42, 47 is weak, and in case of the touchscreen panel sensor 30 becoming deformed, the deformation of the terminal portions 42, 47 can occur following that of the base film 32. These factors effectively suppress peeling-off of the lead-out conductors 43, 48 from the transparent electrical conductors 40, 45 or the base film 32, and that of the terminal portions 42, 47, along with the lead-out conductors 43, 48, from the base film 32. This remarkably improves the detection function of the touchscreen panel sensor 30.

Additionally, the covering conductive layers 54a, 54b used for the formation of the lead-out conductors 43, 48 are used as light-shielding layers in double-side simultaneous exposure step S3. Use of such a fabrication method enables very effective and inexpensive fabrication of the touchscreen panel sensor 30 having excellent performance as described above. Creating alignment marks or product information in the same step as that of the lead-out conductors 43, 48 makes the alignment marks 71, 73, 74, 76, 77 or the product information 78, 79 exactly follow the pattern for exposing the photosensitive layers to light. Thus, the positions of the alignment marks or product information relative to the touchscreen panel sensor region are kept uniform, and the position accuracy required can be obtained. The alignment marks 71 for cutting the web 70 into sheets 72, the alignment marks 73, 74 for cutting or punching individual sensor pieces 75, the alignment marks 76 for position matching to the sensor device, and the alignment marks 77 for attaching to an FPC substrate are created while respective positions relative to the sensor region are being kept undisturbed. Most important about the product information is its relationship in position during machine reading, in particular, and the position of this information in one sensor piece is kept highly accurate during creation.

Various changes may be introduced in the above embodiment. An example of its modification is described below.

In the above embodiment, there has been described an example in which a region including both the active area Aa1 of the covering conductive layers 54a, 54b and a surrounding area neighboring the active area Aa1 is removed in the step of removing a portion of the patterned covering conductive layers 54a, 54b. However, this example does not limit the portion removed. In perspective of removing a portion of the light-shielding covering conductive layers 54a, 54b to ensure transparency of the active area Aa1, only a region inside the active area Aa1 may be removed. In such an example as this, the conductivity of the lead-out lines 37b can be enhanced by expanding the arrangement region of the lead-out conductors 43, 48 while ensuring transparency of the touchscreen panel sensor 30, at the active area Aa1. The above embodiment is however superior to this example in terms of rendering exposure accuracy and developing accuracy of the third and fourth photosensitive layers 56c, 56d permissible to improve reliability of the touchscreen panel sensor 30. Naturally, if the portion of the covering conductive layers 54a, 54b that is to be removed is changed, a pattern of a transmission region of the third mask 58c and the fourth mask 58d needs to be changed.

Figure 8A:
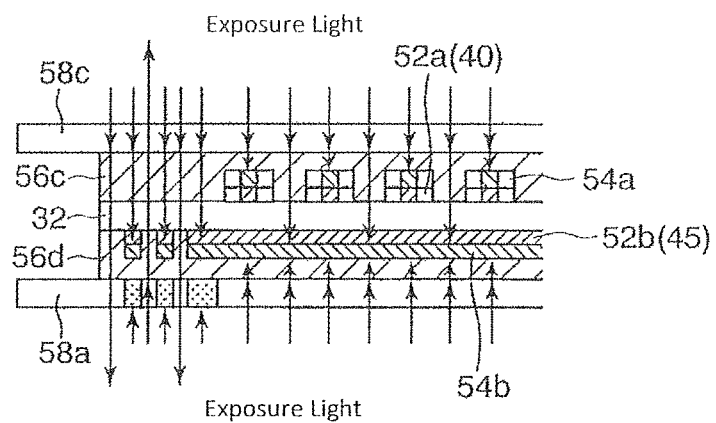
FIG. 8A, which corresponds to FIG. 5I(a), illustrates a modification of the method for manufacturing the touchscreen panel sensor.
Figure 8B:
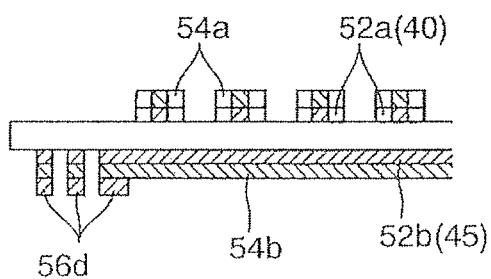
FIG. 8B, which corresponds to FIG. 5J(a), illustrates a modification of the method for manufacturing the touchscreen panel sensor.

Additionally, in the step of developing and patterning the other photosensitive layers 56c, 56d, patterning the third and fourth photosensitive layers 56c, 56d into the form of a frame or bezel region surrounding the active area Aa1 from all four directions or sides has been described as an example, but this example does not limit the present invention. For instance, both exposure (see FIG. 8A) and development (see FIG. 8B) of the third and fourth photosensitive layers 56c, 56d may take place in a pattern corresponding to a pattern to be left on the transparent conductive layers 52a, 52b (transparent electrical conductors 40, 45). As shown in FIG. 8A, even in this example of modification, the covering conductive layers 54a, 54b having a light-shielding property block the light emitted in a predetermined pattern from a different side of the exposure light source, thereby enabling highly accurate double-side simultaneous exposure of the third photosensitive layer 56c and the fourth photosensitive layer 56d in different patterns. The above embodiment is however superior to this modification, in terms of rendering variations in the exposure accuracy and developing accuracy of the third and fourth photosensitive layers 56c, 56d permissible to improve reliability of the touchscreen panel sensor 30. In the modifications that FIGS. 8A and 8B show, other constituent elements may be constructed similarly to those of the embodiment. Referring to FIGS. 8A and 8B, elements that may be constructed substantially the same as those of the embodiment are each assigned the same reference number and overlapping description is omitted.

Furthermore, an example of a manufacturing method for the touchscreen panel sensor 30 has been described in the above embodiment, but the manufacturing method is not limited to this example. For instance, the step of annealing the transparent conductive layers 52a, 52b to accelerate crystallization (microcrystallization) thereof may be provided midway.

During film deposition by sputtering or the like, the transparent conductive layers formed from ITO or the like usually have their deposition temperatures controlled as appropriate, for accelerated crystallization. In general, the crystallization of the transparent conductive layers 52a, 52b included in the laminate (blanks) for fabricating the touchscreen panel sensor 30 is already accelerated and has appropriate resistance to chemicals. At the same time, however, the crystallization (also, called microcrystallization) of the transparent conductive layers is likewise possible by depositing these transparent conductive layers in an amorphous condition and after the deposition, annealing them at a temperature nearly of 140° C.

The step of annealing the transparent conductive layers 52a, 52b preferably follows their patterning step S6, while at the same time, preceding step S11 of removing a portion of the patterned covering conductive layers 54a, 54b. For example, the annealing step is preferably executed between step S10 of developing the third and fourth photosensitive layers 58c, 58d and step S11 of removing a portion of the patterned covering conductive layers 54a, 54b. For example, if the chemical resistance of the covering conductive layers 54a, 54b is weak and the covering conductive layers 54a, 54b that were patterned in step S6 of patterning the conductive layers 54a, 54b are likely to be etched, it is effective that the annealing step is added.

To be more specific, in step S6 of patterning the transparent conductive layers 52a, 52b, amorphous transparent conductive layers 52a, 52b of low chemical resistance are etched with an etching solution having a weak erosive property, for example, oxalic acid. If the etching solution having a weak erosive property is used, the covering conductive layers 54a, 54b formed from a material (e.g., silver) having a weak erosive property are prevented from eroding in a transverse direction (i.e., along the sheet surface of the base film 32) between the transparent conductive layers 52a, 52b and the photosensitive layers 56a, 56b. Accordingly, highly accurate patterning of the transparent conductive layers 52a, 52b is accomplished. In addition, prior to step S11 of removing a portion of the covering conductive layers 54a, 54b, annealing the transparent conductive layers 52a, 52b to enhance chemical resistance effectively prevents damage of the pattern of the transparent conductive layers 52a, 52b patterned to the desired shape, during the partial removal of the covering conductive layers 54a, 54b.

Figure 9:
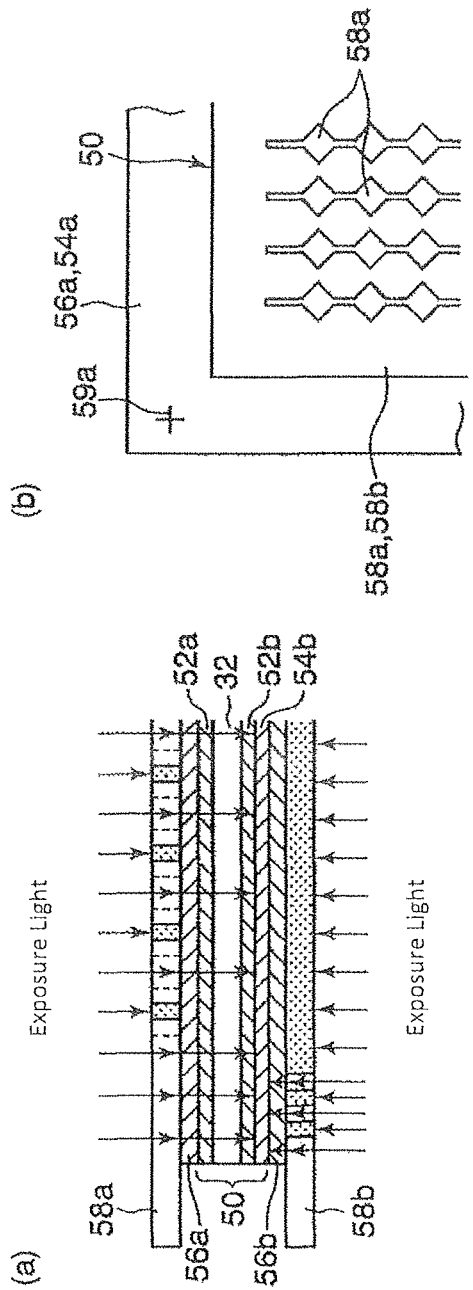
FIGS. 9(a) and 9(b), which correspond to FIGS. 5C(a) and 5C(b), respectively, illustrate another modification of the method for manufacturing the touchscreen panel sensor.

Moreover, in the above-described embodiment, there has been shown and described an example in which the first covering conductive layer 54a is formed on the first transparent conductive layer 52a and the second covering conductive layer 54b on the second transparent conductive layer 52b, in the laminate (blanks) 50 as the source material used for manufacturing the touchscreen panel sensor 30. However, the form of deposition is not limited to this example. For example, one covering conductive layer may be formed only upon one of the first transparent conductive layer 52a and the second transparent conductive layer 52b. The first covering conductive layer 54a is omitted in the examples that sectional view (a) and top view (b) of FIG. 9 show. That is, the laminate (blanks) 50 as the source material, includes the base film 32, the first and second transparent electrical conductor layers 52a, 52b arranged on the base film 32, and the second covering conductive layer 54b disposed on the second transparent electrical conductor layer 52b. Sectional view (a) and top view (b) of FIG. 9 are keyed to sectional view (a) and top view (b) of FIG. 5C, respectively, and show step S3 of conducting double-side simultaneous exposure upon the first photosensitive layer 56a disposed on the first transparent electrical conductor layer 52a and the second photosensitive layer 56b disposed on the second covering conductive layer 54b. As shown in sectional view (a) of FIG. 9, the exposure light used for exposing the first photosensitive layer 56a thereto in the predetermined pattern is blocked by the second covering conductive layer 54b and not emitted towards the second photosensitive layer 56b. Further, the exposure light used for expose the second photosensitive layer 56b thereto in the predetermined pattern is blocked by the second covering conductive layer 54b and not emitted towards the first photosensitive layer 56a. As in the embodiment, therefore, the covering conductive layers 54a, 54b undergo highly accurate double-side simultaneous exposure in different patterns. Substantially the same transparent electrical conductors 40, 45 and second lead-out conductors as formed in the embodiment can also be obtained. Since the covering conductive layer 54b is not formed on the first transparent conductive layer 52a, the first lead-out conductor 43 is not formed on the first transparent electrical conductor 40.

Furthermore, in the above-described embodiment, there has been shown and described an example of providing the transparent conductive layers 52a, 52b and the covering conductive layers 54a, 54b on each side of the base film 32 in the laminate (blanks) 50. However, the form of layering is not limited to this example. The transparent conductive layers and the covering conductive layers may be provided only on one surface of the base film 32. In this case, the lead-out lines 37b in the embodiment can be obtained on one surface of the base film 32. In this modification, exposure light can be emitted only from one side of the laminate 50 in step S3 of exposing the photosensitive layers to the light. Additionally in this modification, the covering conductive layers can be formable from a material not having a light-shielding property.

Furthermore, in the above-described embodiment, there has been shown and described an example in which the first sensor portions 41 of the first transparent electrical conductor 40 each include a linear portion 41a and a bulged portion 41b and the second sensor portions 46 of the second transparent electrical conductor 45 each include a linear portion 46a and a bulged portion 46b. In addition, an example of forming the bulged portions 41b, 46b into a nearly square shape in plan view has been shown and described in the embodiment. These examples, however, are not restrictive and the bulged portions 41b, 46b in plan view may, by way of example, have a rectangular shape other than a square, such as a rhombus, or even have a shape of a polygon, a circle, or the like. In addition, the sensor portions 41, 46 may include a linear profile, instead of including the bulged portions 41b, 46b.

Figure 10:
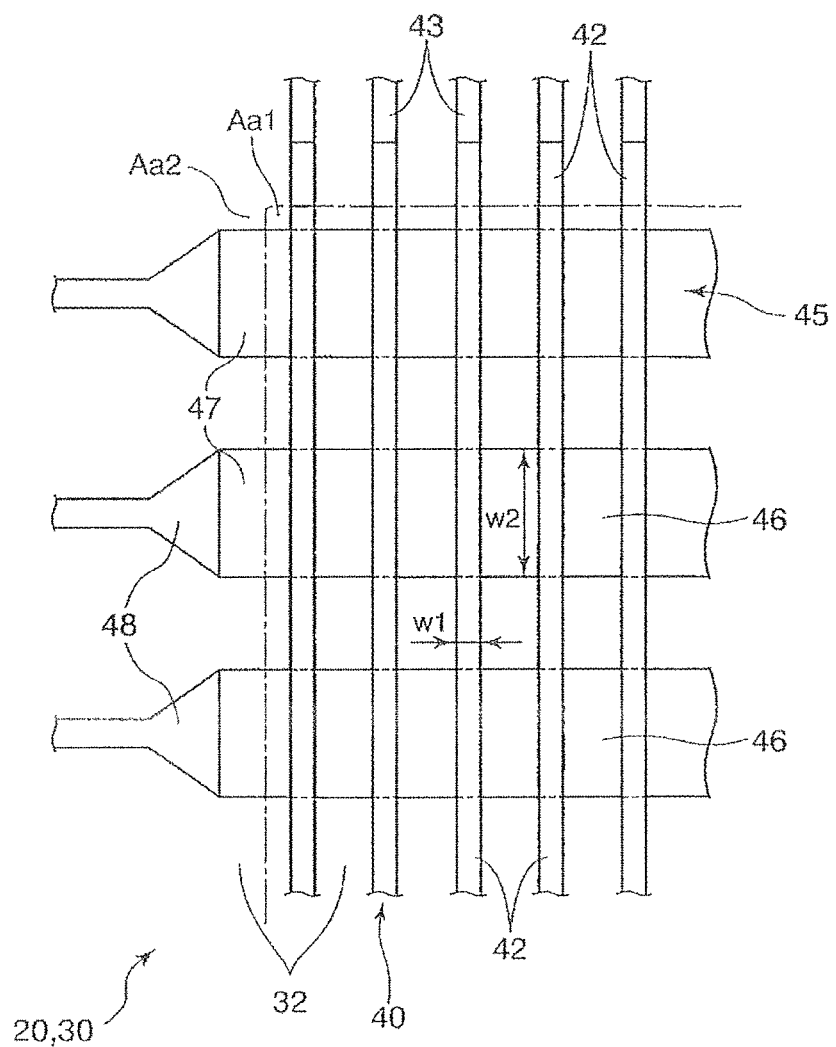
FIG. 10, which corresponds to FIG. 3A, illustrates a modification of a transparent electrical conductor.

Furthermore, in the above-described embodiment, there has been shown and described an example in which the first sensor portions 41 of the first transparent electrical conductor 40 and the second sensor portions 46 of the second transparent electrical conductor 45 are constructed to have the same geometry. However, this example is not restrictive. For instance, as shown in FIG. 10, the second sensor portions 46 of the second transparent electrical conductor 45 may have line width w2 greater than the line width w1 of the first sensor portions 41 of the first transparent electrical conductor 40 closer to the protective cover 12 (observer's side). In this example of modification, when the external conductor 5 comes into contact with the protective cover 12, a capacitor can be stably formed between the external conductor 5 and the second sensor portions 46 of the second transparent electrical conductor 45 relatively farther from the protective cover 12 (observer's side). In addition, the capacitance of the capacitor formed between the second sensor portions 46 of the second transparent electrical conductor 45 and the external conductor 5 coming into contact with the protective cover 12 can be prevented from decreasing in comparison with the capacitance of a capacitor formed between the first sensor portions 41 of the first transparent electrical conductor 40 and the external conductor 5 coming into contact with the protective cover 12. This enables highly sensitive and accurate detection of the contact position (touch position) of the external conductor 5 with respect to the protective cover 12, by the second sensor portions 46 of the second transparent electrical conductor 45 as well as the first sensor portions 41 of the first transparent electrical conductor 40. In the modification of FIG. 10, other constituent elements can be constructed similarly to those of the embodiment. The elements in FIG. 10 that would be constructible to have substantially the same geometry are each assigned the same reference number and overlapping description of these elements is omitted herein.

While several modifications of the embodiment have been described above, a plurality of these modifications can obviously be applied in combination as appropriate.

Second Embodiment

Figure 12:
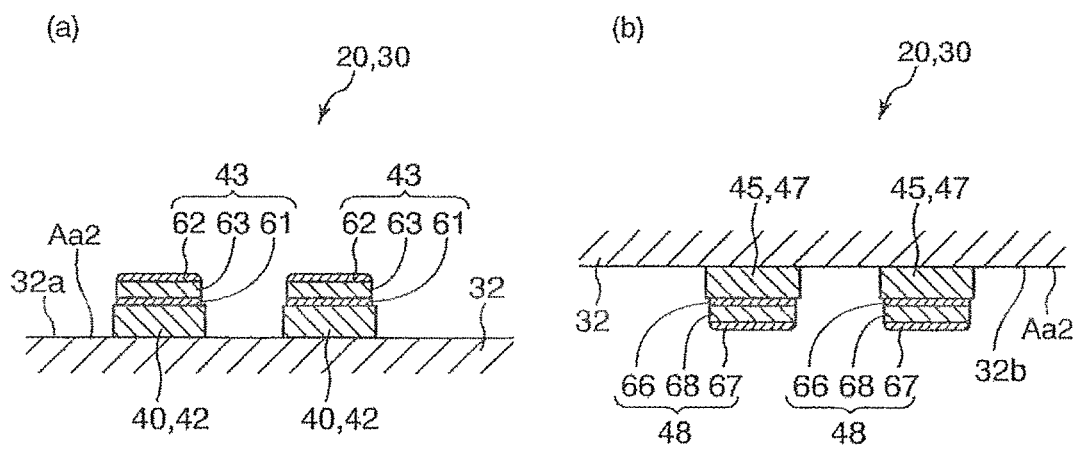
FIG. 12(a), which also corresponds to FIG. 3B in the first embodiment, is a sectional view showing a first electrical lead-out conductor in a second embodiment of the present invention.
FIG. 12(b) is a sectional view showing a second electrical lead-out conductor in the second embodiment of the present invention.
Figure 13:
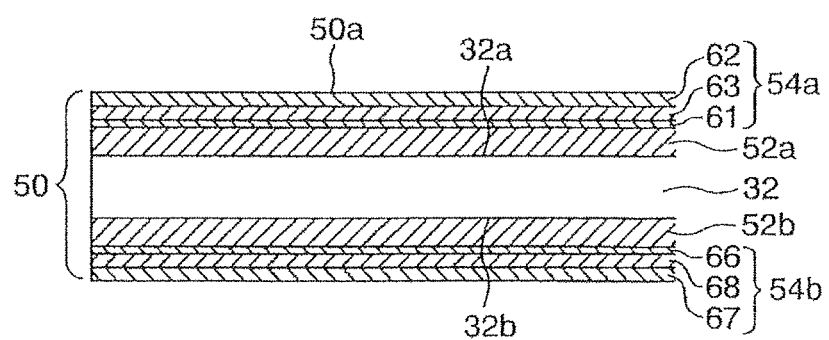
FIG. 13 is a sectional view showing a laminate in the second embodiment of the present invention.

A second embodiment of the present invention is described below referring to FIGS. 12(a), 12(b) and 13. FIG. 12(a), which corresponds to FIG. 3B in the first embodiment, is a sectional view showing first electrical lead-out conductors provided in the second embodiment of the present invention, and FIG. 12(b) is a sectional view showing second electrical lead-out conductors provided in the second embodiment of the present invention. FIG. 13 is a sectional view showing a laminate provided in the second embodiment of the present invention.

The second embodiment shown in FIGS. 12(a), 12(b), and 13 differs from the first embodiment only in that: each lead-out conductor includes an intermediate layer provided on a portion of a transparent electrical conductor spacedly from a base film, and a highly conductive layer provided on the intermediate layer; the highly conductive layer is formed from a material whose conductivity is greater than that of materials forming the transparent electrical conductor and the intermediate layer, and the intermediate layer is formed from a material having great adhesive strength with respect to the transparent electrical conductor; and thickness of the intermediate layer is smaller than that of the highly conductive layer. Other structural factors are substantially the same as those of the first embodiment shown in FIGS. 1 to 10. More specifically, surfaces 32a and 32b of the base film 32 each have an intermediate layer 61 or 66 laminated on a transparent conductive layer 52a or 52b, and a covering conductive layer 63 or 68 further laminated on the intermediate layer 61 or 66. A three-layer film is thus formed. In the second embodiment that FIGS. 12(a), 12(b), and 13 show, the same elements as in the first embodiment shown in FIGS. 1 to 10 are each assigned the same reference number and detailed description of these elements is omitted herein.

Lead-Out Conductors

As shown in FIG. 12(a), first lead-out conductors 43 in the present embodiment each include a first intermediate layer 61 provided on a portion of a first transparent electrical conductor 40 spacedly from a base film 32, and a first highly conductive layer 63 provided on the first intermediate layer 61. Similarly, as shown in FIG. 12(b), second lead-out conductors 48 each include a second intermediate layer 66 provided on a portion of a second transparent electrical conductor 45 spacedly from the base film 32, and a second highly conductive layer 68 provided on the second intermediate layer 66. A first protective layer 62 may also be provided on the first highly conductive layer 63, as shown in FIG. 12(a). Similarly, a second protective layer 67 may be provided on the second highly conductive layer 68, as shown in FIG. 12(b).

In each lead-out conductor 43, 48 in the present embodiment, each highly conductive layer 63, 68 is formed from a material having electrical conductivity higher than those of materials forming each transparent electrical conductor 40, 45 and each intermediate layer 61, 66. To be more specific, the highly conductive layer 63, 68 is formed using, for example, a material whose conductivity is much higher than that of the transparent electrical conductor 40, 45 formed from ITO or the like. The material of the highly conductive layer 63, 68 is either a metal such as aluminum, molybdenum, palladium, silver, chromium, and copper, or an alloy obtained by mixing at least two kinds of these metals, for example, a silver alloy. Of these candidates, a silver alloy has lower specific resistance than the chromium generally used as a wiring material, and is therefore preferable as the material of the highly conductive layer 63, 68. Examples of such a silver alloy include an APC alloy that contains silver, palladium, and copper.

Adhesive strength between the highly conductive layer 63, 68 made of a silver alloy, and the transparent electrical conductor 40, 45 formed from a transparent conductive material such as ITO, is roughly smaller than the adhesive strength between chromium, which is a general wiring material, and the transparent electrical conductor 40, 45. Therefore, if the highly conductive layer 63, 68 made of a silver alloy is provided directly on the transparent electrical conductor 40, 45, therefore, this may result in a lack of adhesion between the highly conductive layer 63, 68 and the transparent electrical conductor 40, 45. In this case, it is considered that if some kind of impact is added to the lead-out conductor 43, 48, the highly conductive layer 63, 68 may be peeled off from the transparent electrical conductor 40, 45. Accordingly, if the lead-out conductor 43, 48 includes the highly conductive layer 63, 68 made of a silver alloy, an electrically conductive layer having a certain degree of adhesion to the transparent electrical conductor 40, 45 and the highly conductive layer 63, 68 is preferably interposed between the transparent electrical conductor 40, 45 and the highly conductive layer 63, 68. In the present embodiment, the intermediate layer 61, 66 is interposed between the transparent electrical conductor 40, 45 and the highly conductive layer 63, 68, and the material forming the intermediate layer 61, 66 is selected so that the adhesive strength between the intermediate layer 61, 66 and the transparent electrical conductor 40, 45 will be greater than the adhesive strength between the highly conductive layer 63, 68 and the transparent electrical conductor 40, 45. Additionally, thickness of the intermediate layer 61, 66 is smaller than that of the highly conductive layer 63, 68.

Intermediate Layers

Next, the first and second intermediate layers 61, 66 are described in detail below. Adhesive strength of the intermediate layers 61, 66 is first described. Adhesive strength between the first intermediate layer 61 and the first transparent electrical conductor 40, and adhesive strength between the first intermediate layer 61 and the first highly conductive layer 63 are greater than the adhesive strength between the first transparent electrical conductor 40 and the first highly conductive layer 63. Similarly, adhesive strength between the second intermediate layer 66 and the second transparent electrical conductor 45, and adhesive strength between the second intermediate layer 66 and the second highly conductive layer 68 are greater than the adhesive strength between the second transparent electrical conductor 45 and the second highly conductive layer 68.

It is noted that the "adhesive strength" is evaluated using, for example, the pull-off method specified in Japanese Industrial Standard JIS K5600-5-7.

First, a tension tester, for example, that matches the method specified in JIS K5600-5-7, is provided. Next, a test plate with the intermediate layers 61, 66 on the transparent electrical conductors 40, 45 is prepared and the adhesion (adhesive strength) existing between the transparent electrical conductors 40, 45 and the intermediate layers 61, 66 is measured using the tension tester. The adhesion that has thus been measured is expressed as A.

Next, a test plate with the highly conductive layers 63, 68 on the intermediate layers 61, 66 is prepared and the adhesion (adhesive strength) existing between the intermediate layers 61, 66 and the highly conductive layers 63, 68 is measured using the tension tester. The adhesion that has thus been measured is expressed as B.

Next, a test plate with the highly conductive layers 63, 68 on the transparent electrical conductors 40, 45 is prepared and the adhesion (adhesive strength) existing between the transparent electrical conductors 40, 45 and the highly conductive layers 63, 68 is measured using the tension tester. The adhesion that has thus been measured is expressed as C.

In the present embodiment, adhesion A between the transparent electrical conductors 40, 45 and the intermediate layers 61, 66, and adhesion B between the intermediate layers 61, 66 and the highly conductive layers 63, 68 are greater than adhesion C between the transparent electrical conductors 40, 45 and the highly conductive layers 63, 68. This indicates that in the present embodiment, the interposition of the intermediate layers 61, 66 between the transparent electrical conductor 40, 45 and the highly conductive layer 63, 68 improves the adhesive strength between the transparent electrical conductor 40, 45 and the highly conductive layer 63, 68.

An electrical conducting property of the intermediate layers 61, 66 is described next. In the lead-out conductors 43, 48, the highly conductive layers 63, 68 play a main role in conducting electrical signals. The intermediate layers 61, 66 therefore do not need to have an electrical conducting property superior to that of the highly conductive layers 63, 68, and only need to have a conductivity level at which the intermediate layers electrically connect the transparent electrical conductors 40, 45 and the highly conductive layers 63, 68, at low resistance. Accordingly, specific resistance of the intermediate layers 61, 66 is higher than that of the highly conductive layers 63, 68. In addition, preferably, the thickness of the intermediate layers 61, 66 is smaller than that of the highly conductive layers 63, 68, and for example, when the highly conductive layers 63, 68 ranges between 50 and 250 nm in thickness, the intermediate layers 61, 66 range between 3 and 8 nm in thickness. This small thickness of the intermediate layers 61, 66 enables the electrical connection between the transparent electrical conductors 40, 45 and the highly conductive layers 63, 68, at low resistance, and reduction in thickness of the entire lead-out conductors 43, 48.

The kind of material forming the intermediate layers 61, 66 is not limited, only if the material exhibits sufficient adhesive strength with respect to the transparent electrical conductors 40, 45 and the highly conductive layers 63, 68, and a metal such as a molybdenum (Mo) alloy is used as the material. This Mo alloy is, for example, MoNb, which is an alloy of Mo and niobium (Nb).

Protective Layers

Next, the first protective layer 62 provided on the first highly conductive layer 63, and second protective layer 67 provided on the second highly conductive layer 68 are described in detail below. The protective layers 62, 67, provided to prevent oxidation of the highly conductive layers 63, 68, have acid resistance, water resistance, and the like. The kind of material forming the protective layers 62, 67 is not limited, only if the material has adequate resistance to acids, and a metal such as a Mo alloy is used as the material. This Mo alloy is, for example, MoNb, an alloy of Mo and niobium (Nb). Thickness of the protective layers 62, 67 ranges between 10 and 30 nm, for example.

Laminate

The laminate 50, provided as a source material for manufacturing the touchscreen panel sensor 30 in the second embodiment of the present, is described below with reference being made to FIG. 13. The laminate 50 includes a transparent base film 32, a first transparent conductive layer 52a laminated on one surface 32a of the base film 32, a second transparent conductive layer 52b having a light-transmitting property, laminated on the other surface 32b of the base film 32, a first covering conductive layer 54a laminated on the first transparent conductive layer 52a, and a second covering conductive layer 54b laminated on the second transparent conductive layer 52b.

The covering conductive layers 54a, 54b may, as shown in FIG. 13, include intermediate layers 61, 66 provided on the transparent conductive layers 52a, 52b, highly conductive layers 63, 68 provided on the intermediate layers 61, 66, and protective layers 62, 67 provided on the highly conductive layers 63, 68. Patterning the covering conductive layers 54a, 54b forms the lead-out conductors 43, 48.

FIGS. 14, 15, and 16 show how alignment marks and product information are arranged in the present invention. As shown in FIGS. 14, 15, and 16, the alignment marks 71, 73, 74, 76, 77 and the product information that contains product information 78 and a bar code 79 are created in a non-active area Aa2 (see FIGS. 1 and 3A), which is outside an active area Aa1 in which a contact position (approach position) of the touchscreen panel sensor film can be detected. FIG. 14 is a schematic view of the touchscreen panel sensor film 70 formed on a web. Alignment marks 71 for sheet-cutting a predetermined number of sets of unit patterns formed by step-and-repeat imposition are formed on the sensor film. The unit patterns here are each for forming the independent, touchscreen panel sensor piece 75 shown in FIG. 16. The predetermined number of sets of unit patterns by step-and-repeat imposition are each for cutting into sheet form any one of the sets of unit patterns from the web on which is formed the touchscreen panel sensor shown in FIG. 15. FIG. 15 shows the predetermined number of sets of unit patterns formed by step-and-repeat imposition, each set being formed in a format of five lines, five columns. FIG. 15 is a schematic view of a touchscreen panel sensor film sheet 72 obtained after sheet cutting of the sensor film for the touchscreen panel sensor according to the present embodiment. Alignment marks 73, 74 for individual-piece cutting or for creating pre-cut individual pieces are formed on the sheet. FIG. 16 shows a unit pattern (touchscreen panel sensor piece) 75 of the touchscreen panel sensor fabricated on the sensor film for the touchscreen panel sensor according to the present invention. Alignment marks 76 for position matching to the touchscreen panel device, alignment marks 77 for FPC attaching, and product information that includes product information 78 and a bar code 79, are formed in the unit pattern. Shapes and positions of the alignment marks 71, 73, 74, 76, 77 are not limited to the shapes and positions shown in the figures, and actual shapes and positions of these alignment marks can each be any shape and position, only if the shape and the position are such that position matching can be realized. The product information including the bar code can be a two-dimensional bar code or other machine-readable information. The alignment marks 71, 73, 74, 76, 77 and the product information 78, 79 are formed in the same step as used for the lead-out conductors 43, 48. That is, the alignment marks and product information in the second embodiment of the present invention, as with the lead-out conductors 43, 48, are formed from a three-layer film obtained by, for each of the surfaces 32a and 32b of the base film 32, laminating an intermediate layer 61 or 66 on the transparent conductive layer 52a or 52b and further laminating a covering conductive layer 63 or 68 on the intermediate layer 61 or 66. Protective layers 62, 67 may be additionally provided on the three-layer film. Furthermore, the alignment marks and product information in the second embodiment of the present invention, as with the lead-out conductors 43, 48, can be formed on both surfaces 32a and 32b of the base film 32.

The touchscreen panel sensor 30, the alignment marks 71, 73, 74, 76, 77, and the product information 78, 79 are formed by conducting film deposition, patterning, and/or other processing, upon the laminate 50. In the present embodiment, if the highly conductive layers 63, 68 are made from an APC alloy and the intermediate layers 61, 66 and the protective layers 62, 67 are made from MoNb, the highly conductive layers 63, 68, the intermediate layers 61, 66, and the protective layers 62, 67 can be etched with the same etching solution, for example a phosphoric-nitric-acetic acid aqueous solution or the like. Hence, the covering conductive layers 54a, 54b including the intermediate layers 61, 66, the highly conductive layers 63, 68, and the protective layers 62, 67, can be patterned using a single etching solution. Other types of processing, such as film deposition and patterning, are substantially the same as used in the first embodiment shown in FIGS. 1 to 10, and further detailed description of these types of processing is therefore omitted herein.

In this way, in accordance with the present embodiment, the alignment marks 71, 73, 74, 76, 77 or product information 78, 79 in the present invention can be created in the same steps as those of forming the covering conductive layers 54a, 54b, without providing a new step. Accordingly, the alignment marks 71, 73, 74, 76, 77 or the product information 78, 79 is created exactly along the pattern for exposing the photosensitive layers to light, thus the positions of the alignment marks or product Information relative to the touchscreen panel sensor region are kept uniform, and the required position accuracy can be obtained.

Such improvement of the alignment marks 71, 73, 74, 76, 77 and product information 78, 79 in position accuracy leads to improvement of processing accuracy in post-processing steps such as sheet cutting, individual-piece cutting, individual-piece punching-through, FPC attaching, and position matching to a display panel, and hence to improvement of machine-reading accuracy of the product information, especially the bar code information.

In the present embodiment, the lead-out conductors 43, 48 include the intermediate layers 61, 66 provided on portions of the transparent electrical conductors 40, 45 spacedly from the base film 32, and the highly conductive layers 63, 68 provided on the intermediate layers 61, 66. Of these elements, the highly conductive layers 63, 68 are formed from a material whose electrical conductivity is higher than that of a material (s) forming the transparent electrical conductors 40, 45 and the intermediate layers 61, 66, such as a silver alloy, and the intermediate layers 61, 66 are formed from a material having great adhesive strength with respect to the transparent electrical conductors 40, 45, such as a MoNb alloy. Accordingly, compared with a method of forming lead-out conductors using a material such as the chromium that is a general wiring material, the above way to form the lead-out conductors 43, 48 enhances the conductivity of the lead-out conductors 43, 48, providing appropriate adhesion between the lead-out conductors 43, 48 and the transparent electrical conductors 40, 45.

In the present embodiment, the alignment marks 71, 73, 74, 76, 77 or the product Information 78, 79 is created using the intermediate layers 61, 66 provided on portions of the transparent electrical conductors 40, 45 spacedly from the base film 32, and the covering conductive layers 54a, 54b provided on the intermediate layers 61, 66. In this case, presence of the intermediate layers 61, 66 improves adhesion, offering a significant prevention effect against peeling-off. The prevention of peeling-off in processing steps is crucial since a flexible transparent film base is used. The peeling-off prevention effect prevents peeling-off of the layers forming the alignment marks 71, 73, 74, 76, 77 or the product information 78, 79, thereby improving reliability of products as well as processing accuracy of the sensor film.

Additionally, in the present embodiment, forming the protective layers 62, 67 on the alignment marks 71, 73, 74, 76, 77 or on the product information 78, 79 leads to, for example, avoiding damage to the alignment marks 71, 73, 74, 76, 77 or the product information 78, 79 during processing, and preventing oxidation of the highly conductive layers 63, 68 after the product has been manufactured. For example, if silver or an alloy thereof is used for the highly conductive layers 63, 68, this helps to prevent the highly conductive layers from changing into sulfides as well as from oxidating, to stabilize reflectance, to maintain gloss, and to prevent the highly conductive layers from blackening. Thus, reduction in machine-reading accuracy of the alignment marks 71, 73, 74, 76, 77 or the product information 78, 79 is prevented and the reliability of the product improves.

Figure 17:
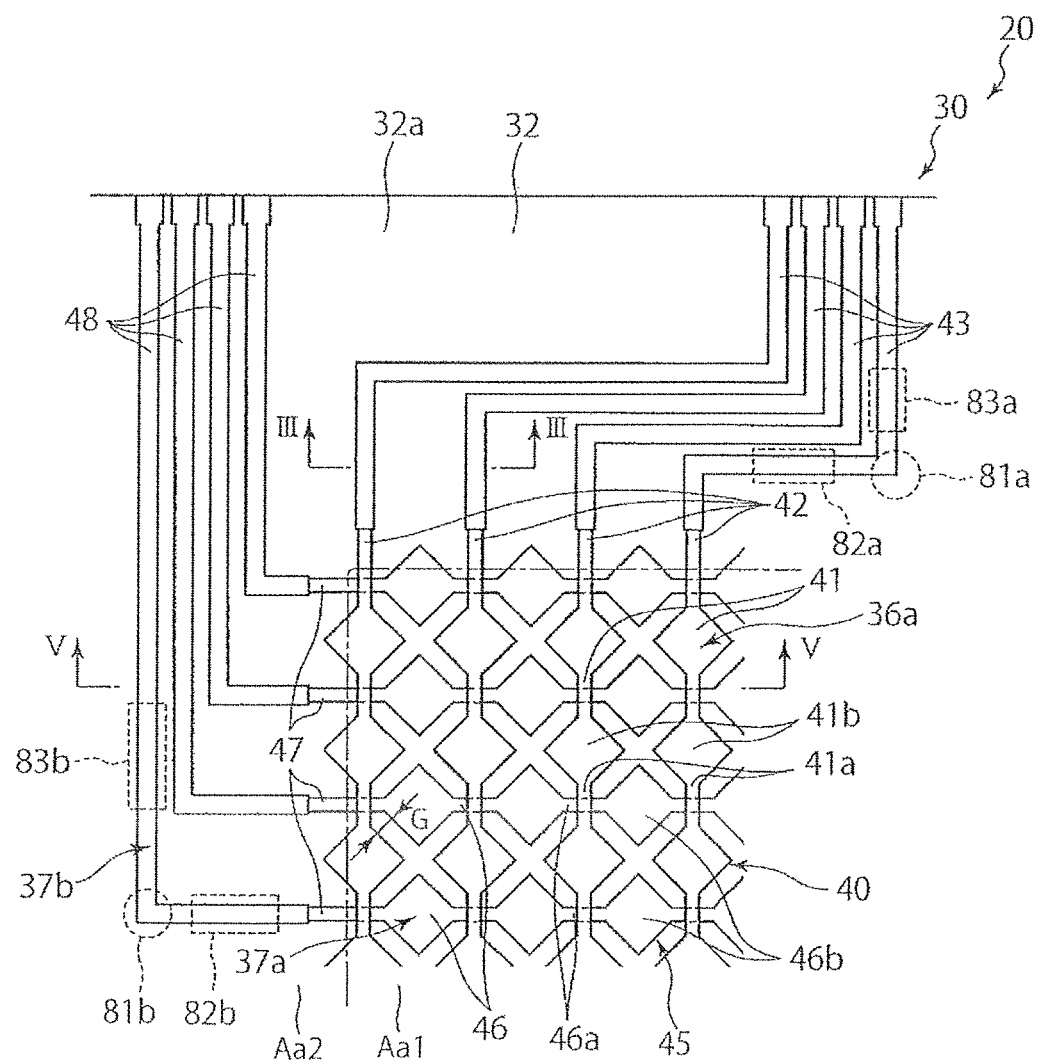
FIG. 17 shows an example of position matching that uses a pattern of the electrical lead-out conductor, FIG. 17 being a top view of the touchscreen panel sensor.

In the above-described first and second embodiments, there have been shown and described examples in which the alignment marks for position matching are formed independently of the lead-out conductors 43, 48. However, the way of position matching is not limited to these examples and may be conducted based upon partial pattern layout of the lead-out conductors 43, 48. That is, the lead-out conductors 43, 48 may additionally play the same role as that of the alignment marks. A position-matching method in this case is described below referring to FIG. 17.

In the step of cutting the touchscreen panel sensor film 70, and in the step of attaching FPC or other components to a touchscreen panel sensor film sheet 72 obtained by sheet cutting, it is generally required to detect coordinates of at least two points on the touchscreen panel sensor film 70 or the touchscreen panel sensor film sheet 72. These coordinates for position matching may be calculated based upon portions of the lead-out conductors 43, 48 formed in the non-active area. For example, as denoted by dotted lines 81a, 81b in FIG. 17, corners of the pattern of the lead-out conductors 43, 48 may be used as the coordinates for position matching. The corners of the pattern of the lead-out conductors 43, 48 are relatively easy to detect, since the corners are where the pattern changes a direction where the pattern extends.

Furthermore, while an example in which the corners of the pattern of the lead-out conductors 43, 48 are used as the coordinates for position matching has been shown and described, the way to obtain the coordinates for position matching is not limited to this example and may be based upon portions having predetermined directionality, of the pattern of the lead-out conductors 43, 48. Of the lead-out conductors 43, 48 in FIG. 17, the portions boxed with dotted lines 82a, 82b are those extending in a first direction (a horizontal direction in FIG. 17). In contrast, of the lead-out conductors 43, 48, portions boxed with dotted lines 83a, 83b are those extending in a second direction orthogonal to the first direction, that is, in a vertical direction in FIG. 17. In this case, in the lead-out conductors 43, 48, crossing points between the portions extending in the first direction and those extending in the second direction can be calculated by detecting the portions boxed with the dotted lines 82a, 82b and those boxed with the dotted lines 83a, 83b. Thus, coordinates of predetermined points on the touchscreen panel sensor film 70 or the touchscreen panel sensor film sheet 72 can be calculated and position matching to the FPC and other components can be conducted using the calculated coordinates.

Moreover, in the first and second embodiments, there has been shown and described an example in which alignment marks or product information includes a two-layer film comprising the transparent electrically conductive layers 52a, 52b and the covering electrically conductive layers 54a, 54b arranged in that order on the base film 32. In addition, there has been shown and described an example in which alignment marks or product information includes a three-layer film comprising the transparent electrically conductive layers 52a, 52b, the intermediate layers 61, 66, and the covering conductive layers 54a, 54b arranged in that order on the base film 32. However, these examples do not limit the present invention and the alignment marks or the product Information may be consisted of the transparent conductive layers 52a, 52b provided on the base film 32. As set forth in the description of the first and second embodiments, the transparent conductive layers 52a, 52b (transparent electrical conductors 40, 45) are constructed to have a light-transmitting property with respect to visible light. Therefore, if the alignment marks or the product information is consisted of the transparent conductive layers 52a, 52b, the alignment marks or the product information will be detected using light other than visible light, this detection light being reflectible or absorbable by the transparent conductive layers 52a, 52b. For example, the detection light will be ultraviolet radiation.

Third Embodiment

Next, a third embodiment of the present invention is described below referring to FIGS. 18A to 20. The third embodiment shown in FIGS. 18A to 20 differs from the first and second embodiments only in that one pair of indexes are provided for evaluating the position accuracy of the patterns on one side of the touchscreen panel sensor and on the other side thereof, and all other configurational factors are substantially the same as those of the first and second embodiments. In the third embodiment of FIGS. 18A to 20, the same elements as used in the first and second embodiments are each assigned the same reference number, and further detailed description of these elements is omitted herein.

Figure 18A:
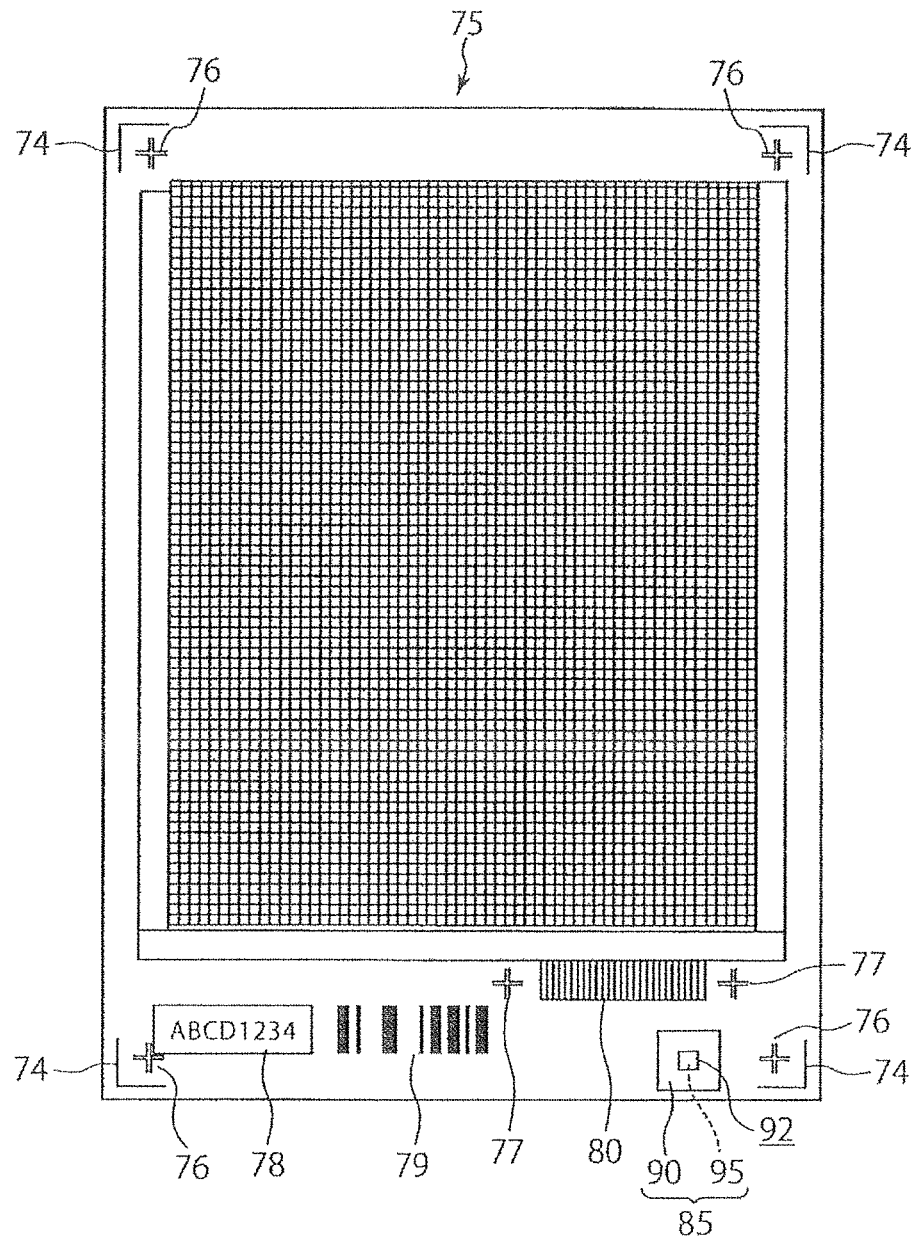
FIG. 18A is a top view that shows a unit pattern of a touchscreen panel sensor in a third embodiment.
Figure 18B:
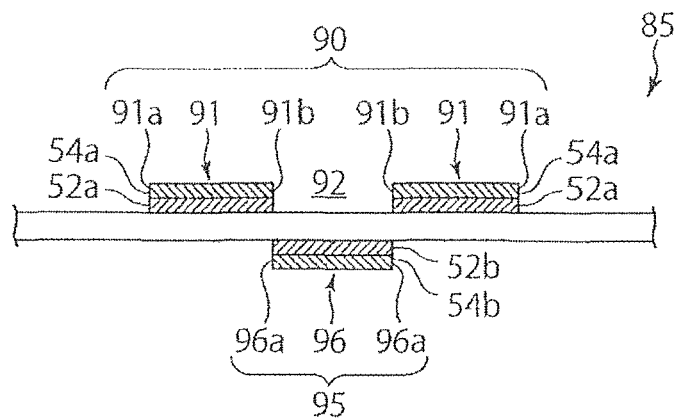
FIG. 18B is a sectional view of the touchscreen panel sensor shown in FIG. 18A.
Figure 19:
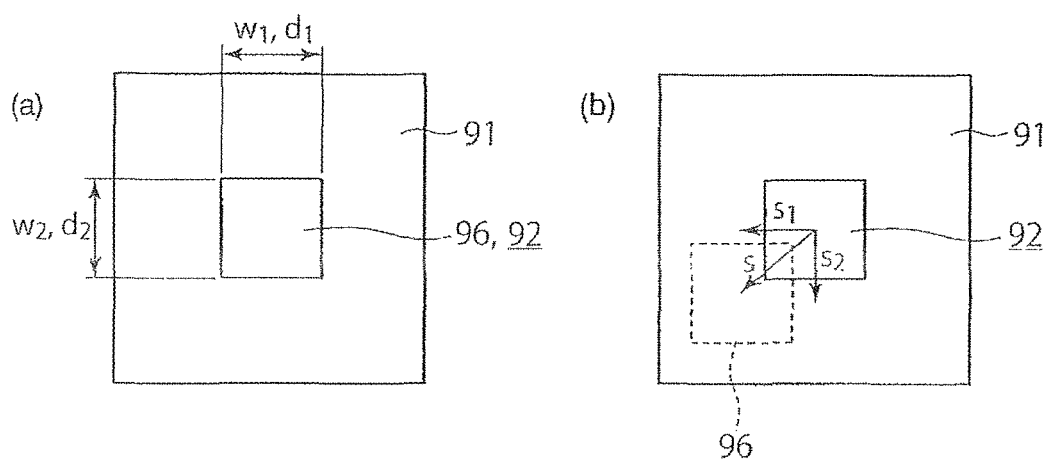
FIGS. 19(a), 19(b), and 19(c) are diagrams illustrating a method of evaluating the position accuracy of the touchscreen panel sensor pattern using one pair of index portions shown in FIGS. 18A and 18B.

A shape and layer structure of the paired index portions are first described below referring to FIGS. 18A and 18B. FIG. 18A is a top view showing a touchscreen panel sensor piece 75 used in the present embodiment, and FIG. 18B is a sectional view of the touchscreen panel sensor piece 75.

As shown in FIG. 18A, one pair of indexes, 85, are provided on the touchscreen panel sensor piece 75 according to the present embodiment. The index portion pair 85 includes a first index portion 90 formed in the non-active area Aa2, on one surface of the touchscreen panel sensor piece 75, and a second index portion 95 formed in the non-active area Aa2, on the other surface of the touchscreen panel sensor piece 75.

The index portion pair 85 is constructed so that one of the index portions has a predetermined proximity relationship with respect to the other index portion. For example, the index portion pair 85 is constructed for the first index portion 90 to have the predetermined proximity relationship with respect to the second index portion 95. The "predetermined proximity relationship" here means that if a position of the second index portion 95 relative to that of the first index portion 90 is shifted from design value, the first index portion 90 and the second index portion 95 have respective shapes and positions determined so that a degree of the shift in at least one direction can be visually evaluated.

The shapes, positions, and layer structures of the first index portion 90 and the second index portion 95 are next described in detail below referring to FIG. 18B. The first index portion 90 and second index portion 95 shown in FIG. 18B assume that an error due to manufacture is absent between the position of the pattern on one surface of the touchscreen panel sensor piece 75 and the position of the pattern on the other surface thereof.

First, the layer structures of the first index portion 90 and the second index portion 95 are described below. As shown in FIG. 18B, the first index portion 90 and the second index portion 95, as with the alignment marks or product information in the first embodiment, respectively include a two-layer film comprising the transparent electrically conductive layers 52a, 52b and the covering electrically conductive layers 54a, 54b arranged in that order on the base film 32. However, the first index portion 90 and the second index portion 95, as with the alignment marks or product information in the second embodiment, may respectively include a three-layer film comprising the transparent electrically conductive layers 52a, 52b, the intermediate layers 61, 66, and the covering conductive layers 54a, 54b arranged in that order on the base film 32.

As shown in FIGS. 18A and 18B, a region left by partially removing the first transparent conductive layer 52a and the first covering conductive layer 54a is formed at the first index portion 90. As described herein, the base film 32 is formed from a material having a light-transmitting property. Light that has entered the above region of the first index portion 90, therefore, passes through the base film 32 and reaches the other surface of the touchscreen panel sensor piece 75. The portion of the first index portion 90, constructed to make the light reach the other surface of the touchscreen panel sensor piece 75, is hereinafter referred to as the transmitting portion 92.

The embodiment shown in FIG. 18B assumes that information associated with the light reflected by the covering conductive layers 54a, 54b (i.e., information on the light reflected from the covering conductive layers 54a, 54b, or information indicating that the light is blocked by the covering conductive layers 54a, 54b) is used as a basis for detecting or visually recognizing a pattern of the index portions 90, 95. In the embodiment of FIG. 18B, therefore, a profile of the index portions 90, 95 as detected is dictated by a profile of the covering conductive layers 54a, 54b. Of the index portions 90, 95, portions that define the pattern detected or visually recognized are hereinafter termed the working portions 91, 96. In FIG. 18B, the working portion 91 of the first index portion 90 has an outer profile denoted by reference number 91a, and the working portion 91 of the first index portion 90 has an inner profile denoted by reference number 91b. In addition, the working portion 96 of the second index portion 95 has an outer profile denoted by reference number 96a, and the working portion 96 of the second index portion 95 has an inner profile denoted by reference number 96b. The transmitting portion 92 of the first index portion 90 is defined as an inside portion of the inner profile 91b.

The second index portion 95 is constructed so that when viewed from a directional normal to the base film 32 (hereinafter, this direction is conveniently referred to as the normal-line direction), the second index portion 95 is disposed at least partly at a position internal to the inner profile 91b of the working portion 91 of the first index portion 90, that is, inside the transmitting portion 92. For example as shown in FIG. 18B, given no error due to manufacture, the second index portion 95 is constructed so that the inner profile 91b of the working portion 91 of the first index portion 90 and the outer profile 96b of the working portion 96 of the second index portion 95 substantially match each other. In other words, the index portion pair 85 including the first index portion 90 and the second index portion 95 has a so-called box-in-box configuration in which one of the elements constituting the pair is placed inside a closed region that the other element defines.

Next, operational characteristics of the touchscreen panel sensor piece 75 with the index portion pair 85 provided thereupon are described below referring to FIGS. 19(a), 19(b), and 19(c). A method of evaluating the position accuracy of the pattern formed on one surface of the touchscreen panel sensor piece 75, relative to the pattern formed on the other surface of the sensor piece 75, is first described below.

FIG. 19(a) is a top view showing a first index portion 90 and second index portion 95 obtained when an error due to manufacture is absent. In this case, as shown in FIG. 19(a), the transmitting portion 92 of the first index portion 90 and the working portion 96 of the second index portion 95 substantially match each other. That is, when viewed from the normal-line direction of the base film 32, the working portion 96 of the second index portion 95 is visually recognized over an entire region internal to the working portion 91 of the first index portion 90. Thus, it can be visually confirmed that the pattern on one surface of the touchscreen panel sensor piece 75 is formed exactly as predesigned, with respect to the pattern on the other surface of the touchscreen panel sensor piece 75.

Referring to FIG. 19(a), symbols $w_1$ and $d_1$ denote widths of the transmitting portion 92 of the first index portion 90 and the working portion 96 of the second index portion 95, in a first direction, and symbols $w_2$ and $d_2$ denote widths of the transmitting portion 92 of the first index portion 90 and the working portion 96 of the second index portion 95, in a second direction orthogonal to the first direction. The widths of the transmitting portion 92 of the first index portion 90 and the working portion 96 of the second index portion 95 are each set to be an appropriate value according to a permissible manufacturing error. For example, if the permissible manufacturing error is 0.5 mm in both of the first and second directions, the widths $w_1$ and $d_1$ as well as the widths $w_2$ and $d_2$ are both set to be 0.5 mm.

FIG. 19(b) is a top view showing a first index portion 90 and second index portion 95 obtained when the error due to manufacture is within a permissible range. Referring to FIG. 19(b), the manufacturing-associated error in the position of the second index portion 95 relative to that of the first index portion 90 (i.e., a shift from the design data) is expressed by arrow "s". The arrow "s" here is a resultant vector of arrow $s_1$ denoting a shift in the first direction, and arrow $s_2$ denoting a shift in the second direction.

In the example that FIG. 19(b) shows, when viewed from the normal-line direction of the base film 32, part of the working portion 96 of the second index portion 95 is visually recognized internally to the first index portion 90. Thus, it can be visually confirmed that the shift in the position of the second index portion 95 relative to that of the first index portion 90, or the shift from the design data, is smaller than 0.5 mm in both of the first and second directions.

FIG. 19(c) is a top view showing a first index portion 90 and second index portion 95 obtained when the error due to manufacture is outside the permissible range. In the example that FIG. 19(c) shows, when viewed from the normal-line direction of the base film 32, no part of the working portion 96 of the second index portion 95 is visually recognized internally to the first index portion 90. Thus, it can be visually confirmed that the shift in the position of the second index portion 95 relative to that of the first index portion 90, or the shift from the design data, is equal to or more than 0.5 mm in at least one direction of the first and second directions.

As is evident from the description of the first embodiment shown in FIGS. 5C to 5F, the pattern portions of the touchscreen panel sensor piece 75 that substantially match in width between the transparent conductive layers 52a, 52b and the covering conductive layers 54a, 54b are those obtained as a result of a first execution cycle of exposure, development, and etching steps S3 to S7. Evaluation results obtained from the examples shown in FIG. 18B and FIGS. 19(a) to 19(c), therefore, represent relative position accuracy between the first exposure, development, and etching steps executed to generate the pattern on one surface, and the first exposure, development, and etching steps executed to generate the pattern on the other surface.

In this way, in accordance with the present embodiment, the index portion pair 85 constructed so that one index portion has the predetermined proximity relationship with respect to the other index portion is provided in the non-active area Aa2, on both surfaces of the touchscreen panel sensor piece 75. The position accuracy of the pattern on one surface with respect to the pattern on the other surface can therefore be visually evaluated. This enables easy inspection for determining the propriety of shipping the touchscreen panel sensor piece 75. In addition, at a shipping destination of the touchscreen panel sensor piece 75, a user who receives the product can readily/easily evaluate or confirm the position accuracy of its patterns.

In the above embodiment, there has been shown and described an example in which the widths of the transparent conductive layers 52a, 52b and covering conductive layers 54a, 54b constituting the first index portion 90 and the second index portion 95 are substantially in agreement. However, this example does not limit the present invention and the widths of the transparent conductive layers 52a, 52b and covering conductive layers 54a, 54b constituting the first index portion 90 and the second index portion 95 do not need to agree. An example in which the widths of the transparent conductive layers 52a, 52b and covering conductive layers 54a, 54b constituting the first index portion 90 and the second index portion 95 are not in agreement is described below referring to FIGS. 20 and 21.

Figure 20:
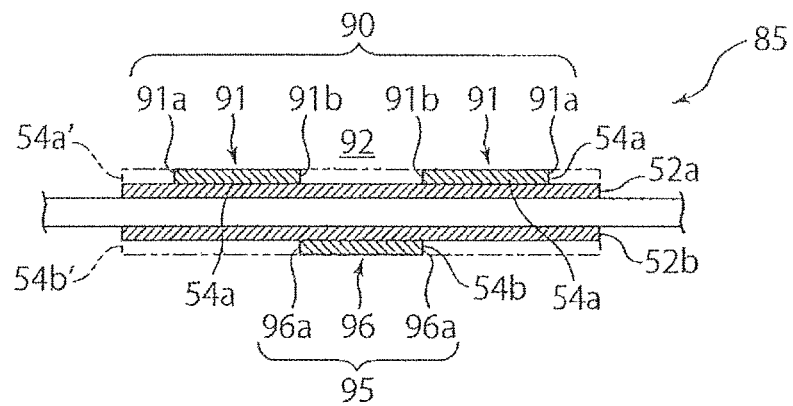
FIG. 20 is a sectional view showing a modification of a layer configuration of one pair of index portions.

FIG. 20 is a sectional view showing one pair of index portions, 85, of the touchscreen panel sensor piece 75 according to an example of modification. As shown in FIG. 20, a first covering conductive layer 54a forming a first index portion 90 is constructed to have smaller width than a first transparent conductive layer 52a. Likewise, a second covering conductive layer 54b forming a second index portion 95 is constructed to have smaller width than a second transparent conductive layer 52b. In this case, regions on the index portions 90, 95 where the covering conductive layers 54a, 54b are present are working portions 91, 96.

The "smaller width" here means that the covering conductive layers 54a, 54b of the index portions 90, 95 were formed in the second exposure, development, and etching steps. In other words, in the example of the index portions 90, 95 that is shown in FIG. 20, the transparent conductive layers 52a, 52b have a shape defined in the first exposure, development, and etching steps, whereas the covering conductive layers 54a, 54b have a shape defined in the second exposure, development, and etching steps. A region denoted by a double-dotted line in FIG. 20 denotes a covering conductive layer 54a' or 54b' removed as a result of the second exposure, development, and etching steps.

Next, operational characteristics of the touchscreen panel sensor piece 75 with the index portion pair 85, shown in FIG. 20, provided thereupon are described below referring to FIG. 21.

Figure 21:
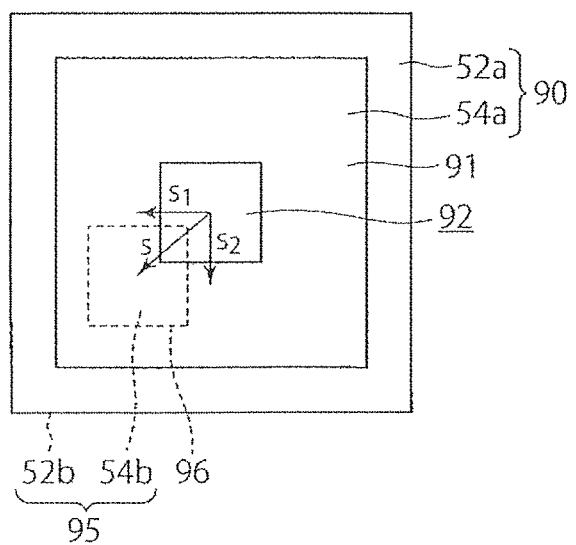
FIG. 21 is a diagram illustrating a method of evaluating the pattern accuracy of the touchscreen panel sensor pattern using the paired index portions shown in FIG. 20.

FIG. 21 is a top view showing a first index portion 90 and second index portion 95 obtained when an error due to manufacture is within a permissible range. In the example that FIG. 21 shows, width of a transmitting portion 92 of the first index portion 90 and width of a working portion 96 of the second index portion 95, as in the examples of FIGS. 19(a) to 19(c), are both set to be 0.5 mm, for example, in both first and second directions. In the example that FIG. 21 shows, when viewed from the normal-line direction of the base film 32, part of the working portion 96 of the second index portion 95 is visually recognized internally to the transmitting portion 92 of the first index portion 90. Thus, it can be visually confirmed that a shift in a position of the second index portion 95 relative to that of the first index portion 90, or a shift from design data, is smaller than 0.5 mm in both of the first and second directions.

As described above, in the example that FIGS. 20 and 21 show, the shape of the covering conductive layers 54a, 54b constituting the working portions 91, 96 is defined in the second exposure, development, and etching steps. Evaluation results obtained from the example shown in FIGS. 20 and 21, therefore, represent the relative position accuracy obtained between the second exposure, development, and etching steps executed for generating the pattern on one surface, and the second exposure, development, and etching steps executed for generating the pattern on the other surface.

In the embodiment shown in FIGS. 18B to 21, there have been shown and described examples of pattern detection of the index portions 90, 95, based on the pattern of the covering conductive layers 54a, 54b. Pattern detection, however, is not limited to these examples and pattern detection of the index portions 90, 95 may be conducted based on the pattern of the transparent conductive layers 52a, 52b. That is, the working portions 91, 96 of the index portions 90, 95 may be constituted by the transparent conductive layers 52a, 52b. In this case, as in a case of the alignment marks or product information being consisted of the transparent conductive layers 52a, 52b, the alignment marks or the product information will be detected using light other than visible light, this detection light being reflectible or absorbable by the transparent conductive layers 52a, 52b. For example, the detection light will be ultraviolet radiation.

Figure 22:
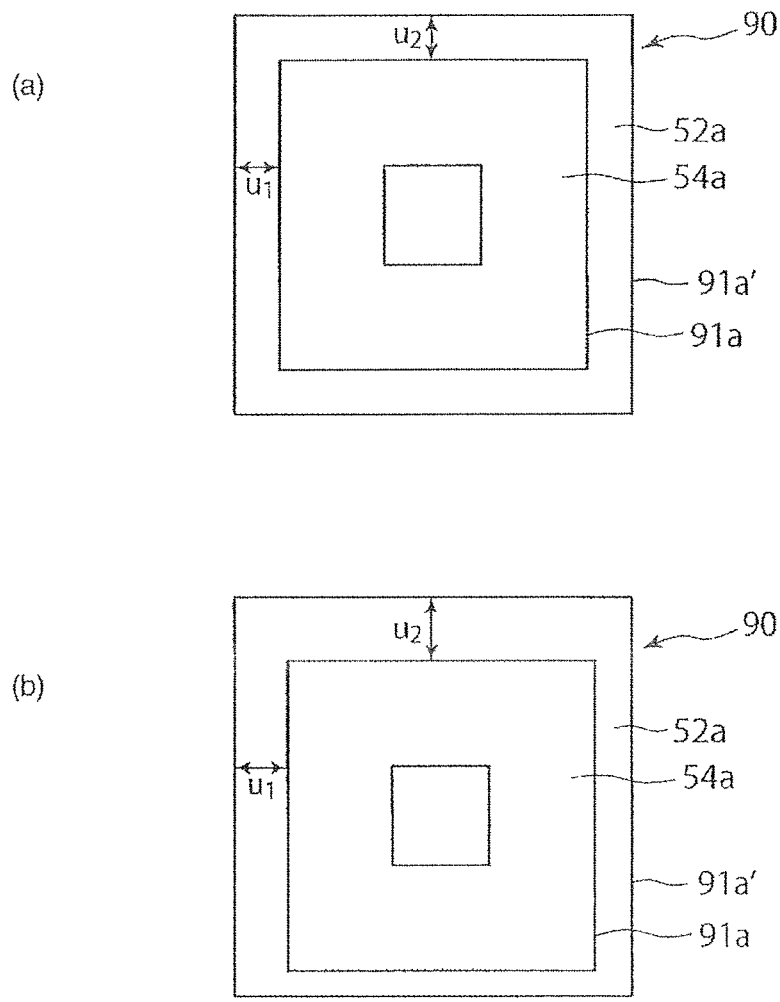
FIGS. 22(a) and 22(b) are diagrams illustrating other methods of evaluating the position accuracy of touchscreen panel sensor pattern using the paired index portions shown in FIG. 20.

In the embodiment shown in FIGS. 20 and 21, there has been shown and described an example of evaluating relative position accuracy between the patterns formed on one surface of the touchscreen panel sensor piece 75 and the other surface thereof, in the first exposure, development, and etching steps. In addition, there has been shown and described an example of evaluating relative position accuracy between the patterns formed on one surface of the touchscreen panel sensor piece 75 and the other surface thereof, in the second exposure, development, and etching steps. These examples, however, do not limit the present invention and the first index portion 90 or second index portion 95 shown in FIGS. 20 and 21 may be used to evaluate relative position accuracy between the patterns formed in the first exposure, development, and etching steps, and the patterns formed in the second exposure, development, and etching steps. Examples of such evaluation are described below referring to FIGS. 22(a) and 22(b).

FIG. 22(a) is a top view showing a first index portion 90 obtained when there is no relative manufacturing-associated error between the first and second exposure, development, and etching steps. FIG. 22(b) is a top view showing a first index portion 90 obtained when there is a relative manufacturing-associated error between the first and second exposure, development, and etching steps. In the first index portions 90 of FIGS. 22(a), 22(b), as in the first index portion 90 of FIGS. 20 and 21, the width of the first covering conductive layer 54a is smaller than that of the first transparent conductive layer 52a. In this case, an outer profile denoted by reference symbol 91a can be detected from a shape of the first covering conductive layer 54a. If ultraviolet radiation or the like is used, an outer profile denoted by reference symbol 91a' can also be detected from a shape of the first transparent conductive layer 52a. In addition, distances $u_1$ and $u_2$ between the outer profiles 91a and 91a' detected in both a first direction and a second direction can be calculated from the outer profiles 91a, 91a'. Furthermore, relative position accuracy between the patterns in the first exposure, development, and etching steps, and the patterns in the second exposure, development, and etching steps, can be evaluated by calculating shifts from the distances $u_1$, $u_2$ from respective design data.

Figure 23:
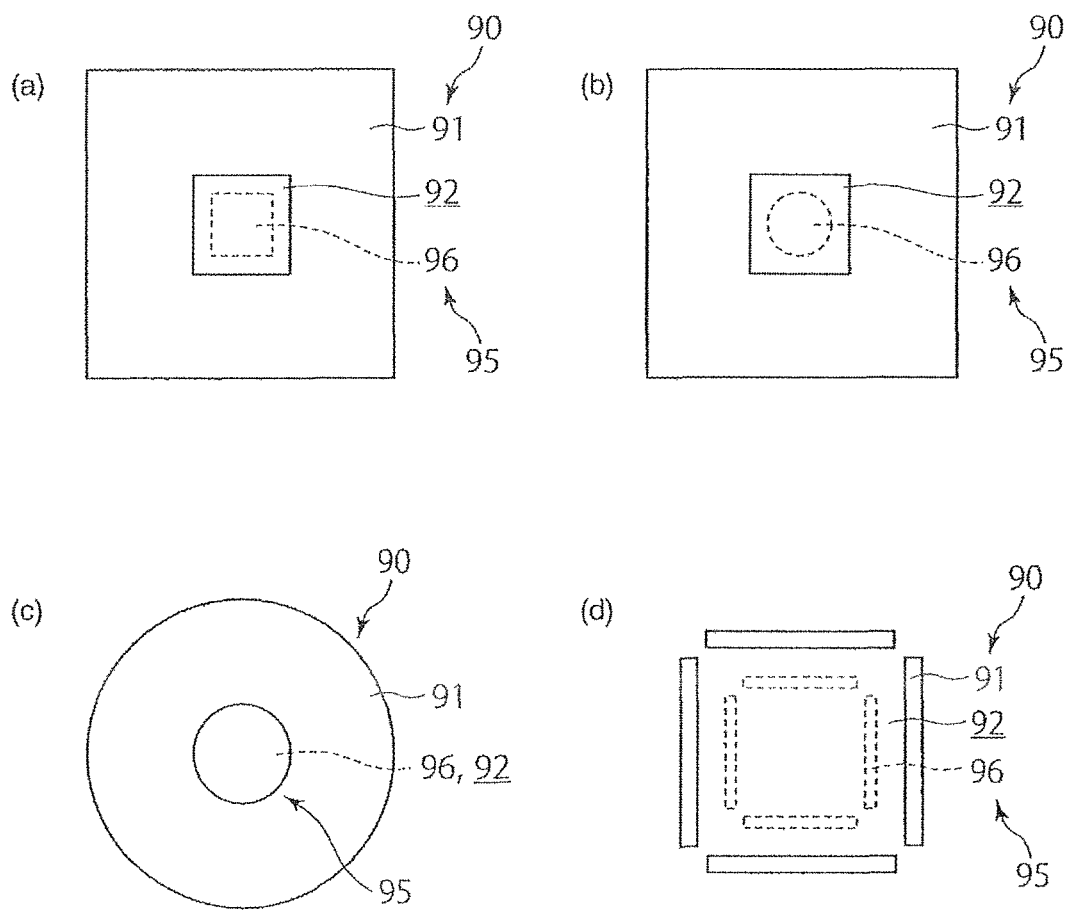
FIGS. 23(a) to 23(d) are diagrams each showing a specific geometrical modification of one pair of index portions.

In the embodiment shown in FIGS. 18A to 22, there have been shown and described examples of constructing the index portions 90, 95 so that given no error due to manufacture, the inner profile 91b of the working portion 91 of the first index portion 90 and the outer profile 96a of the working portion 96 of the second index portion 95 substantially match. However, further detailed shapes of the index portions 90, 95 are not limited and index portions 90, 95 of varying shapes can be used as appropriate. For example, as shown in FIG. 23(a), the index portions 90, 95 may be constructed so that a predetermined gap exists between the working portion 91 of the first index portion 90 and the working portion 96 of the second index portion 95. Additionally, shapes of the working portions 91, 96 of the index portions 90, 95 are not limited to a rectangle and for example, as shown in FIG. 23(b), at least one of the working portions 91, 96 of the index portions 90, 95 can be of a circular shape. Alternatively, as shown in FIG. 23(c), both of the working portions 91, 96 of the index portions 90, 95 can be of a circular shape. In this case, not only can it be visually confirmed that the shift in the first direction (i.e., a shift corresponding to arrow $s_1$) and the departure in the second direction (i.e., a shift corresponding to arrow $s_2$) are smaller than the predetermined values, but can it also be visually confirmed that a total of the shifts (i.e., a quantity corresponding to arrow "s") is smaller than a predetermined value. In the example that FIG. 23(c) shows, the inner profile of the working portion 91 of the first index portion 90 and the outer profile of the working portion 96 of the second index portion 95 can either match or mismatch.

Furthermore, in the embodiment shown in FIGS. 18A to 22, there has been shown and described an example in which the transmitting portion 92 defined by the inner profile 91b of the working portion 91 of the first index portion 90 is a completely closed region. However, this example does not limit the present invention and provided that a change in a position of the working portion 96 of the second index portion 95 relative to the working portion 91 of the first index portion 90 can be visually confirmed, the transmitting portion 92 of the first index portion 90 does not need to be a completely closed region. For example as shown in FIG. 23(d), the transmitting portion 92 may be defined by a working portion 91 partially or partly segmented in the first index portion 90. Similarly, the second index portion 95 may have a partially or partly segmented working portion 96.

Modifications of the Third Embodiment

Next, modifications of the third embodiment of the present invention will be described referring to FIGS. 24 and 25.

In the third embodiment of FIGS. 18A to 23, there has been shown and described an example of constructing one pair of indexes, 85, in such a form that the position accuracy of patterns in both a first direction and a second direction can be evaluated. To be more specific, an example of one pair of index portions, 85, having the so-called box-in-box configuration has been shown and described. This example, however, does not limit the present invention and the index portion pair 85 only needs to be constructed so as to enable the position accuracy of patterns in at least one direction to be evaluated. Examples of index portion pair 85 constructed so that the position accuracy of a pattern on one surface relative to a pattern on the other surface can be evaluated in one direction are described below with reference being made to FIGS. 24 and 25.

Figure 24:
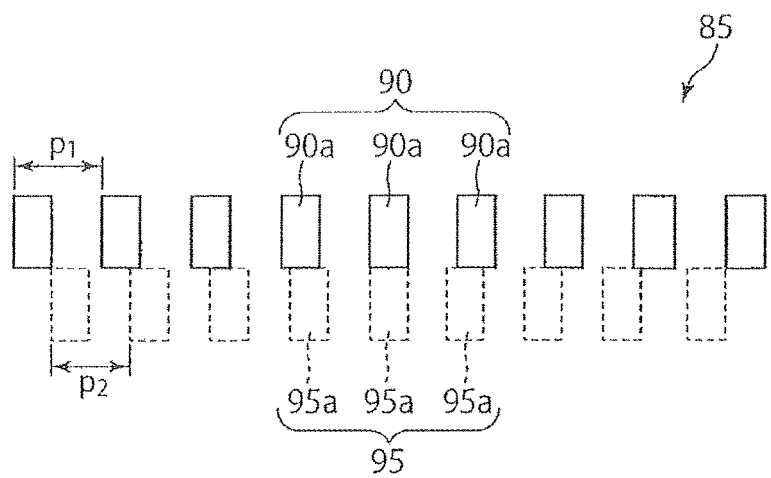
FIG. 24 is a diagram showing a modification of a pattern of one pair of index portions.
Figure 25:
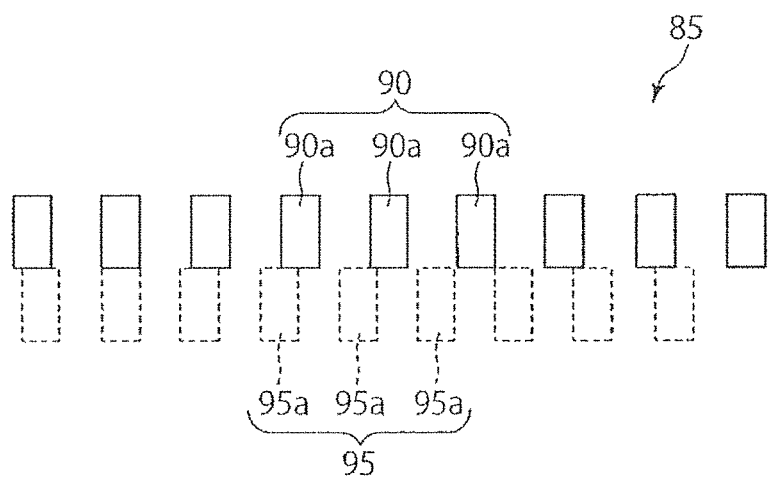
FIG. 25 is a diagram illustrating a method of evaluating the pattern accuracy of touchscreen panel sensor using the paired index portions shown in FIG. 24.

FIG. 24 is a top view of one pair of index portions, 85, in a modification, showing the index portion pair 85 obtained in absence of an error due to manufacture. As shown in FIG. 24, of the index portion pair 85, a first index portion 90 provided on one surface of the touchscreen panel sensor piece 75 includes a plurality of first unit index portions 90a arranged at a pitch $p_1$ in a first direction (a horizontal direction in FIG. 24). Likewise, of the index portion pair 85, a second index portion 95 provided on the other surface of the touchscreen panel sensor piece 75 includes a plurality of second unit index portions 95a arranged at a pitch $p_2$ in the first direction.

The first unit index portions 90a and the second unit index portions 95a are each constructed to have substantially the same width in the first direction. The first unit index portions 90a are also each constructed to face one of the second unit index portions 95a in a second direction orthogonal to the first direction. In addition, the arrangement pitch $p_1$ of the first unit index portions 90a and the arrangement pitch $p_2$ of the second unit index portions 95a are set to differ from each other. In the first index portion 90 and second index portion 95 having this configuration, shifts in position due to a manufacturing error can be easily evaluated by visually confirming what number first unit index portion 90a of the plurality of first unit index portions 90a is in alignment with what number second unit index portion 95a of the plurality of second unit index portions 95a. The index portions 90, 95 are thus constructed as scale marks of a so-called vernier type.

Consider an example in which the arrangement pitch $p_1$ of the first unit index portions 90a is 0.9 mm and the arrangement pitch $p_2$ of the second unit index portions 95a is 0.8 mm. In this example, if there is no manufacturing error, the first unit index portion 90a and second unit index portion 95a positioned in the middle of the first unit index portions 90a and second unit index portions 95a are in alignment as shown in FIG. 24. The wording "in alignment" here means that coordinates of facing ends of the unit index portions 90a, 95a positioned in the middle are the same in the direction that the unit index portions 90a, 95a are arranged, that is, the first direction. In another example, if a manufacturing error causes the position of the pattern on one surface relative to the pattern on the other surface to shift through 0.3 mm leftward in one direction, the first unit index portion 90a taking up the second position from the left of the plurality of first unit index portions 90a is, as shown in FIG. 25, in alignment with the second unit index portion 95a taking up the second position from the left of the plurality of second unit index portions 95a. In other words, the second position from the left of the plurality of first or second unit index portions means the third-left position from the middle unit index portion 90a, 95a. In accordance with the examples shown in FIGS. 24 and 25, the amount of shift in the position of the pattern on one surface with respect to the pattern on the other surface, in one direction, can be easily evaluated by visually confirming what number first unit index portion 90a is in alignment with what number second unit index portion 95a.

Figure 26:
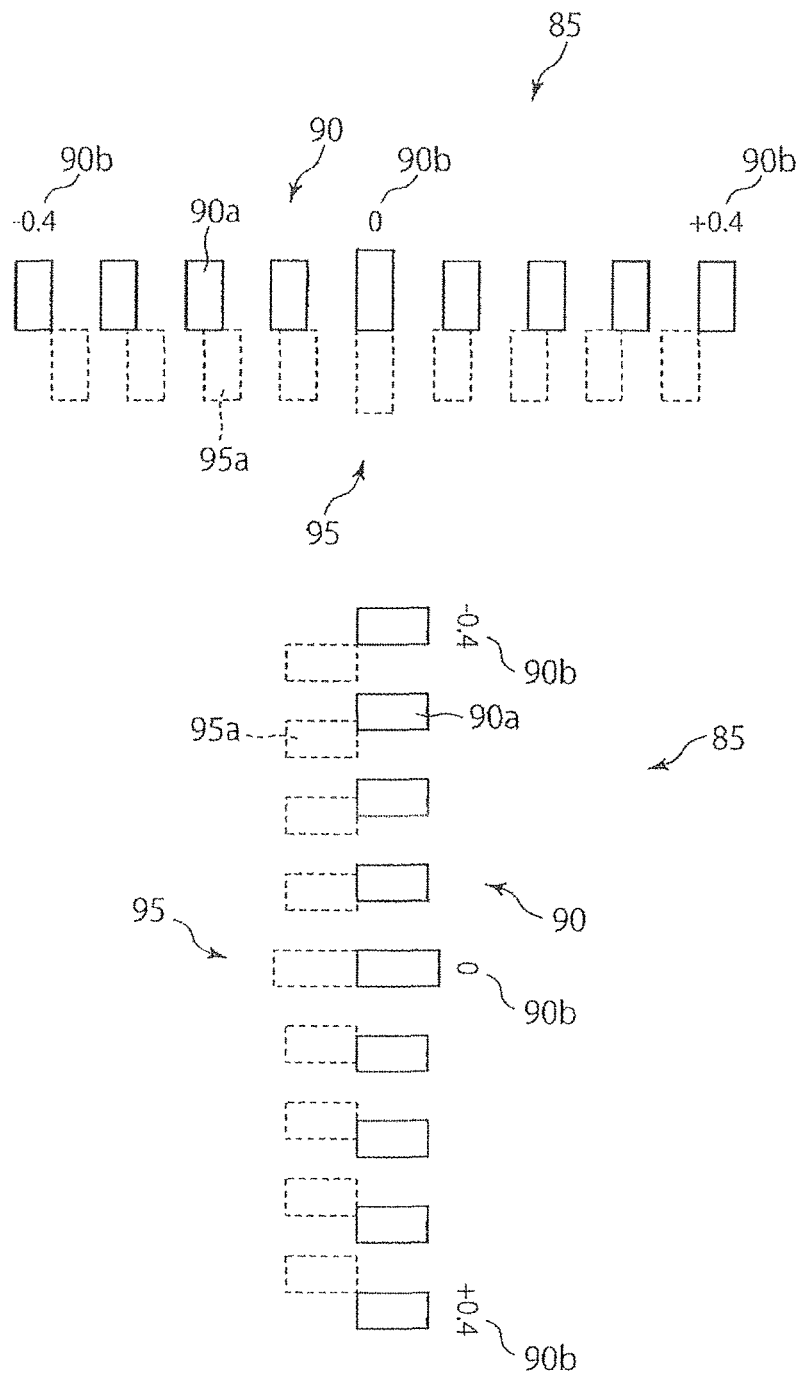
FIG. 26 is a diagram showing a modification of the paired index portions shown in FIG. 24.

In addition to one index portion pair 85 including index portions 90, 95 with a plurality of unit index portions 90a, 95a arranged in a first direction, another index portion pair 85 including index portions 90, 95 with a plurality of unit index portions 90a, 95a arranged in a second direction orthogonal to the first direction may be provided in the present modification, as shown in FIG. 26. This makes it easy to evaluate the amount of shift in the position of the pattern on one surface with respect to the pattern on the other surface, in one direction as well as in the other direction. Additionally, the shape of the unit index portions 90a, 95a positioned in the middle of the plurality of unit index portions 90a, 95a in the present modification may slightly differ from that of the unit index portions 90a, 95a present at other positions. For example as shown in FIG. 26, the unit index portions 90a, 95a positioned in the middle of the plurality of unit index portions 90a, 95a may be longer than the unit index portions 90a, 95a present at other positions, in the direction orthogonal to that in which the other unit index portions 90a, 95a are arranged. This difference in shape enables easy recognition of the unit index portions 90a, 95a positioned in the middle, and hence enables easy evaluation of the amount of shift in the position of the pattern on one surface with respect to the pattern on the other surface. Furthermore, as shown in FIG. 26, scale marks 90b may be added as an index for evaluating the amount of shift in the position of the pattern on one surface with respect to the pattern on the other surface. Scale marks "0", "+0.4", "−0.4" in the example of FIG. 26 denote that when the unit index portions 90a, 95a with the scale marks assigned thereto are in alignment, the amount of shift in the position of the pattern on one surface with respect to the pattern on the other surface is 0, +0.4, or −0.4.

Furthermore, the present modification does not limit detailed layer configurations of the first unit index portions 90a and the second index portions 95a, and may employ a variety of other layer configurations as appropriate.

For example, as with the embodiment shown in FIG. 18B, the first unit index portions 90a and the second index portions 95a can include covering conductive layers 54a, 54b that are substantially of the same width as that of the transparent conductive layers 52a, 52b. Evaluation results obtained in this case will indicate the relative position accuracy between the first exposure, development, and etching steps executed for generating the pattern on one surface, and the first exposure, development, and etching steps executed for generating the pattern on the other surface.

Furthermore, as with the embodiment shown in FIG. 20, the first unit index portions 90a and the second index portions 95a can include covering conductive layers 54a, 54b that are smaller than the transparent conductive layers 52a, 52b in width. Evaluation results obtained in this case will reflect the relative position accuracy obtained between the second exposure, development, and etching steps executed for generating the pattern on one surface, and the second exposure, development, and etching steps executed for generating the pattern on the other surface.

In the present modification, there has been shown and described an example of each index portion 90, 95 including the plurality of unit index portions 90a, 95a, respectively, arranged at predetermined pitches in one direction. This example, however, does not limit the present invention and provided that the position accuracy of patterns in at least one direction can be evaluated by observing the position of the first index portion 90 relative to the second index portion 95, each index portion 90, 95 can be constructed into various forms. For example, the first index portion 90 may extend linearly in a second direction orthogonal to a first direction, and the second index portion 95 may be disposed in point-like form in proximity to the first index portion 90. In this case, the amount of shift in the position of the pattern on one surface with respect to the pattern on the other surface can be easily evaluated if a distance from the first index portion 90 to the second index portion 95 is visually confirmed.

Figure 27:
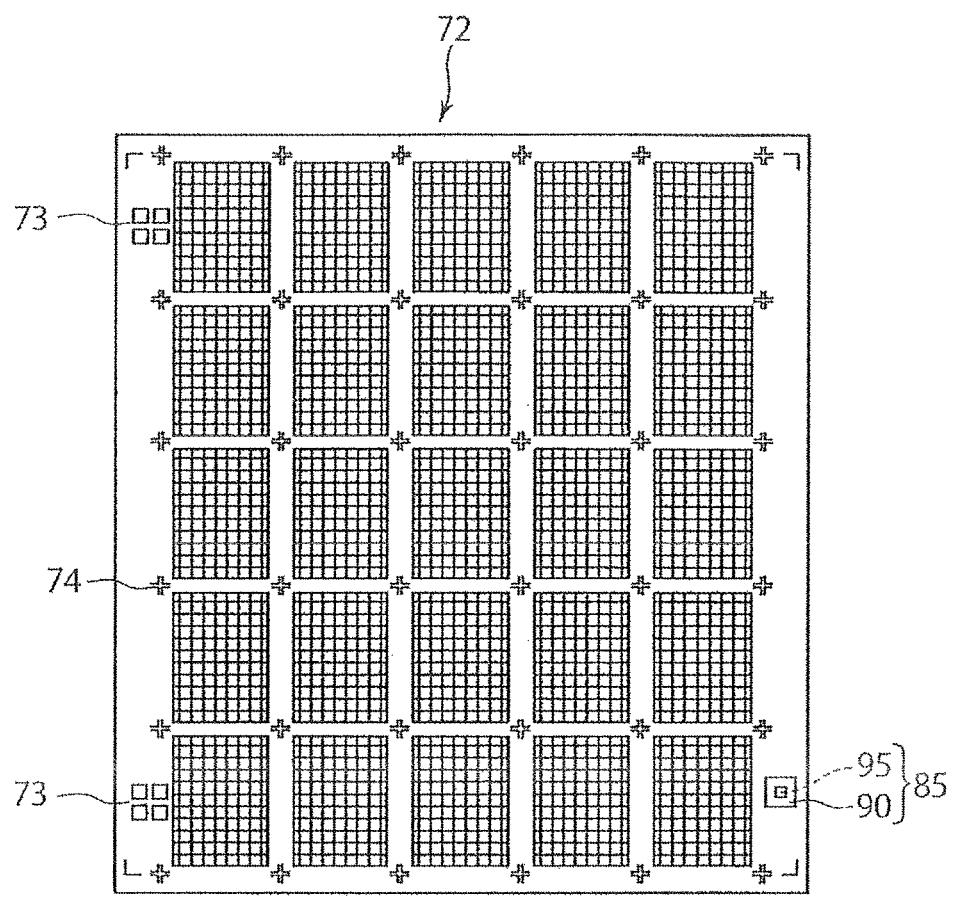
FIG. 27 is a top view showing an example in which one pair of index portions are formed on a touchscreen panel sensor having a plurality of unit patterns created by step-and-repeat imposition.

In the third embodiment and its modifications, there have been shown and described examples of forming one pair of index portions, 85, in the non-active areas Aa2 of each touchscreen panel sensor piece 75. However, these examples are not limitative and the index portion pair 85 may, as shown in FIG. 27, be provided in the non-active area Aa2 (outer-edge neighborhood) of a touchscreen panel sensor film sheet 72 including a plurality of unit patterns formed thereupon by step-and-repeat imposition.

While several modifications of the above embodiments have been described, obviously the plurality of modifications or a plurality of other modifications can instead be applied in combination.

DESCRIPTION OF REFERENCE NUMERALS

10: Input/output device
15: Display device
20: Touchscreen panel device
30: Touchscreen panel sensor
32: Base film
32a: One surface of the base film
32b: The other surface of the base film
33: Film body
34: Function film (index-matching film)
34a: High-refractive-index film
34b: Low-refractive-index film
35: Function film (low-refractive-index film)
37a: Sensor electrode
37b: Lead-out line
40: First transparent electrical conductor
41: First sensor portion
41a: Linear portion
41b: Bulged portion
42: First terminal portion
43: First electrical lead-out conductor
45: Second transparent electrical conductor
46: Second sensor portion
46a: Linear portion
46b: Bulged portion
47: Second terminal portion
48: Second electrical lead-out conductor
50: Laminate (blanks)
52a: First transparent electrically conductive layer
52b: Second transparent electrically conductive layer
54a: First covering electrically conductive layer (first light-shielding layer)
54b: Second covering electrically conductive layer (second light-shielding layer)
56a: First photosensitive layer
56b: Second photosensitive layer
56c: Third photosensitive layer (another photosensitive layer)
56d: Fourth photosensitive layer (another photosensitive layer)
58a: First mask (first photomask)
58b: Second mask (second photomask)
58c: Third mask (third photomask)
58d: Fourth mask (fourth photomask)
61: First intermediate layer
62: First protective layer
63: First covering conductive layer
66: Second intermediate layer
67: Second protective layer
68: Second covering conductive layer
70: Touchscreen panel sensor film formed on a web
71: Alignment mark for sheet cutting a predetermined number of sets of unit patterns formed by step-and-repeat imposition
72: Touchscreen panel film composed of a predetermined number of sets of unit patterns formed by step-and-repeat imposition
73: Alignment mark for individual-piece cutting or creating precut individual pieces
74: Alignment mark for individual-piece cutting or creating precut individual pieces
75: Touchscreen panel sensor piece
76: Alignment mark for position matching to the touchscreen panel device
77: Alignment mark for FPC attaching
78: Product information
79: Bar code product information
85: One pair of indexes
90: First index portion
90a: First unit index portion
91: Working portion
91a: Outer profile
91b: Inner profile
92: Transmitting portion
95: Second index portion
95a: Second unit index portion
96: Working portion
96a: Outer profile
Aa1: Active area
Aa2: Non-active area

What is claimed:

1. A touchscreen panel sensor film comprising:
a transparent base film;
a first electrical conductor provided on one side of the base film;
a second electrical conductor provided on the other side of the base film; and
an electrical lead-out conductor provided on one section of at least one of the first electrical conductor and the second electrical conductor;
wherein the one section of at least one of the electrical conductors is formed linearly, the electrical lead-out conductor extends linearly on the one section, and the one section of the at least one of the electrical conductors and the electrical lead-out conductor form an electrical line extending on the base film.

2. The touchscreen panel sensor film according to claim 1,
wherein the base film includes an active area corresponding to a region whose touch position is detectable, and a non-active area adjacent to the active area, and
wherein the electrical lead-out conductor is disposed on the non-active area.

3. The touchscreen panel sensor film according to claim 2,
wherein the first electrical conductor includes sensor portion arranged on the active area of the base film, and terminal portion arranged on the non-active area of the base film so that the terminal portion is coupled to the sensor portions, and
wherein the electrical lead-out conductor is disposed on the terminal portion of the first electrical conductor.

4. The touchscreen panel sensor film according to claim 3,
wherein the terminal portion of the first electrical conductor is integrally formed from the same material as that of the sensor portion of the first electrical conductor.

5. The touchscreen panel sensor film according to claim 1,
wherein a width of the linearly extending electrical lead-out conductor is smaller than that of the one section of the electrical conductor that is overlaid with the electrical lead-out conductor.

6. The touchscreen panel sensor film according to claim 2,
wherein the non-active area is a region that extends along an end periphery of the active area, and
wherein the one section of the electrical conductor extends in the non-active area at least partly along an end periphery of the active area adjacent to the non-active area.

7. The touchscreen panel sensor film according to claim 1,
wherein the electrical lead-out conductor is formed in the same pattern as that of the one section of the electrical conductor.

8. The touchscreen panel sensor film according to claim 1,
wherein the electrical lead-out conductor has a light-shielding property.

9. The touchscreen panel sensor film according to claim 1,
wherein the electrical lead-out conductor is disposed on the electrical conductor spacedly from the base film.

10. The touchscreen panel sensor film according to claim 1,
wherein the electrical lead-out conductor is formed using aluminum, molybdenum, silver, chromium, or copper.

11. A touchscreen panel sensor film of a projected type of capacitive-coupling scheme, comprising:
a transparent base film including an active area corresponding to a region whose touch position is detectable, and a non-active area adjacent to the active area;
a first electrical conductor formed of a plurality of linear conductors provided on one side of the base film, the first electrical conductor including sensor portions arranged on the active area of the base film, and terminal portions arranged on the non-active area of the base film so that the terminal portions are coupled to the sensor portions;
a second electrical conductor formed of a plurality of linear conductors provided on the other side of the base film, the second electrical conductor including sensor portions arranged on the active area of the base film, and terminal portions arranged on the non-active area of the base film so that the terminal portions are coupled to the sensor portions; and
an electrical lead-out conductor provided on one section of the respective linear conductors that constitute at least one of the first electrical conductor and the second electrical conductor;
wherein the one section of the at least one of the electrical conductors is positioned on the terminal portion of the at least one of the electrical conductors, and
wherein the one section of at least one of the electrical conductors is formed linearly, the electrical lead-out conductor extends linearly on the one section, and the one section of the at least one of the electrical conductors and the electrical lead-out conductor form an electrical line extending on the base film.

12. The touchscreen panel sensor film according to claim 11,
wherein a width of the linearly extending electrical lead-out conductor is smaller than that of the one section of the electrical conductor that is overlaid with the electrical lead-out conductor.

13. The touchscreen panel sensor film according to claim 11,
wherein the electrical lead-out conductor has a light-shielding property.

14. The touchscreen panel sensor film according to claim 11,
wherein the electrical lead-out conductor is disposed on the electrical conductor spacedly from the base film.

15. A touchscreen panel sensor film comprising:
a transparent base film including an active area corresponding to a region whose touch position is detectable, and a non-active area adjacent to the active area;
a first electrical conductor provided on one side of the base film, the first electrical conductor including sensor portion arranged on the active area of the base film, and terminal portion arranged on the non-active area of the base film so that the terminal portion is coupled to the sensor portion;
a second electrical conductor provided on the other side of the base film, the second electrical conductor including sensor portion arranged on the active area of the base film, and terminal portion arranged on the non-active area of the base film so that the terminal portion is coupled to the sensor portion; and
an electrical lead-out conductor provided on one section of at least one of the first electrical conductor and the second electrical conductor;
wherein the one section of at least one of the electrical conductors is formed linearly, and the electrical lead-out conductor extends linearly on the one section, and
wherein the electrical lead-out conductor is disposed on the one section of the terminal portion of the at least one of the electrical conductors disposed on the non-active area so as not to have an end adjacent to an end of the sensor portion of the at least one of the electrical conductors disposed on the active area.

16. The touchscreen panel sensor film according to claim 15,
wherein a width of the linearly extending electrical lead-out conductor is smaller than that of the one section of the electrical conductor that is overlaid with the electrical lead-out conductor.

17. The touchscreen panel sensor film according to claim 15,
wherein the electrical lead-out conductor has a light-shielding property.

18. The touchscreen panel sensor film according to claim 15,
wherein the electrical lead-out conductor is disposed on the electrical conductor spacedly from the base film.

19. A touchscreen panel sensor film of a projected type of capacitive-coupling scheme, comprising:
a transparent base film including an active area corresponding to a region whose touch position is detectable, and a non-active area adjacent to the active area;

a first electrical conductor formed of a plurality of linear conductors provided on one side of the base film, the first electrical conductor including sensor portions arranged on the active area of the base film, and terminal portions arranged on the non-active area of the base film so that the terminal portions are coupled to the sensor portions;

a second electrical conductor formed of a plurality of linear conductors provided on the other side of the base film, the second electrical conductor including sensor portions arranged on the active area of the base film, and terminal portions arranged on the non-active area of the base film so that the terminal portions are coupled to the sensor portions; and an electrical lead-out conductor provided on one section of the respective linear conductors that constitute at least one of the first electrical conductor and the second electrical conductor;

wherein the one section of the at least one of the electrical conductors is positioned on the terminal portion of the at least one of the electrical conductors, wherein the one section of the at least one of the electrical conductors is formed linearly, and the electrical lead-out conductor extends linearly on the one section, and wherein the electrical lead-out conductor is disposed on the one section of the terminal portion of the at least one of the electrical conductors disposed on the non-active area so as not to have an end adjacent to an end of the sensor portion of the at least one of the electrical conductors disposed on the active area.

20. The touchscreen panel sensor film according to claim 19,
wherein a width of the linearly extending electrical lead-out conductor is smaller than that of the one section of the electrical conductor that is overlaid with the electrical lead-out conductor.

21. The touchscreen panel sensor film according to claim 19,
wherein the electrical lead-out conductor has a light-shielding property.

22. The touchscreen panel sensor film according to claim 19,
wherein the electrical lead-out conductor is disposed on the electrical conductor spacedly from the base film.

23. A touchscreen panel sensor film comprising:
a transparent base film;
a first electrical conductor provided on one side of the base film;
a second electrical conductor provided on the other side of the base film;
a first electrical lead-out conductor provided on one section of the first electrical conductor; and
a second electrical lead-out conductor provided on one section of the second electrical conductor;
wherein the one section of the first electrical conductor is formed linearly, and the first electrical lead-out conductor linearly extends on the one section, and
wherein the one section of the second electrical conductor is formed linearly, and the second electrical lead-out conductor linearly extends on the one section.

24. The touchscreen panel sensor film according to claim 23,
wherein a width of the linearly extending first electrical lead-out conductor is smaller than that of the one section of the first electrical conductor that is overlaid with the first electrical lead-out conductor, and
wherein a width of the linearly extending second electrical lead-out conductor is smaller than that of the one section of the second electrical conductor that is overlaid with at an overlap of the second electrical lead-out conductor.

25. The touchscreen panel sensor film according to claim 23,
wherein the first electrical lead-out conductor and the second electrical lead-out conductor have a light-shielding property.

26. The touchscreen panel sensor film according to claim 23,
wherein the first electrical lead-out conductor is disposed on the first electrical conductor spacedly from the base film, and
wherein the second electrical lead-out conductor is disposed on the second electrical conductor spacedly from the base film.

27. A touchscreen panel sensor film of a projected type of capacitive-coupling scheme, comprising:
a transparent base film including an active area corresponding to a region whose touch position is detectable, and a non-active area adjacent to the active area;
a first electrical conductor formed of a plurality of linear conductors provided on one side of the base film, the first electrical conductor including sensor portions arranged on the active area of the base film, and terminal portions arranged on the non-active area of the base film so that the terminal portions are coupled to the sensor portions;
a second electrical conductor formed of a plurality of linear conductors provided on the other side of the base film, the second electrical conductor including sensor portions arranged on the active area of the base film, and terminal portions arranged on the non-active area of the base film so that the terminal portions are coupled to the sensor portions;
a first electrical lead-out conductor provided on one section of the respective linear conductors that constitute the first electrical conductor; and
a second electrical lead-out conductor provided on one section of the respective linear conductors that constitute the second electrical conductor;
wherein the one section of the first electrical conductor is positioned on the terminal portion of the first electrical conductor,
wherein the one section of the second electrical conductor is positioned on the terminal portion of the second electrical conductor,
wherein the one section of the first electrical conductor is formed linearly, and the first electrical lead-out conductor linearly extends on the one section, and
wherein the one section of the second electrical conductor is formed linearly, and the second electrical lead-out conductor linearly extends on the one section.

28. The touchscreen panel sensor film according to claim 27,
wherein a width of the linearly extending first electrical lead-out conductor is smaller than that of the one section of the first electrical conductor that is overlaid with the first electrical lead-out conductor, and
wherein a width of the linearly extending second electrical lead-out conductor is smaller than that of the one section of the second electrical conductor that is overlaid with the second electrical lead-out conductor.

29. The touchscreen panel sensor film according to claim 27,
wherein the first electrical lead-out conductor and the second electrical lead-out conductor have a light-shielding property.

30. The touchscreen panel sensor film according to claim 27,
wherein the first electrical lead-out conductor is disposed on the first electrical conductor spacedly from the base film, and
wherein the second electrical lead-out conductor is disposed on the second electrical conductor spacedly from the base film.

31. A touchscreen panel sensor film comprising:
a transparent base film including an active area corresponding to a region whose touch position is detectable, and a non-active area adjacent to the active area;
an electrical conductor provided on one side of the base film, the electrical conductor including sensor portion arranged on the active area of the base film, and terminal portion arranged on the non-active area of the base film so that the terminal portion is coupled to the sensor portion; and
an electrical lead-out conductor provided on one section of the terminal portion of the electrical conductor;
wherein the one section of the electrical conductor is formed linearly, and the electrical lead-out conductor extends linearly on the one section, and
wherein the electrical lead-out conductor is disposed on the one section of the terminal portion of the electrical conductor disposed on the non-active area so as not to have an end adjacent to an end of the sensor portion of the electrical conductor disposed on the active area.

32. The touchscreen panel sensor film according to claim 31, wherein
a width of the linearly extending electrical lead-out conductor is smaller than that of the one section of the electrical conductor that is overlaid with the electrical lead-out conductor.

33. The touchscreen panel sensor film according to claim 31,
wherein the electrical lead-out conductor has a light-shielding property.

34. The touchscreen panel sensor film according to claim 31,
wherein the electrical lead-out conductor is disposed on the electrical conductor spacedly from the base film.

35. The touchscreen panel sensor film according to claim 31,
wherein the terminal portion of the electrical conductor is integrally formed from the same material as that of the sensor portion of the electrical conductor.

36. A touchscreen panel sensor film of a projected type of capacitive-coupling scheme, comprising:
a transparent base film including an active area corresponding to a region whose touch position is detectable, and a non-active area adjacent to the active area;
a plurality of electrical conductors provided on one side of the base film, the electrical conductors including sensor portions arranged on the active area of the base film, and terminal portions arranged on the non-active area of the base film so that the terminal portions are coupled to the sensor portions; and
an electrical lead-out conductor provided on one section of the terminal portion of the each electrical conductor;
wherein the one section of the electrical conductor is formed linearly, and the electrical lead-out conductor extends linearly on the one section, and
wherein the electrical lead-out conductor is disposed on the one section of the terminal portion of the electrical conductor disposed on the non-active area so as not to have an end adjacent to an end of the sensor portion of the electrical conductor disposed on the active area.

37. The touchscreen panel sensor film according to claim 36,
wherein a width of the linearly extending electrical lead-out conductor is smaller than that of the one section of the electrical conductor that is overlaid with the electrical lead-out conductor.

38. The touchscreen panel sensor film according to claim 36,
wherein the electrical lead-out conductor has a light-shielding property.

39. The touchscreen panel sensor film according to claim 36,
wherein the electrical lead-out conductor is disposed on the electrical conductor spacedly from the base film.

40. The touchscreen panel sensor film according to claim 36,
wherein the terminal portion of the electrical conductor is integrally formed from the same material as that of the sensor portion of the electrical conductor.

41. A touchscreen panel sensor film comprising:
a transparent base film including an active area corresponding to a region whose touch position is detectable, and a non-active area adjacent to the active area;
an electrical conductor provided on one side of the base film, the electrical conductor including sensor portion arranged on the active area of the base film, and terminal portion arranged on the non-active area of the base film so that the terminal portion is coupled to the sensor portion; and
an electrical lead-out conductor provided on one section of the terminal portion of the electrical conductor;
wherein the one section of the electrical conductor is formed linearly, and the electrical lead-out conductor extends linearly on the one section, and
wherein the terminal portion of the electrical conductor is integrally formed from the same material as that of the sensor portion of the electrical conductor.

42. The touchscreen panel sensor film according to claim 41,
wherein a width of the linearly extending electrical lead-out conductor is smaller than that of the one section of the electrical conductor that is overlaid with the electrical lead-out conductor.

43. The touchscreen panel sensor film according to claim 41,
wherein the electrical lead-out conductor has a light-shielding property.

44. The touchscreen panel sensor film according to claim 41,
wherein the electrical lead-out conductor is disposed on the electrical conductor spacedly from the base film.

45. A touchscreen panel sensor film of a projected type of capacitive-coupling scheme, comprising:
a transparent base film including an active area corresponding to a region whose touch position is detectable, and a non-active area adjacent to the active area,
a plurality of electrical conductors provided on one side of the base film, the electrical conductors including sensor portions arranged on the active area of the base film, and terminal portions arranged on the non-active area of the base film so that the terminal portions are coupled to the sensor portions; and
an electrical lead-out conductor provided on one section of the terminal portion of the each electrical conductor;

wherein the terminal portion of the electrical conductor is integrally formed from the same material as that of the sensor portion of the electrical conductor.

46. The touchscreen panel sensor film according to claim 45,
wherein a width of the linearly extending electrical lead-out conductor is smaller than that of the one section of the electrical conductor that is overlaid with the electrical lead-out conductor.

47. The touchscreen panel sensor film according to claim 45,
wherein the electrical lead-out conductor has a light-shielding property.

48. The touchscreen panel sensor film according to claim 45,
wherein the electrical lead-out conductor is disposed on the electrical conductor.

\* \* \* \* \*